United States Patent
Abe et al.

(10) Patent No.: US 7,221,920 B2
(45) Date of Patent: May 22, 2007

(54) VOLTAGE CONTROLLED OSCILLATOR, FREQUENCY SYNTHESIZER AND COMMUNICATION APPARATUS

(75) Inventors: Kazuhide Abe, Kawasaki (JP); Mayumi Morizuka, Kawasaki (JP); Ryoichi Ohara, Yokohama (JP); Kenya Sano, Kawasaki (JP); Naoko Yanase, Kawasaki (JP); Takaaki Yasumoto, Kawasaki (JP); Tadahiro Sasaki, Nerima-ku (JP); Kazuhiko Itaya, Yokohama (JP); Takashi Kawakubo, Yokohama (JP); Hiroshi Yoshida, Yokohama (JP); Ryuichi Fujimoto, Ota-ku (JP); Keiichi Yamaguchi, Kawasaki (JP); Nobuyuki Itoh, Bunkyo-ku (JP); Tooru Kozu, Kawasaki (JP); Takeshi Ookubo, Fukaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 298 days.

(21) Appl. No.: 10/890,998

(22) Filed: Jul. 15, 2004

(65) Prior Publication Data
US 2005/0059375 A1 Mar. 17, 2005

(30) Foreign Application Priority Data
Jul. 24, 2003 (JP) ............... 2003-201199

(51) Int. Cl.
H04B 1/06 (2006.01)
H04B 7/00 (2006.01)
(52) U.S. Cl. ............... 455/255; 455/76; 455/260; 455/264; 331/115; 331/108 B
(58) Field of Classification Search .......... 455/76, 455/255, 257–265; 331/115, 116 R, 108 D
See application file for complete search history.

(56) References Cited

U.S. PATENT DOCUMENTS

| 4,134,085 | A | * | 1/1979 | Driscoll et al. | .......... 331/116 R |
| 5,821,820 | A | * | 10/1998 | Snider et al. | .................. 331/48 |
| 6,411,171 | B2 | | 6/2002 | Itoh | |
| 6,710,669 | B2 | * | 3/2004 | Hasegawa et al. | ....... 331/177 V |
| 6,724,270 | B2 | | 4/2004 | Kozu | |
| 6,741,137 | B1 | * | 5/2004 | Sibrai et al. | ................. 331/109 |
| 6,747,529 | B2 | | 6/2004 | Abe et al. | |

(Continued)

FOREIGN PATENT DOCUMENTS

JP 06-120416 4/1994

(Continued)

OTHER PUBLICATIONS

U.S. Appl. No. 11/268,615, filed Nov. 8, 2005, Abe et al.

(Continued)

*Primary Examiner*—Simon Nguyen
(74) *Attorney, Agent, or Firm*—Oblon, Spivak, McClelland, Maier & Neustadt, P.C.

(57) ABSTRACT

A voltage controlled oscillator includes a resonator configured to resonate with an initial oscillation frequency during starting period of oscillation and a steady oscillation frequency during a steady state oscillation. The resonator includes a film bulk acoustic resonator having a series resonance frequency higher than the steady oscillation frequency. A negative resistance circuit configured to drive the resonator, has a positive increment for reactance in the steady state oscillation compared with reactance in the starting period.

17 Claims, 25 Drawing Sheets

U.S. PATENT DOCUMENTS

| | | | |
|---|---|---|---|
| 6,933,793 B2 * | 8/2005 | Patterson et al. | 331/76 |
| 2003/0160660 A1 * | 8/2003 | Chang et al. | 331/100 |
| 2004/0033794 A1 * | 2/2004 | Korden et al. | 455/197.1 |
| 2004/0198288 A1 * | 10/2004 | Sadowski | 455/259 |
| 2004/0227578 A1 * | 11/2004 | Hamalainen | 331/107 A |
| 2005/0059375 A1 | 3/2005 | Abe et al. | |

FOREIGN PATENT DOCUMENTS

| | | |
|---|---|---|
| JP | 6-268443 | 9/1994 |
| JP | 2001-60870 | 3/2001 |
| JP | 2001-237699 | 8/2001 |
| JP | 2002-111492 | 4/2002 |
| JP | 2002-135055 | 5/2002 |
| JP | 2002-185318 | 6/2002 |
| JP | 2002-261607 | 9/2002 |
| JP | 2002-344242 | 11/2002 |

OTHER PUBLICATIONS

U.S. Appl. No. 11/252,782, filed Oct. 19, 2005, Yoshida et al.
U.S. Appl. No. 11/252,781, filed Oct. 19, 2005, Yoshida et al.
A. P. S. Khanna, et al., IEEE MTT-S Digest, pp. 717-720, "A 2GHz Voltage Tunable FBAR Oscillator", Jun. 7, 2003.

* cited by examiner

VOLTAGE CONTROLLED OSCILLATOR, FREQUENCY SYNTHESIZER AND COMMUNICATION APPARATUS

CROSS REFERENCE TO RELATED APPLICATIONS

This application is based upon and claims the benefit of priority from prior Japanese Patent Application P2003-201199 filed on Jul. 24, 2003; the entire contents of which are incorporated by reference herein.

BACKGROUND OF THE INVENTION

1. Field of the Invention

The present invention relates to a voltage controlled oscillator using a film bulk acoustic resonator and, more particularly, to a voltage controlled oscillator having a variable oscillation frequency, a communication apparatus and a frequency synthesizer using the same.

2. Description of the Related Art

In recent years, the market for a wireless communication system including a mobile phone and the like, has expanded, and at the same time, mobile communications services have been increasingly sophisticated. Moreover, it is expected that a local area network (LAN) system will rapidly become widespread in coming years. In these wireless communication systems, a radio frequency (RF) band of 2 GHz, 5 GHz, or more, is generally used.

In the RF band wireless communication systems, frequency synthesizers are used which are capable of oscillating in frequency bands required in the respective systems. The use of a quartz oscillator makes it possible to generate a highly precise reference frequency. However, a voltage controlled oscillator (VCO) is generally used in an RF band where the quartz oscillator cannot directly oscillate. Although a VCO alone cannot generate a highly precise frequency, frequency precision of a VCO or a frequency synthesizer is provided by implementing feedback control using a phase locked loop (PLL) circuit so as to generate integer or fracture times the frequency of a quartz oscillator. However, a VCO using a quartz oscillator normally provides a frequency band around 5 to 30 MHz, and even the highest frequency band of approximately 100 MHz at most.

Requirements for a VCO used in a frequency synthesizer include a wide tunability of an oscillation frequency so as to cover enough frequency range, and a low phase noise characteristic, as well as compactness and low power consumption.

A phase noise is an index to characterize dispersion of an oscillation frequency. The lower phase noise indicates that the oscillation frequency is closer to a single frequency, that is, almost ideal. The phase noise of a VCO, through frequency conversion by a frequency mixer, adversely affects the spectrum of signals in transmitting and receiving. In an orthogonal frequency division multiplex (OFDM) system, which is used for a wireless LAN system, an asymmetrical digital subscriber line (ADSL), a digital terrestrial television and the like, the lower the phase noise of a VCO, the higher the quality of signals. Accordingly, in principle, the quantity of information for transmitting and receiving can be increased.

A phase noise is caused by a thermal noise, flicker noise (1/f noise) and the like, inside an oscillator circuit. The noises emerge, as a momentary shift in the oscillation frequency, at an output node of the oscillator circuit. In order to reduce a phase noise in an oscillator, it is effective to increase the quality factor (Q value) of a resonator used in an oscillator circuit.

As a resonator exhibiting a high Q value in an RF band of GHz frequency or more, a film bulk acoustic resonator (FBAR) has been proposed recently and has collected attention. Currently, as resonators used in RF communication systems, bulk (ceramic) dielectric resonators or surface acoustic wave (SAW) devices have been used. As compared with the currently used resonators, the FBAR is suitable for miniaturization, and also for higher frequency applications. On the basis of the above reasons, a high frequency filter using an FBAR has already been commercially manufactured. Moreover, there is a proposal to use an FBAR of an aluminum nitride (AlN) as a resonator of VCO (see A. P. S. Khanna, et al., "A 2 GHz Voltage Tunable FBAR Oscillator," IEEE MTT Symposium Digest, pp. 717–720, 2003).

Moreover, there is a proposal in which, in order to achieve a wide oscillation frequency tunability, a detection circuit is added to detect the transition of an oscillating operation from an initial state into a steady state, and a load capacitance in a resonator is connected to improve tunability of the oscillation frequency. (refer to Japanese Patent Laid-Open No. 2002-344242).

Furthermore, there is another proposal employing a wideband frequency synthesizer in a wireless communication system, in which a wide frequency tunability is realized by means of selecting a VCO from a plurality of VCOs having different frequency bands (refer to Japanese Patent Laid-Open No. 2002-314414).

The VCO disclosed in Japanese Patent Laid-Open No. 2002-344242 is a quartz oscillator and therefore inapplicable in a GHz frequency band. In addition, the VCO requires an additional detection circuit for an oscillation signal and, therefore, is not suitable for miniaturization. Moreover, according to A. P. S. Khanna, et al., a prototype of a VCO using an AlN FBAR with an oscillation frequency of 2 GHz has achieved an extremely low phase noise (C/N). However, only a value of approximately 0.1% can be achieved for a frequency tunability. Further, in Japanese Patent Laid-Open No. 2002-314414, the frequency synthesizer is constructed by using an LC oscillator having inductors and capacitors for a resonator. Therefore, the circuitry becomes large and phase noise reduction is difficult.

As described above, currently, a VCO using a FBAR which is suitable for miniaturization and capable to oscillate a frequency range over GHz has not yet reached a point of providing a needed frequency tunablilty. Therefore, there have been few disclosed frequency synthesizers with a VCO using a FBAR.

SUMMARY OF THE INVENTION

A first aspect of the present invention inheres in a voltage controlled oscillator, including a resonator configured to oscillate with an initial oscillation frequency during starting period of oscillation and with a steady oscillation frequency during a steady state oscillation, the resonator including a film bulk acoustic resonator having a series resonance frequency higher than the oscillation frequency; and a negative resistance circuit connected to the film bulk acoustic resonator, configured to drive the resonator, the negative resistance circuit having a positive increment for reactance in the steady state oscillation compared with reactance in the starting period.

A second aspect of the present invention inheres in a frequency synthesizer, including a voltage controlled oscillator including a plurality of film bulk acoustic resonators having different resonance frequencies, configured to generate an oscillation signal; a first frequency divider configured to divide the oscillation signal from the voltage controlled oscillator and to generate a divided oscillation signal; a second frequency divider configured to divide a reference signal and to generate a divided reference signal; a phase comparator configured to compare phases of the divided oscillation signal and the divided reference signal and to generate a phase error signal; a control voltage generator configured to generate a control voltage for the voltage controlled oscillator based on the phase error signal; and a control circuit configured to generate a control signal based on the control voltage so as to select the film bulk acoustic resonators, and to control an oscillation frequency of the oscillation signal.

A third aspect of the present invention inheres in a communication apparatus, including a frequency synthesizer configured to provide an oscillation signal, including: a voltage controlled oscillator including a plurality of film bulk acoustic resonators having different resonance frequencies, configured to generate the oscillation signal; a first frequency divider configured to divide the oscillation signal from the voltage controlled oscillator and to generate a divided oscillation signal; a second frequency divider configured to divide a reference signal and to generate a divided reference signal; a phase comparator configured to compare phases of the divided oscillation signal and the divided reference signal and to generate a phase error signal; a control voltage generator configured to generate a control voltage for the voltage controlled oscillator based on the phase error signal; and a control circuit configured to generate a control signal based on the control voltage so as to select the film bulk acoustic resonators, and to control an oscillation frequency of the oscillation signal; a receiver configured to convert a high frequency receiving signal into an intermediate frequency receiving signal by use of the oscillation signal; a baseband processor configured to demodulate the intermediate frequency receiving signal and to modulate a transmitting signal; and a transmitter configured to transmit a radio frequency transmitting signal provided by converting the modulated transmitting signal by use of the oscillation signal.

DETAILED DESCRIPTION OF THE INVENTION

Figure 1:
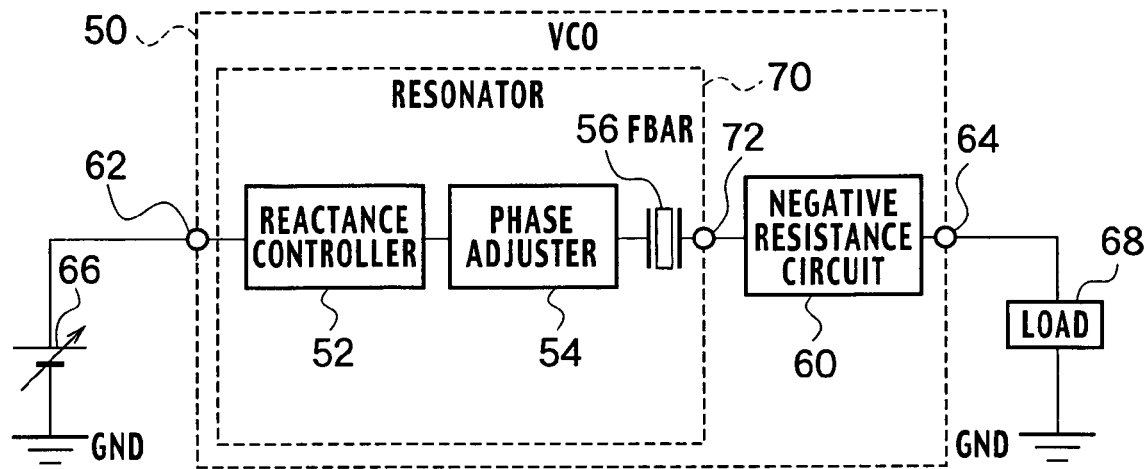
FIG. 1 is an example of a circuitry of a VCO according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

As shown in FIG. 1, a VCO 50 according to a first embodiment of the present invention includes a resonator 70 and a negative resistance circuit 60 connected to the resonator 70 at a connection node 72.

The resonator 70 includes a reactance controller 52 connected to an input node 62, a phase adjuster 54 connected in series to the reactance controller 52, and a FBAR 56 connected in series to the phase adjuster 54. A control voltage source 66, which is grounded, is connected to the input node 62. Moreover, an output node 64 is provided at the other end of the negative resistance circuit 60 which is connected to the resonator 70 at the connection node 72, and a load 68 is connected to the output node 64.

Figure 2:
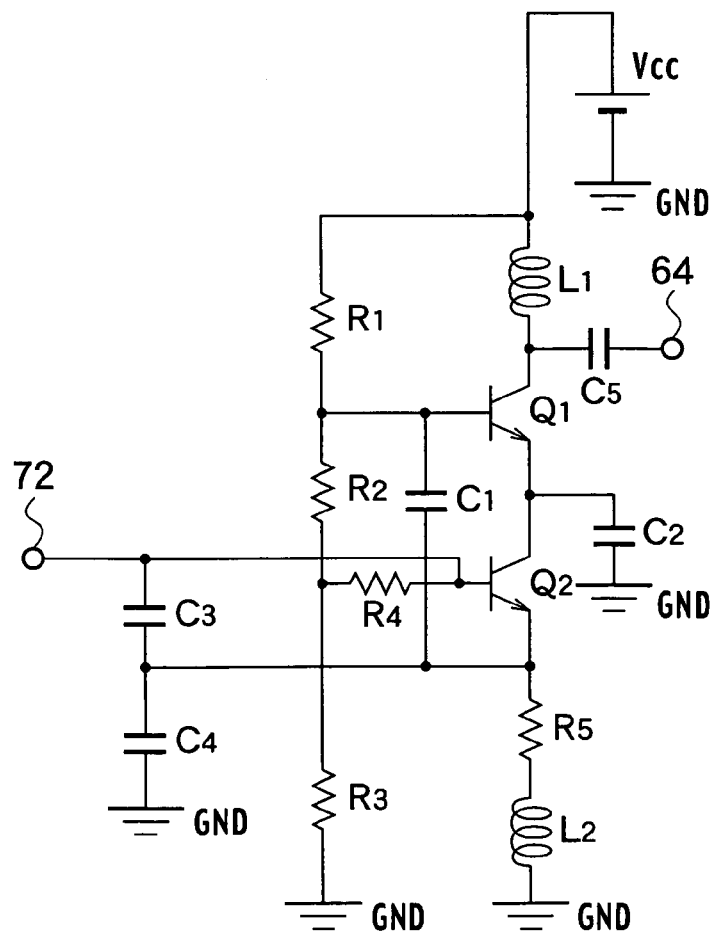
FIG. 2 is an example of a circuitry of a negative resistance circuit according to the first embodiment of the present invention.

As shown in FIG. 2, the negative resistance circuit 60 includes an inductor $L_1$ connected between a DC power supply Vcc which is grounded at a negative side, and a collector of a transistor $Q_1$; a resistance $R_1$ connected between the DC power supply Vcc and a base of the transistor $Q_1$; a resistance $R_2$ connected to the base of the transistor $Q_1$; a resistance $R_4$ connected between the resistance $R_2$ and a base of the transistor $Q_2$ in which a collector is connected to an emitter of the transistor $Q_1$; a grounded resistance $R_3$ connected to the resistance $R_2$ and $R_4$; a resistance $R_5$ connected between an emitter of the transistor $Q_2$ and a grounded inductor $L_2$; a capacitor $C_5$ connected between the collector of the transistor $Q_1$ and the output node 64; a capacitor $C_1$ connected between the base of the transistor $Q_1$ and the emitter of the transistor $Q_2$; a grounded capacitor $C_2$ connected to the emitter of the transistor $Q_1$; a capacitor $C_3$ connected between the base and emitter of the transistor $Q_2$; a grounded capacitor $C_4$ connected to the emitter of the transistor $Q_2$; and the connection node 72 connected to the base of the transistor $Q_2$.

The bipolar transistors $Q_1$ and $Q_2$ construct a cascode circuit where the emitter of the transistor $Q_1$ and the collector of the transistor $Q_2$ are connected to each other. The transistor $Q_1$ is a buffer transistor for driving the load, and the transistor $Q_2$ serves as an oscillation transistor.

The DC power supply Vcc supplies a bias voltage to the transistors $Q_1$ and $Q_2$. The resistances $R_1$ to $R_5$ are bias resistances for determining operating points of the transistors $Q_1$ and $Q_2$. The inductor $L_1$ connected between the DC power supply Vcc and the collector of the transistor $Q_1$, and the grounded inductor $L_2$ connected with the resistance $R_5$ which is connected from the emitter of the transistor $Q_2$, allow only direct-current components to pass therethrough and prevent high-frequency components from escaping into the DC power supply Vcc and the ground GND, respectively.

The capacitor $C_1$ provides a high frequency wave oscillated by the transistor $Q_2$ to the transistor $Q_1$. The capacitor $C_2$ grounds the collector of the transistor $Q_2$ in a high frequency range. The capacitors $C_3$ and $C_4$ allow a signal, which emerges at the emitter of the transistor $Q_2$ by amplifying a high frequency signal provided into the base of the transistor $Q_2$, to feed back the signal again to the base of the transistor $Q_2$ through the resonator 70. The capacitor $C_5$ provides a high frequency signal from the collector of the transistor $Q_2$ to the output node 64. In addition, the connection node 72 is connected to the resonator 70.

Note that, in the first embodiment, the bipolar transistor $Q_1$ and $Q_2$ are used in the negative resistance circuit 60.

Although a field effect transistor (FET) or the like may be used instead of a bipolar transistor, it is desirable, in terms of noise reduction, to use the bipolar transistor which has a relatively low flicker noise. Further, a negative resistance circuit using a complementary metal oxide semiconductor (CMOS) inverter may be used.

Figure 3:
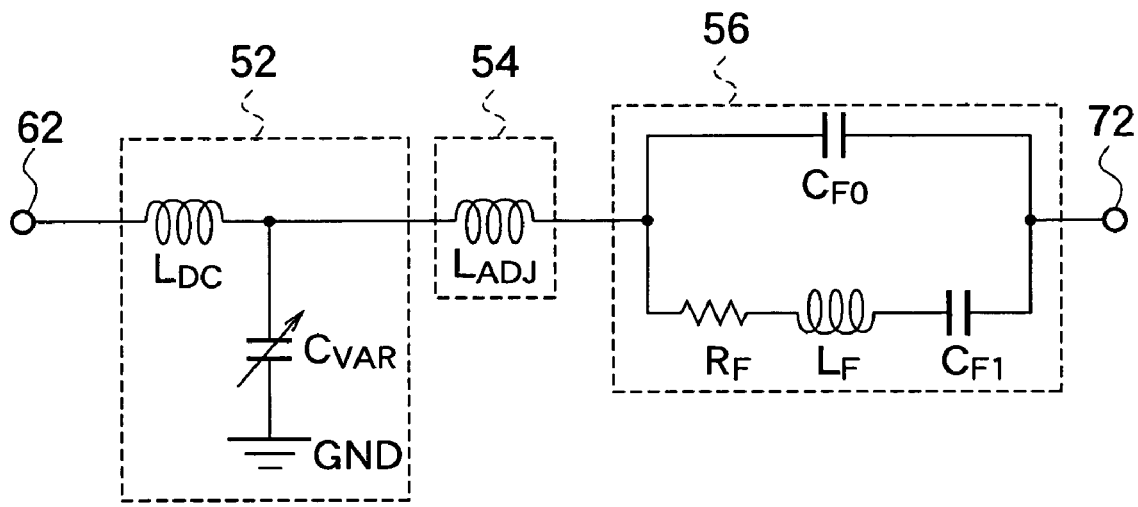
FIG. 3 is a schematic diagram of an example of an equivalent circuit model relevant to a resonant characteristic of a resonator according to the first embodiment of the present invention.

The resonator 70 has a circuitry where the reactance controller 52, the phase adjuster 54 and the FBAR 56 are connected in series. The resonator 70 can be represented by an equivalent circuit model as shown in FIG. 3.

In the reactance controller 52, which varies reactance depending on a control voltage $V_{control}$ applied from the control voltage source 66, a variable capacitance $C_{VAR}$ is used. The variable capacitances $C_{VAR}$ is provided by a variable capacitance diode using a pn junction of a semiconductor, a metal-oxide-semiconductor (MOS) capacitor, a high dielectric thin film capacitor which varies capacitance by using nonlinearity of a strontium titanate ($SrTiO_3$) film or the like, an electrostatic capacitor having a variable gap between electrodes by using an electrostatic force, a piezoelectric property, and the like. One end of the capacitance $C_{VAR}$ is connected to an inductance $L_{DC}$ for removing high-frequency components included in the control voltage $V_{control}$ applied from the input node 62. The other end of the capacitance $C_{VAR}$ is grounded.

In the phase adjuster 54, an inductance $L_{ADJ}$, such as a microstrip line or a spiral inductor, is used. Note that it is desirable that the phase adjuster 54 has a structure which enables fine adjustment of phase characteristics of the resonator 70 by adjusting the inductance $L_{ADJ}$ by laser trimming after the oscillator circuit is fabricated.

The FBAR 56 includes a piezoelectric thin film having a pair of electrodes on both sides and an acoustic reflector abutting on at least one of the pair of electrodes. The piezoelectric material includes an aluminum nitride (AlN), a zinc oxide (ZnO), a lead zirconate titanate (Pb(Zr,Ti)$O_3$), a barium titanate (BaTiO$_3$), and the like, or materials modified composition, for example, by adding another component thereto. The acoustic reflector is provided to enhance the Q value representing a resonance characteristic of the FBAR. The acoustic reflector may be a cavity, or may be a multi-layer film for acoustic reflection. The resonance characteristic of the FBAR 56 can be appreciably precisely expressed by using the equivalent circuit shown in FIG. 3. A capacitance $C_{F0}$ is an electrostatic capacity of the FBAR 56. The combination of a capacitance $C_{F1}$, an inductance $L_F$ and a resistance $R_F$, which is connected in parallel to the capacitance $C_{F0}$, corresponds to an electrical equivalent circuit representing a mechanical oscillation generated due to the piezoelectric property of the FBAR 56.

In the first embodiment, an initial oscillation angular frequency $\omega_{start}$ immediately after the introduction of power into the VCO 50, is designed to be between a series resonance angular frequency $\omega_s$ and a parallel resonance angular frequency $\omega_p$ of the FBAR 56 so as to stably start the oscillation. Then, a steady oscillation angular frequency $\omega_{osc}$, after amplitude of the oscillation settles into a state of saturation, is designed to be lower than the series resonance angular frequency $\omega_s$ by using the nonlinearity of the negative resistance circuit 60. If the VCO 50 is thus designed, the frequency tunability of the VCO 50 can be increased as described below.

The impedance characteristic of the FBAR 56 around the resonance frequency can be generally described as follows. In an angular frequency range lower than the series resonance angular frequency $\omega_s$ of the FBAR 56 and an angular frequency range higher than the parallel resonance angular frequency $\omega_p$ of the FBAR 56, a reactance $X_{FBAR}$=Im($Z_{FBAR}$) of the FBAR 56 is a negative value and the FBAR 56 behaves like a capacitor. On the other hand, in a limited frequency range from the series resonance angular frequency $\omega_s$ to the parallel resonance angular frequency $\omega_p$, the reactance $X_{FBAR}$ is a positive value and the FBAR 56 behaves like an inductor. At the series resonance angular frequency $\omega_s$, a real part $R_{FBAR}$=Re($Z_{FBAR}$) of a complex impedance of the FBAR 56 is a relatively small value. By contrast, the $R_{FBAR}$ is the largest at the parallel resonance angular frequency $\omega_p$.

It is usual, for an oscillator circuit using piezoelectric resonator, in order to achieve stable oscillating operation, that the circuit is designed so as to oscillate in a frequency range where a piezoelectric resonator behaves like an inductor, that is, between the series resonance angular frequency $\omega_s$ and the parallel resonance angular frequency $\omega_p$. Accordingly, in the oscillator circuitry providing an oscillation in the frequency range where the piezoelectric resonator behaves like an inductor, an only narrow frequency tunability may be realized.

To the contrast, according to the first embodiment, as will be described below, the initial oscillation angular frequency $\omega_{start}$, which is $2*\pi*f_{start}$, immediately after the introduction of power into the VCO 50 is designed such that the initial oscillation frequency is between the series resonance angular frequency $\omega_s$ and the parallel resonance angular frequency $\omega_p$. However, the steady oscillation angular frequency $\omega_{osc}$, which is $2*\pi*f_{osc}$, after amplitude of the oscillation settles into a state of saturation, is designed to be lower than the series resonance angular frequency $\omega_s$. Thus, the frequency tunability of the VCO 50 may increase.

Using equivalent circuit parameters, the series resonance angular frequency $\omega_s$ and the parallel resonance angular frequency $\omega_p$ of the FBAR 56 can be expressed by the following equations.

$$\omega_s = 2*\pi*f_s = [1/(L_F*C_{F1})]^{1/2} \quad (1)$$

$$\omega_p = 2*\pi*f_p = [(1/C_{F1}+1/C_{F0})/L_F]^{1/2} \quad (2)$$

Moreover, using the equivalent circuit parameters, the complex impedance $Z_{FBAR}$ of the FBAR 56 with respect to an angular frequency $\omega$ can be expressed by the following equation:

$$Z_{FBAR}=1/(j*\omega*C_{F0})+1/((\omega*C_{F0})^2*\{R_F+j*[*L_F-(1/C_{F1}+1/C_{F0})/\omega]\} \quad (3)$$

where the first term in the right-hand side of the equation (3) relates to an electrostatic capacitance $C_{F0}$ of the FBAR 56, and the second term relates to a acoustic piezoelectric vibration of the FBAR 56.

Here, an antiresonance resistance $R_A$ and a phase angle $\theta$ are defined as follows.

$$R_A=1/(\omega^2*C_{F0}*R_F) \quad (4)$$

$$\tan\theta=[\omega*L_F-(1/C_{F1}+1/C_{F0})/\omega]/R_F \quad (5)$$

$$-\pi/2<\theta<\pi/2 \quad (6)$$

Using the antiresonance resistance $R_A$ and the phase angle $\theta$, the complex impedance $Z_{FBAR}$ can be expressed as follows.

$$Z_{FBAR} = 1/(j*\omega*C_{F0}) + R_A/(1+j*\tan\theta) \quad (7)$$
$$= R_A/2 - j/(\omega*C_{F0}) + R_A*[\cos(2*\theta)+$$

-continued $$j*\sin(2*\theta)]/2$$

The VCO 50 shown in FIG. 1 is divided at the connection node 72 into two parts which are the negative resistance circuit 60 and the resonator 70. The complex impedance when viewing the negative resistance circuit 60 from the connection node 72 is denoted by $Z_{NEG}$, and the complex impedance when viewing the resonator 70 from the connection node 72 is denoted by $Z_{RES}$. Strictly speaking, the complex impedances are both functions relating to an oscillation frequency and an oscillation amplitude. If the frequency is limited around the resonance frequency of the FBAR 56, the complex impedance $Z_{NEG}$ can be substantially approximated to a constant value with respect to the frequency, while the complex impedance $Z_{RES}$ is a function varying sharply with the frequency because the complex impedance $Z_{RES}$ includes the complex impedance of the FBAR 56.

Referring to FIG. 3, the complex impedance $Z_{RES}$ of the resonator 70 can be expressed as follows.

$$Z_{RES}=Z_{FBAR}+j*[L_{ADJ}-1/(\omega*C_{VAR})] \quad (8)$$

Accordingly, it is understood that the variable capacitance $C_{VAR}$ and the inductance $L_{ADJ}$ are circuit elements for adding or subtracting to the imaginary component, that is, the reactance component $X_{FBAR}$, of the complex impedance of the FBAR 56. Strictly speaking, $\omega*L_{ADJ}$ or $1/(\omega*C_{VAR})$ is also a function relating to the frequency. However, each of $\omega*L_{ADJ}$ and $1/(\omega*C_{VAR})$ can be thought to be an approximately constant value in the narrow resonance frequency range in comparison with the reactance component $X_{FBAR}$ of the FBAR 56 sharply increasing or decreasing around the resonance frequency.

Moreover, as shown in FIG. 1, the variable capacitance $C_{VAR}$ of the reactance controller 52 is a function relating to the control voltage $V_{control}$ of the control voltage source 66. Consequently, as the equation (8) shows, the value of $1/(\omega*C_{VAR})$ is varied depending on the control voltage $V_{control}$, and the reactance component $X_{RES}$ of the resonator 70 is accordingly varied. Note that the value of the inductance $L_{ADJ}$ of the phase adjuster 54 is not varied by the control voltage $V_{control}$.

As for a variation of the complex impedance with respect to the oscillation amplitude, since the complex impedance $Z_{RES}$ of the resonator 70 is provided by impedances of passive elements, the complex impedance $Z_{RES}$ can be thought to be approximately constant even if the oscillation amplitude varies. On the other hand, since the complex impedance $Z_{NEG}$ of the negative resistance circuit 60 includes the transistors which are active elements, the complex impedance $Z_{NEG}$, reflecting the nonlinearity of the transistors, is a function varying values according to the magnitude of the oscillation amplitude.

The complex impedance $Z_{NEG}$ of the negative resistance circuit 60 cannot be expressed by a simple expression like the equation (8) because the negative resistance circuit 60 is a nonlinear circuit including the transistors. However, by use of a large signal nonlinear transistor model, such as a Gummel-Poon model, and model parameters having experimentally sufficient precision, it is possible to precisely predict the complex impedance $Z_{NEG}$ by circuit simulation. Note that, for designing the negative resistance circuit 60 which operates at a high frequency, it is necessary to sufficiently consider parasitic components of individual parts other than the parameters including parasitic components concerning the above-discussed transistors so that the impedance characteristics correspond in the oscillation frequency band. Moreover, it is necessary to use a circuit where consideration has been previously provided to parasitic components of circuit wirings connecting one part to another.

Figure 4:
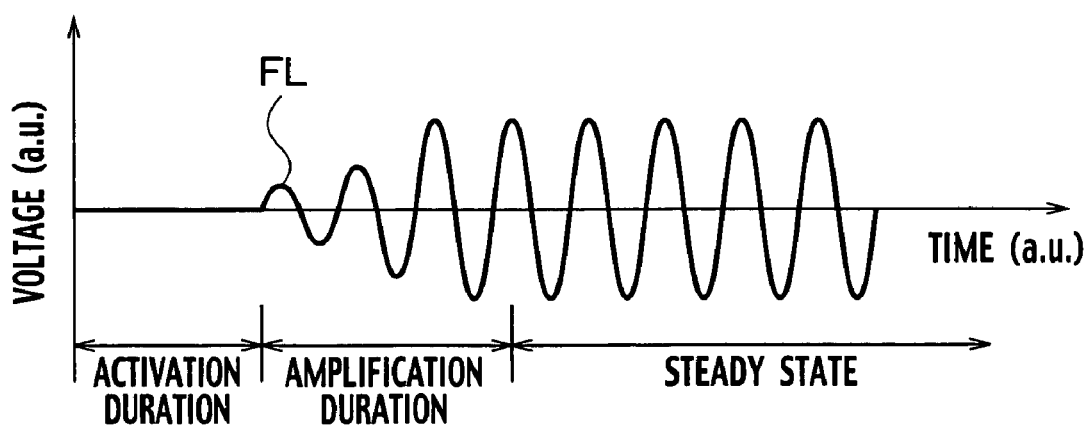
FIG. 4 is a schematic view showing an example of a time dependence of the VCO according to the first embodiment of the present invention leading up to oscillating in a steady state.

As shown in FIG. 4, after the elapse of an activation duration from a time of turning on power of the VCO 50 by controlling the reactance controller 52 with control voltage of the control voltage source 66 shown in FIG. 1, the VCO 50 according to the first embodiment first starts to oscillate at a frequency that satisfies a oscillation condition at small amplitude. Thereafter, the oscillation amplitude gradually increases and, after the elapse of an amplification duration, the VCO 50 oscillates in a steady state. Even if the loop gain of the negative resistance circuit 60 in the VCO 50 is one or more, the VCO 50 cannot start to oscillate immediately after turning on, as long as there is no signal to amplify. In practice, the oscillation is started by selectively amplifying a frequency component that satisfies an oscillation condition among fluctuations FL existing in the negative resistance circuit 60 of the VCO 50, such as weak noise voltage/current, and minute harmonic components caused by transient phenomena at the time of turning on power. Generally, the higher Q value of a resonator used in an oscillator circuit exhibits, the longer the activation duration tends to be until the start of oscillation.

Since the oscillation amplitude is extremely small immediately after the oscillation has started, a condition for small signal operation of a transistor applies. In general, in order to decrease the duration from the time of turning on the power until steady state oscillating, it is desirable to set a loop gain of the negative resistance circuit 60 for the small signal operation to 3 or more. Here, the frequency $\omega_{start}$ that satisfies a phase condition during the small signal operation, during the activation duration of the oscillation, is to be in the frequency range between the series resonance angular frequency $\omega_s$ and the parallel resonance angular frequency $\omega_p$ of the FBAR 56. Once the oscillation starts, due to a loop gain of greater than one of the negative resistance circuit 60, the oscillation is amplified during the amplification duration and the oscillation amplitude accordingly increases. When the oscillation amplitude increases, due to the nonlinearity of the transistors, the loop gain gradually decreases to one. Consequently, the oscillation is close to steady state. Thus, intentionally using the nonlinearity of the transistors in the negative resistance circuit 60, the frequency that satisfies the phase condition in the steady state may be lower than the series resonance angular frequency $\omega_s$ of the FBAR 56.

First, the activation duration when the VCO 50 starts to oscillate is considered. During the activation duration, a small signal source, such as a weak noise voltage/current existing in the circuit, and a minute harmonic component caused by the transient phenomena at the time of turning on power, is selectively amplified. Therefore, an oscillation condition to be determined can be analyzed, using parameters of a small signal linear circuit. The oscillation start conditions of an oscillation circuit can be represented by the following expressions, respectively relating to resistance components R in the complex impedances of the resonator 70 and the negative resistance circuit 60, and the reactance components X thereof.

$$R_{RES} \leq -R_{NEG}(A_{small}) \quad (9)$$

$$X_{RES}=-X_{NEG}(A_{small}) \quad (10)$$

Here, $A_{small}$ is a small signal oscillation amplitude.

As for the oscillation start condition, that is a gain condition, relating to the resistance components R in the complex impedances in the expression (9), the impedance of the FBAR 56 may decrease by increasing the area of the FBAR 56 to a certain level or more so that the transistors included in the negative resistance circuit 60 can be driven. Therefore, for the oscillation start condition, it is sufficient to mainly consider the phase condition relating to the reactance components X in the equation (10).

The equation (10), which represents the phase condition of the resonator 70, can be transformed into the following equation:

$$X_{FBAR}(\omega_{start}) + X_{VAR}(\omega_{start}) + X_{ADJ}(\omega_{start}) = -X_{NEG}(A_{small}, \omega_{start}) \quad (11)$$

where $X_{VAR}(\omega_{start})$ is the reactance of the reactance controller 52, and $X_{ADJ}(\omega_{start})$ is the reactance of the phase adjuster 54. Accordingly, the reactance $X_{FBAR}(\omega_{start})$ of the FBAR 56 can be expressed as follows.

$$X_{FBAR}(\omega_{start}) = -X_{NEG}(A_{small}, \omega_{start}) - X_{VAR}(\omega_{start}) - X_{ADJ}(\omega_{start}) \quad (12)$$

The value of the reactance $X_{FBAR}(\omega_{start})$ is a positive value between the series resonance and parallel resonance of the FBAR 56, and the FBAR 56 behaves as an inductor. Consequently, a condition which makes the value of $\{-XNEG(A_{small}, \omega_{start}) - X_{VAR}(\omega_{start}) - X_{ADJ}(\omega_{start})\}$ a positive value, as expressed by the following inequality, provides the oscillation to start between the series resonance and the parallel resonance.

$$X_{NEG}(A_{small}, \omega_{start}) + X_{VAR}(\omega_{start}) + X_{ADJ}(\omega_{start}) < 0 \quad (13)$$

Next, the case where the oscillation amplitude has been gradually increased and settles in the steady state as shown in FIG. 4 will be considered.

The active elements, such as the transistors, included in the negative resistance circuit 60 linearly operate during the small signal operation. However, the active elements may nonlinearly operate when the signals become large. During the large signal operation, an average complex impedance $Z_{NEG}(A_{osc})$ generally exhibits a different value from the complex impedance $Z_{NEG}(A_{small})$ during the small signal operation. A difference between the reactance component $X_{NEG}(A_{osc})$ of the negative resistance circuit 60 around the resonance frequency during the large signal operation and the reactance component $X_{NEG}(A_{small})$ during the small signal operation is denoted by $\Delta X_{NEG}$. Note that the term "$A_{osc}$" is a large signal oscillation amplitude. In other words, the difference $\Delta X_{NEG}$ means a difference between the reactances of the negative resistance circuit 60 during the large signal operation and during the small signal operation.

If the VCO 50 can be designed such that the value of $\{X_{NEG}(A_{small}, \omega_{start}) + X_{VAR}(\omega_{start}) + X_{ADJ}(\omega_{start})\}$ during the small signal operation is negative and the value of $\{X_{NEG}(A_{osc}, \omega_{osc}) + \Delta X_{NEG} + X^{VAR}(\omega_{osc}) + X_{ADJ}(\omega_{osc})\}$ during the large signal operation in the steady state is positive, the VCO 50 may start to oscillate at a frequency $f_{start}$ between a series resonance frequency $f_s$ and a parallel resonance frequency $f_p$ of the FBAR 56. Further, the oscillation frequency is gradually reduced as the oscillation amplitude is increased, and the VCO 50 may steadily oscillate at a frequency $f_{osc}$ that is lower than the series resonance frequency $f_s$.

Next, a description will be given of how a reactance component in a circuit can be varied between at starting of oscillation and during a steady state oscillation. Note that a difference between oscillation frequencies at the staring of oscillation and during the steady state is small in comparison with a value of the oscillation frequency of a negative resistance circuit. Therefore, the difference between the oscillation frequencies will be ignored in the following description.

Figure 5A:
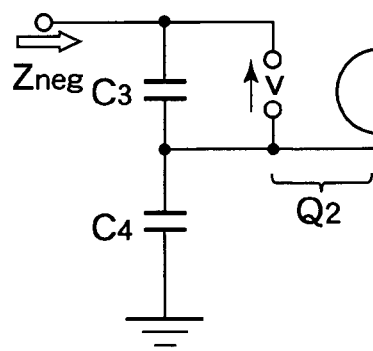
FIGS. 5A and 5B are schematic diagrams of equivalent circuits explaining operation of an example of the negative resistance circuit.
Figure 5B:
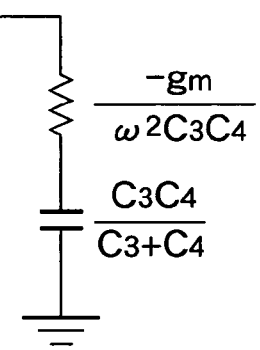

FIG. 5A shows an equivalent circuit of a negative resistance circuit simplified from a Colpitts oscillator circuit. In FIG. 5A, $C_3$ and $C_4$ correspond to $C_3$ and $C_4$ in the negative resistance circuit shown in FIG. 2. Moreover, in FIG. 5A, the transistor $Q_2$ for oscillation in FIG. 2, is modeled by a voltage dependent current source. This is the simplest model where an emitter current $g_m*v$ flows in response to a base voltage v. Here, the "$g_m$" represents a transconductance of the transistor $Q_2$ for oscillation. Impedance $Z_{neg}$ is an impedance of the negative resistance circuit viewed from an input side of the transistor $Q_2$. The equivalent circuit shown in FIG. 5A can be further replaced by a series connection model of a negative resistance $(-g_m/(\omega^2*C_3*C_4))$ and a capacitance $(C_3*C_4/(C_3+C_4))$ shown in FIG. 5B.

Here, it is assumed that only the transconductance $g_m$ is varied depending on voltage amplitude. That is, it is assumed that the large transconductance $g_m$ is determined when the amplitude of an input voltage v is sufficiently small, but the transconductance $g_m$ gradually decreases as the voltage amplitude increases because the transistor may be saturated. An examination will be made of what influence such a variation of the transconductance $g_m$ has on the impedance $Z_{neg}$ of the negative resistance circuit in FIG. 5A.

Figure 6A:
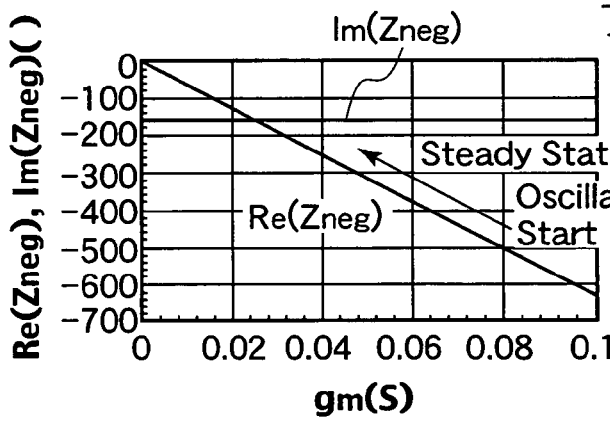
FIGS. 6A and 6B are schematic views illustrating a transconductance dependence of impedance and a vector diagram for the equivalent circuit shown in FIG. 5A.
Figure 6B:
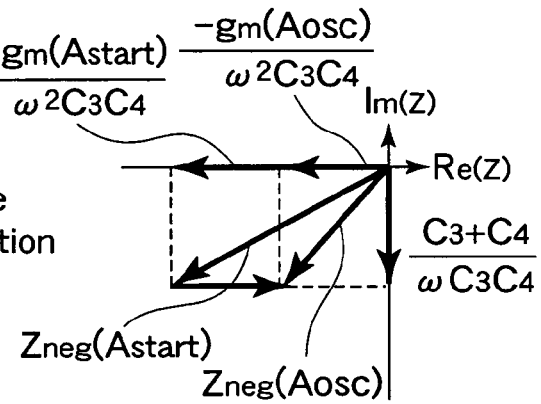
Figure 7A:
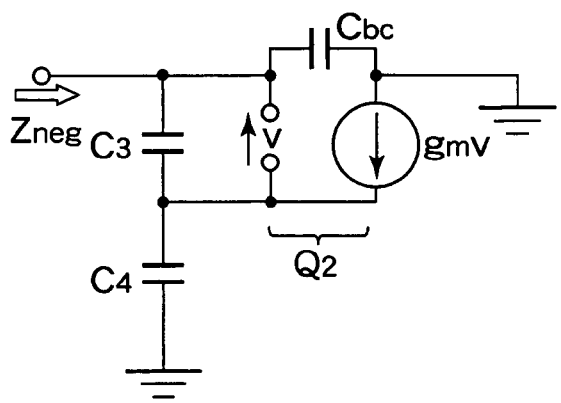
FIGS. 7A and 7B are schematic diagrams of equivalent circuits explaining operation of another example of the negative resistance circuit.
Figure 7B:
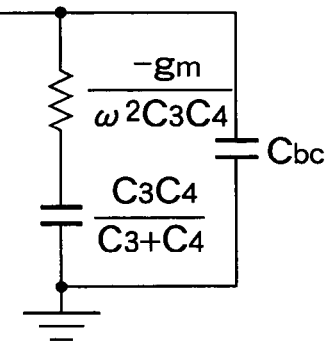
Figure 8A:
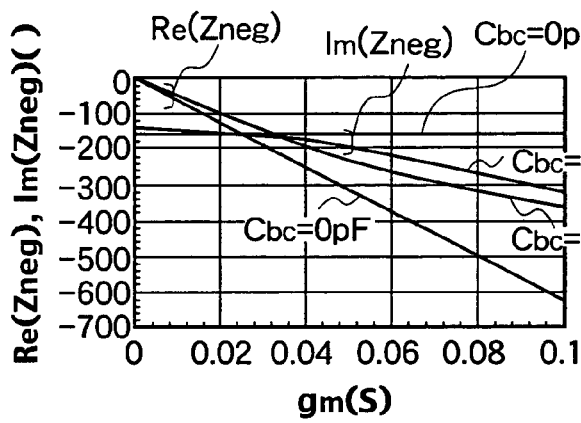
FIGS. 8A and 8B are schematic views illustrating a transconductance dependence of impedance and a vector diagram for the equivalent circuit shown in FIG. 7A.
Figure 8B:
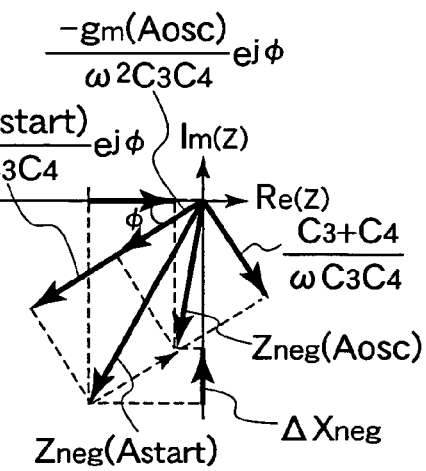

FIG. 6A shows how the impedance $Z_{neg}$ of the negative resistance circuit varies with $g_m$. Since the impedance $Z_{neg}$ is represented by the series connection of the capacitance and the negative resistance, an imaginary part $Im(Z_{neg})$ of $Z_{neg}$ does not depend on the transconductance $g_m$. On the other hand, a real part $Re(Z_{neg})$ of $Z_{neg}$ is a negative value and varies in proportion to the transconductance $g_m$. In the simplest model shown in FIG. 5A, only the real part $Re(Z_{neg})$ varies depending on the amplitude of the input voltage, while the imaginary part $Im(Z_{neg})$, i.e., the reactance component does not vary due to the saturation of the transistor. For example, as shown in FIG. 6B, during the small signal operation at the start of oscillation, the transconductance $g_m(A_{start})$ is large and the absolute value of $Re(Z_{neg}(A_{start}))$ is also large. During the large signal operation in steady state oscillation, the transconductance $g_m(A_{osc})$ is small and the absolute value of $Re(Z_{neg}(A_{osc}))$ is also small. In contrast, $Im(Z_{neg}(A_{start}))$ and $Im(Z_{neg}(A_{osc}))$ are the same value of $((C_3+C_4)/(\omega*C_3*C_4))$, Next, an examination will be made of a case where, as shown in FIG. 7A, a base-collector parasitic capacitance $C_{bc}$ is introduced into the transistor model. FIG. 7B shows a further simplified equivalent circuit. As shown in FIGS. 8A and 8B, the impedance $Z_{neg}$ of a negative resistance circuit in FIG. 7A exhibits not only a dependence of the real part $Re(Z_{neg})$ on the transconductance $g_m$ but also a dependence of the imaginary part $Im(Z_{neg})$ on the transconductance $g_m$. The influence of the parasitic capacitance $C_{cb}$ will be described qualitatively. As shown in FIG. 7B, the parasitic capacitance $C_{cb}$ is connected in parallel to a negative resistance $(-g_m/(\omega^2*C_3*C_4))$ and a capacitance $(C_3*C_4/(C_3+C_4))$ attributable to capacitances $C_3$ and $C_4$. It can be assumed that the parasitic capacitance $C_{cb}$ connected in parallel has an effect of causing the vector of the impedance to rotate counterclockwise by a phase φ in a manner of the first approximation. As a result, as shown in the vector diagram of FIG. 8B, when the transconductance varies from $g_m(A_{start})$ to $g_m(A_{osc})$, not only the real part of the impedance of the negative resistance but also the imaginary part thereof, that is, the reactance component can be varied. In addition, in a variation of the reactance, the reactance component exhibits a positive increase $\Delta X_{NEG}$ when $g_m(A_{osc})$ is small in steady state oscillation as compared with when $g_m(A_{start})$ is large during activation of oscillation.

Figure 9A:
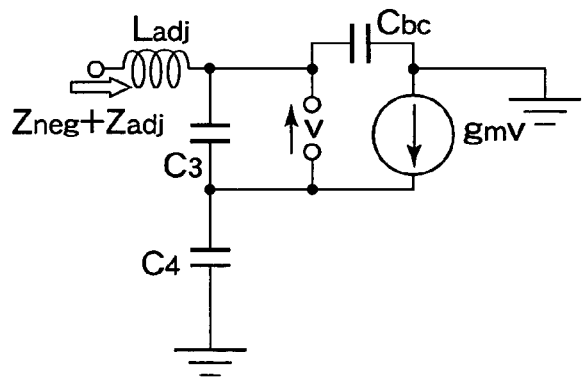
FIGS. 9A and 9B are schematic diagrams of equivalent circuits explaining operation of still another example of the negative resistance circuit.
Figure 9B:
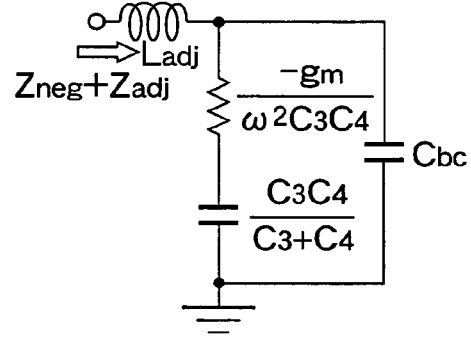
Figure 10A:
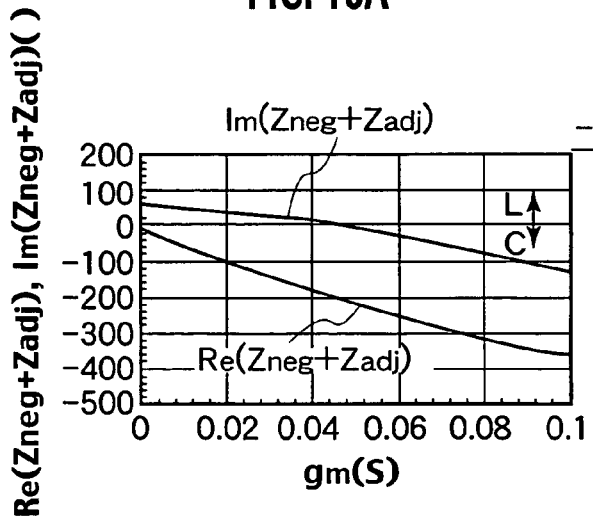
FIGS. 10A and 10B are schematic views illustrating a transconductance dependence of impedance and a vector diagram for the equivalent circuit shown in FIG. 9A.
Figure 10B:
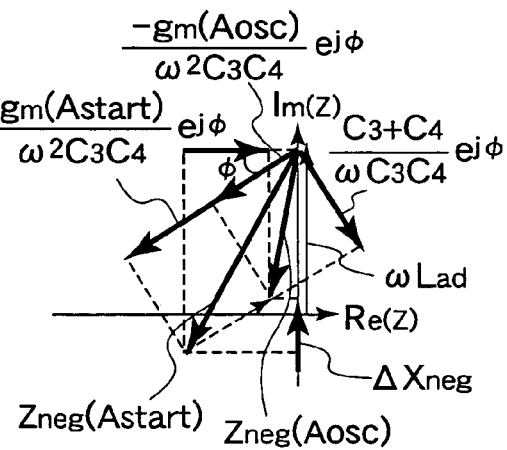

Next, an examination will be made of a case where, as shown in FIG. 9A, an inductor $L_{adj}$ is connected as a phase adjusting means to the above-discussed negative resistance circuit. Since the inductor $L_{adj}$ is simply connected in series to the negative resistance circuit, as shown in FIG. 9B, the overall impedance can be provided simply by adding an impedance $Z_{adj}$ attributable to the phase adjusting means to the impedance $Z_{neg}$ of the negative resistance circuit. As a result, as shown in FIGS. 10A and 10B, when the transconductance $g_m$ is large, an imaginary part of the overall impedance $(Z_{neg}+Z_{adj})$ provides a negative value, that is, an capacitive reactance, and when the transconductance $g_m$ is small, the imaginary part provides a positive value, that is, an inductive reactance. In other words, when the transconductance $g_m$ of the transistor varies with amplitude of a signal, the sign of the reactance is varied from negative to positive with the transition of oscillation from a starting state to the steady state.

Assuming that a piezoelectric resonator is connected to the negative resistance circuit and the above-discussed phase adjusting means, when the transconductance $g_m$ is large at the start of oscillation, the negative resistance circuit oscillates with a positive reactance component of the piezoelectric resonator, that is, in a frequency range between the series resonance frequency and the parallel resonance frequency. Moreover, when the transconductance $g_m$ is small in steady state oscillation, the negative resistance circuit oscillates with a negative reactance component of the piezoelectric resonator, that is, below the series resonance frequency.

Note that the variable capacitance $C_{var}$ of the reactance controller 52 has been ignored for simplification in the foregoing description. However, even when the variable capacitance $C_{var}$ is present, the variable capacitance $C_{var}$ only has an influence of relatively varying the value of the reactance. Therefore, the case where the variable capacitance $C_{var}$ is present also conforms to the foregoing description qualitatively.

The foregoing description has been given using the simplest model where only the minimum parasitic component of transistors is considered in the negative resistance circuit. Therefore, it is necessary in practice to consider other various parasitic components. Accordingly, when designing the VCO 50, it is necessary to adjust circuit parameters using a more precise transistor model and a circuit simulator so as to satisfy the following equation relating to steady state oscillation at an angular frequency lower than the series resonance angular frequency $\omega_s$ of the FBAR 56 alone.

$$Z_{NEG}(A_{osc}, \omega_{osc})+Z_{RES}(\omega_{osc})=0. \quad (14)$$

At a frequency equal to a series resonance frequency $f_s$ or lower, the reactance $X_{FBAR}(\omega_{osc})$ of the FBAR 56 provides a negative value. However, the reactance $X_{FBAR}(\omega_{osc})$ is greater than a value of reactance $\{-1/(\omega_s \cdot C_{F0})\}$ attributable to the electrostatic capacity $C_{F0}$. Therefore, in order to achieve steady state oscillation, by focusing attention on large signal reactance of circuitry elements other than the FBAR 56, a circuit of the resonator may be constructed such that the following inequality is satisfied for the series resonance angular frequency $\omega_0$ of the FBAR 56.

$$0 < X_{VAR}(\omega_s)+X_{ADJ}(\omega_s)+X_{NEG}(A_{osc}, \omega_s) < 1/(\omega_s \cdot C_{F0}) \quad (15)$$

Here, for the value of each of the reactance components $X_{VAR}(\omega_s)$ $X_{ADJ}(\omega_s)$, and $X_{NEG}(A_{osc}, \omega_s)$, it is necessary to consider parasitic components involved in packaging of respective circuitry elements and circuit wirings. For the negative resistance circuit 60, in particular, it is necessary to predict the parasitic components with high precision simulation of a high frequency circuit, using a large amplitude model capable of precisely representing the value of the reactance $X_{NEG}(A_{osc}, \omega_s)$ as well as the nonlinearity of the transistor.

Moreover, in the inequality (15), the reactance $X_{VAR}(\omega_s)$ of the reactance controller 52 always presents a negative value. In addition, the reactance $X_{NEG}(A_{osc}, \omega_s)$ of the negative resistance circuit 60 also often presents a negative value. In such case, in order to satisfy the inequality (15), reactance of the resonator 70 is adjusted using a reactance $X_{ADJ}(\omega_s)$ of a positive value of the phase adjuster 54.

In the resonator 70, it is assumed that, the reactance $X_{VAR}(\omega_s)$ of the reactance controller 52 on the series resonance angular frequency $\omega_s$ of the FBAR 56, varies with a maximum of $\Delta X_{VAR}$ within a voltage variable range of the control voltage $V_{control}$ of the control voltage source 66. It is also assumed that the reactance $X_{RES}(\omega_s)$ of the resonator 70 is accordingly varied with a maximum of $\Delta X_{VAR}$, which causes a variation in the phase condition for oscillation and thus causes a variation of $\Delta f_{osc}$ in the oscillation frequency. Assuming that, around the series resonance frequency $f_s$ of the FBAR 56, each of the reactances $X_{NEG}(A_{osc}, \omega_s)$ and $X_{ADJ}(\omega_s)$ of the negative resistance circuit 60 and the phase adjuster 54, respectively, can be approximated to a substantially constant value. Then, the variation $\Delta f_{osc}$ in the oscillation frequency can be approximately expressed by the following equation.

$$\Delta f_{sc}=(\partial f/\partial X_{RES})*\Delta X_{RES} \approx (\partial X_{FBAR}/\partial f)^{-1}*\Delta X_{VAR} \quad (16)$$

When focusing attention on a frequency around the series resonance frequency $f_s$ which allows the resistance components $R_{FBAR}$ of the complex impedance of the FBAR 56 to provide a small value, the gradient of the reactance $X_{FBAR}$ of the FBAR 56 with respect to the frequency is high when the frequency is higher than the series resonance frequency $f_s$. Accordingly, the value of $(\partial X_{FBAR}/\partial f)^{-1}$ in the right hand side of the equation (16) is small. More specifically, only a small variation $\Delta f_{osc}$ in the oscillation frequency can be determined for a reactance difference $\Delta X_{VAR}$ of the reactance controller 52.

On the other hand, when the oscillation frequency is lower than the series resonance frequency $f_s$, the gradient of the reactance $X_{FBAR}$ of the FBAR 56 with respect to the frequency is low. Accordingly, the value $(\partial X_{FBAR}/\partial f)^{-1}$ in the right hand side of the equation (16) provides a relatively large value. Therefore, a large variation $\Delta f_{osc}$ in the oscillation frequency can be determined for the reactance difference $\Delta X_{VAR}$ of the reactance controller 52.

In principle, the operation of the VCO 50 has a characteristic that only a frequency that satisfies the oscillation condition at small signals is selectively amplified. The first embodiment is characterized in that the oscillation start condition is limited to an extremely narrow frequency range between the series resonance and parallel resonance of the FBAR 56. Such characteristic has the effect of suppressing abnormal oscillation at an undesired frequency. Accordingly, stable oscillation can be achieved. Moreover, in the steady state where the oscillation amplitude is sufficiently amplified, the oscillation frequency $f_{osc}$ may vary in a wide frequency range by varying the oscillation frequency $f_{osc}$ to a frequency lower than the series resonance frequency $f_s$.

When a reactance attributable to the electrostatic capacity $C_{F0}$ of the FBAR 56 at the series resonance angular frequency $\omega_s$ is defined as $X_{FBAR0}$, the $X_{FBAR0}$ can be represented as follows.

$$X_{FBAR0} = -1/(\omega_s * C_{F0}) \quad (17)$$

In addition, a reactance at a center value of the control voltage $V_{control}$ for the reactance controller 52 at the series resonance angular frequency $\omega_s$ is defined as $X_{VAR0}$. For example, it has been confirmed that a wide frequency tunability of approximately 1% or more can be assured by designing an area S of the FBAR 56 such that a value of a reactance ratio $X_{VAR0}/X_{FBAR0}$ is 0.30 or larger. When the value of the reactance ratio $X_{VAR0}/X_{FBAR0}$ is 1.50 or larger, the VCO 50 cannot oscillate in the entire control voltage range. Therefore, it is desirable that the value of the reactance ratio $X_{VAR0}/X_{FBAR0}$ is in a range of not less than 0.30 and not more than 1.50.

Furthermore, a difference between a maximum value $X_{FBARMax}$ and a minimum value $X_{FBARMin}$ of the reactance around the resonance frequency of the FBAR 56 is defined as follows.

$$\Delta X_{FBAR} = X_{FBARMax} - X_{FBARMin} \quad (18)$$

For example, around the resonance frequency of the FBAR 56, by converting a scattering (S) parameter measured by a network analyzer into a complex impedance, the difference $\Delta X_{FBAR}$ can be provided. When the complex impedance $Z_{FBAR}$ around the series resonance frequency $f_s$ of the FBAR 56 is plotted on a complex plane ($R_{FBAR}$, $jX_{FBAR}$), an impedance circle can be drawn. Approximately, the difference $\Delta X_{FBAR}$ corresponds to the diameter of the impedance circle. The diameter of the impedance circle is reduced in substantially inverse proportion to an area S of opposing electrodes of the FBAR 56.

Similarly, when the high frequency characteristic around the resonance frequency of the FBAR 56 is measured by varying the control voltage $V_{control}$ applied to the reactance controller 52, it is possible to measure a maximum reactance difference $\Delta X_{VAR}$ within the control voltage variable range around the oscillation frequency of the reactance controller 52. For example, when the reactance controller 52 is a variable capacitance diode, the maximum reactance difference can be approximately expressed by the following expression, $$\Delta X_{VAR} >> |1/C_{VARMax} - 1/C_{VARMin}|(2*\pi*f_s) \quad (19)$$

Here, $C_{VARMax}$ is a maximum capacitance and $C_{VARMin}$ is a minimum capacitance in the control voltage range.

In the VCO 50 using the FBAR 56, the value of the ratio $\Delta X_{VAR}/\Delta X_{FBAR}$ between the maximum reactance difference $\Delta X_{VAR}$ of the reactance controller 52 and the reactance difference $\Delta X_{FBAR}$ of the FBAR 56 is important. The larger the value of the ratio $\Delta X_{VAR}/\Delta X_{FBAR}$, the wider the frequency tunability. For example, since the variable capacitance diode as the reactance controller 52 uses a variation of pn junction capacitance, it is difficult to obtain more than a certain fixed value of a reactance difference $\Delta X_{VAR}$ within the limited control voltage range. In such case, it is possible to obtain the value of the ratio $\Delta X_{VAR}/\Delta X_{FBAR}$ by enlarging the area S of the FBAR 56.

Specifically, it has been confirmed that a wide frequency tunability of approximately 1% or more can be assured by designing the area S of the FBAR 56 such that the value of the ratio $\Delta X_{VAR}/\Delta X_{FBAR}$ is 0.05 or larger. When the value of the ratio $\Delta X_{VAR}/\Delta X_{FBAR}$ is 0.30 or larger, the VCO 50 cannot oscillate in the entire control voltage range. Therefore, it is desirable that the value of the ratio $\neq X_{VAR}/\Delta X_{FBAR}$ is in a range of not less than 0.05 and not more than 0.30.

As described above, according to the first embodiment, the initial oscillation angular frequency $\omega_{start}$ immediately after turning on power to the VCO 50 enables oscillation to start stably between the series resonance angular frequency $\omega_s$ and the parallel resonance angular frequency $\omega_p$ of the FBAR 56. Moreover, the oscillation angular frequency $\omega_{osc}$ after the oscillation settles into the steady state may be lower than the series resonance angular frequency $\omega_s$ by using the nonlinearity of the negative resistance circuit 60, which makes it possible to increase the frequency tunability of the VCO 50.

Figure 11:
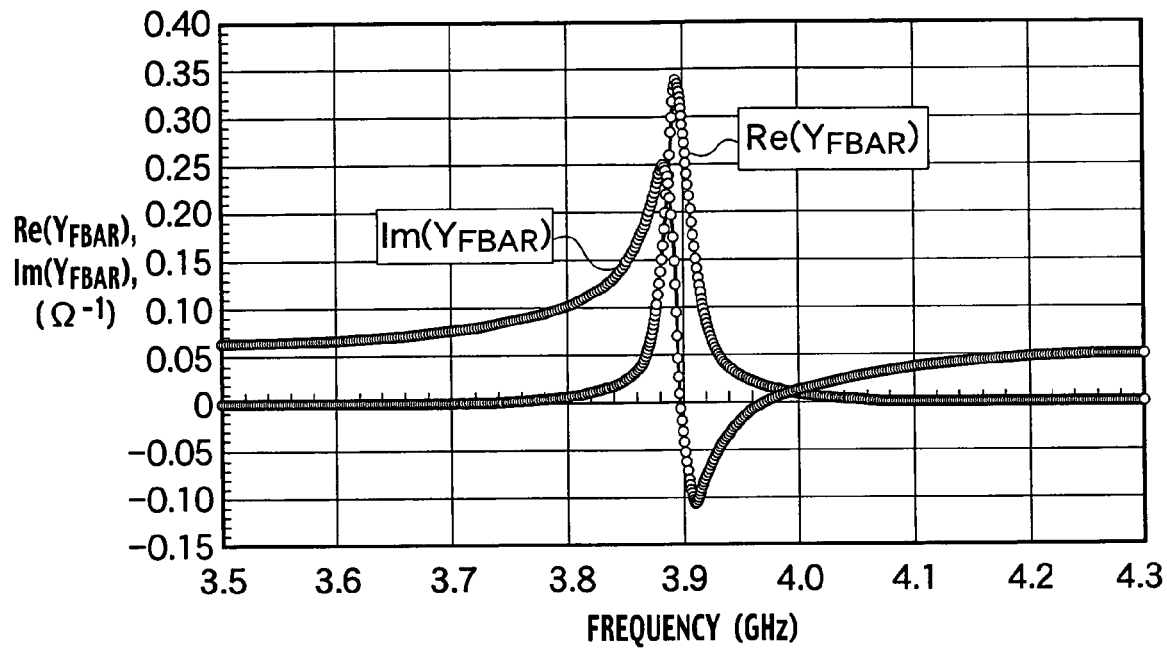
FIG. 11 is a graph showing an example of a frequency characteristic of an admittance of the stand-alone FBAR according to the first embodiment of the present invention.

Next, an example of the VCO 50 according to the first embodiment will be described. For a piezoelectric thin film of the FBAR 56, for example, AlN is used. An opposing electrode area of the FBAR 56 is 10000 μm². Values of equivalent circuit parameters of the FBAR 56 are calculated by fitting so that the values are best matched with a measurement result of the resonance characteristic of the FBAR 56. FIG. 11 is a graph obtained by plotting a real part $Re(Y_{FBAR})$ and an imaginary part $Im(Y_{FBAR})$ of an admittance $Y_{FBAR}$ of the FBAR 56, that is, conductance and susceptance, with respect to the frequency. In FIG. 11, the measured values are indicated by white circles, and the results of the fitting are indicated by a solid line. The equivalent circuit parameters used in the fitting are as follows: $C_{F0}$=2.25 pF; $C_{F1}$=0.098 pF; $L_F$=17.0 nH; $R_F$=3.0. Based on the results, it can be calculated that an effective value of an electromechanical coupling coefficient $k_{eff}^2$ of the FBAR 56 is approximately 5.1%, and a mechanical Q value is approximately 140. Moreover, from FIG. 11, the series resonance frequency $f_s$. of the FBAR 56 is approximately 3.90 GHz, and the parallel resonance frequency $f_p$ thereof is approximately 3.98 GHz.

Figure 12:
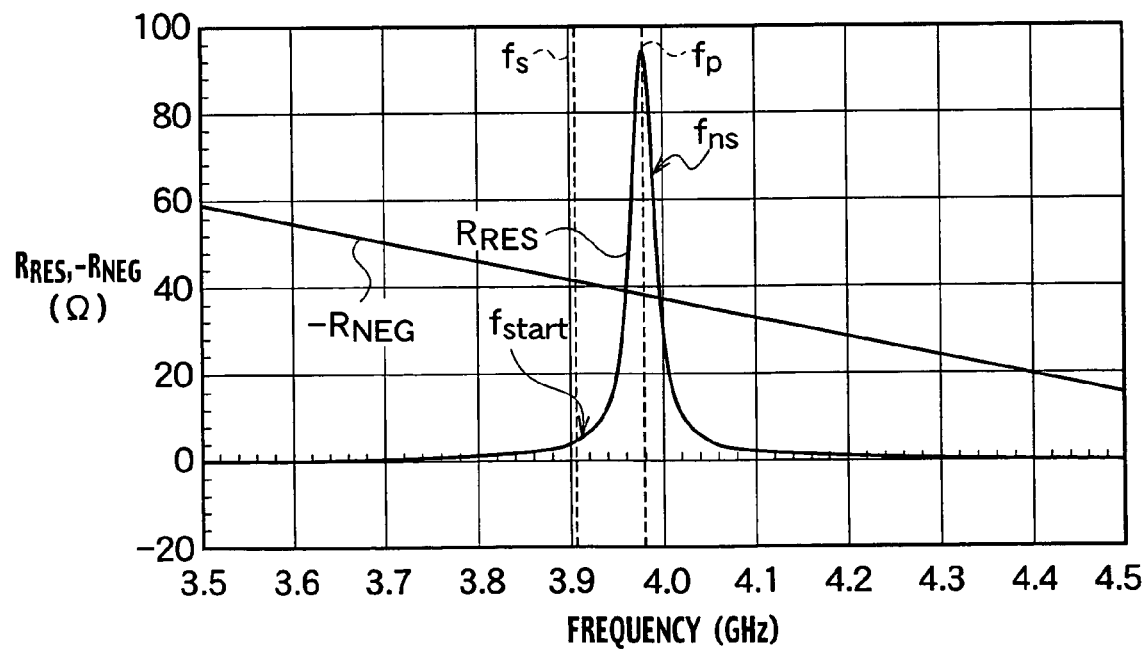
FIG. 12 is a graph showing examples of frequency characteristics of a real part of complex impedance (resistance) of the resonator and the negative resistance circuit according to the first embodiment of the present invention.
Figure 13:
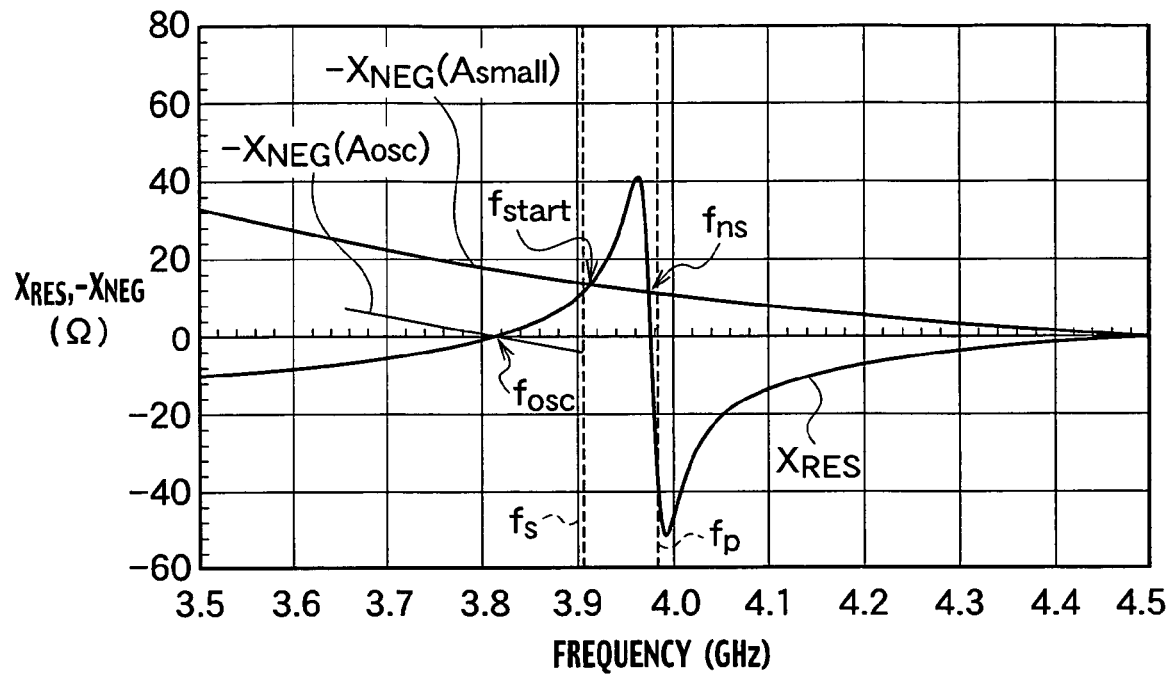
FIG. 13 is a graph showing examples of frequency characteristics of an imaginary part of complex impedance (reactance) of the resonator and the negative resistance circuit according to the first embodiment of the present invention.

As shown in FIGS. 12 and 13, the frequency characteristics of the resistance component $R_{RES}$ and the reactance component $X_{RES}$ of the resonator 70 around the resonance frequency of the FBAR 56, respectively, sharply vary between the series resonance frequency $f_s$ and the parallel resonance frequency $f_p$. The resistance component $R_{RES}$ exhibits a frequency characteristic having a steep peak with the maximum value around the parallel resonance frequency $f_p$ of the FBAR 56. The reactance component $X_{RES}$ has a positive value, which indicates inductivity, around the series resonance frequency fs, and has a negative peak around the parallel resonance frequency fp.

Moreover, the frequency characteristics of the resistance component ($-R_{NEG}$) and the reactance component ($-X_{NEG}$) of the negative resistance circuit 60 also shown in FIGS. 12 and 13, respectively, shows gradual decreases as the frequency increases. Note that, for the negative resistance circuit 60, the components of the negative complex impedance ($-Z_{NEG}$) are used for convenience. FIG. 13 shows a reactance $\{X_{NEG}(A_{small})\}$ of the negative resistance circuit 60 in relation to the amplitude $A_{small}$ during the small signal oscillation, and a reactance $\{-X_{NEG}(A_{osc})\}$ of the negative resistance circuit 60 in relation to the large amplitude $A_{osc}$ during the oscillation in the steady state. Note that the control voltage $V_{control}$ for the resonator 70 applied from the control voltage source 66 and the DC voltage for the negative resistance circuit 60 are set to, for example, 1.35 V and 2.7 V, respectively.

From FIG. 13, it can be perceived based on intersections $f_{start}$ and $f_{ns}$ of the reactance $X_{RES}$ of the resonator 70 and the small signal operation reactance $\{-X_{NEG}(A_{small})\}$ of the negative resistance circuit 60, whether the oscillation start condition of the equation (10) is satisfied. The values of $f_{start}$ and $f_{ns}$ are 3.92 GHz and 3.97 GHz, respectively, each of which is higher than the series resonance frequency $f_s$ of approximately 3.90 GHz of the FBAR 56 and lower than the parallel resonance frequency $f_p$ of approximately 3.98 GHz thereof. Accordingly, it is understood that both intersections $f_{start}$ and $f_{ns}$ satisfy the oscillation start condition of the equation (10).

Moreover, from FIG. 12, the value that satisfies the oscillation start condition expressed by the inequality (9) is 3.92 GHz, which is the frequency $f_{start}$ shown in FIGS. 12 and 13. On the other hand, the frequency $f_{ns}$ of 3.97 GHz, does not satisfy the oscillation start condition, and it is therefore understood that the frequency $f_{ns}$ does not serve as the oscillation start point.

Next, after the oscillation has started, the VCO 50 settles into the steady state. As shown in FIG. 13, the VCO 50 stably oscillates at the oscillation frequency $f_{osc}$ of approximately 3.84 GHz which is an intersection of the reactance $X_{RES}$ of the resonator 70 and the large signal operation reactance $\{-X_{NEG}(A_{osc})\}$ of the negative resistance circuit 60. In the steady state, current consumption Icc of the DC power supply Vcc is approximately 9.5 mA, and output power Pout for a load of 50, is approximately −4 dBm. It is understood that the oscillation frequency $f_{osc}$ in the steady state is lower than the series resonance frequency $f_s$ of approximately 3.90 GHz of the FBAR 56.

The reason why the oscillation frequency varies from the initial oscillation frequency $f_{start}$ to the steady oscillation frequency $f_{osc}$ is that, as stated above, the values of the small signal operation reactance $\{-X_{NEG}(A_{small})\}$ and the large signal operation reactance $\{-X_{NEG}(A_{osc})\}$ vary due to the nonlinearity of the transistors included in the negative resistance circuit 60. An example can be found in which the phenomenon that the initial oscillation frequency $f_{start}$ and the steady oscillation frequency $f_{osc}$, vary as described above has been observed in an oscillator other than the VCO 50 using the FBAR 56 (refer to Kazuhiko Honjo, "Microwave semiconductor circuit—fundamentals and developments," published by Nikkan Kogyo Shimbun, p. 170 (1993)). However, there have been no reported examples concerning a VCO using an FBAR. Further, in the VCO 50 using the FBAR 56, oscillation is normally implemented in a frequency range where the reactance $X_{FBAR}$ of the FBAR 56 is a positive value to be assumed as an inductance. In other words, oscillation is implemented in a frequency range from the series resonance frequency $f_s$ to the parallel resonance frequency $f_p$ of the FBAR 56. No example is found in which oscillation is stably implemented in a frequency outside the frequency range between the series resonance frequency $f_s$ and the parallel resonance frequency $f_p$.

As a comparative example, in order to provide steady oscillation in the frequency range between the series resonance frequency $f_s$ and the parallel resonance frequency $f_p$ of the FBAR 56, a VCO circuit is designed with a similar circuitry of the VCO 50 so that large signal reactances of circuitry elements other than the FBAR 56 satisfy the following inequality, $$Xa_{VAR}(\omega_s) + Xa_{ADJ}(\omega_s) + Xa_{NEG}(A_{osc}, \omega_s) < 0. \quad (20)$$

Here, $Xa_{VAR}(\omega_s)$ is a reactance of a reactance controller, $Xa_{ADJ}(\omega_s)$ is a reactance of a phase adjuster, and $Xa_{NEG}(A_{osc}, \omega_s)$ is a reactance of the negative resistance circuit 60 during the steady oscillation.

Figure 14:
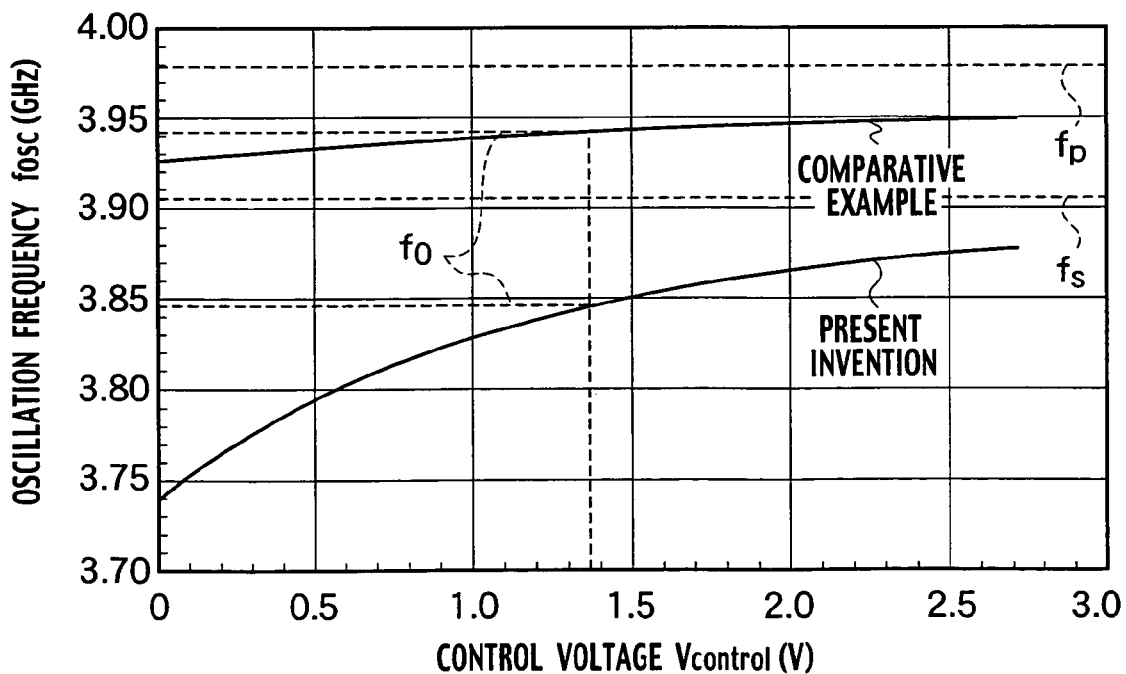
FIG. 14 is a graph showing an example of a control voltage dependence for a oscillation frequency of the VCO according to the first embodiment of the present invention.

In the first embodiment, as shown in FIG. 14, the steady oscillation frequency $f_{osc}$ of the VCO 50 exhibits great dependency on the control voltage $V_{control}$ in comparison with that in the comparative example. Here, assuming that 1.35 V is a center value of the control voltage $V_{control}$, the steady oscillation frequency $f_{osc}$ when the control voltage is 1.35V is defined as a center frequency $f_0$. In the first embodiment, the center frequency $f_0$ is in a frequency range lower than the series resonance frequency $f_s$ of the FBAR 56. When the control voltage $V_{control}$ is in a range from 0.6 V to 2.1 V, the steady oscillation frequency $f_{osc}$ varies from approximately 3.802 GHz to 3.867 GHz. On the other hand, in the comparative example, the center frequency $f_0$ is in a frequency range between the series resonance frequency $f_s$ and the parallel resonance frequency $f_p$ of the FBAR 56. When the control voltage $V_{control}$ is in the range from 0.6 V to 2.1 V, the steady oscillation frequency $f_{osc}$ varies very little, from approximately 3.932 GHz to 3.945 GHz.

Figure 15:
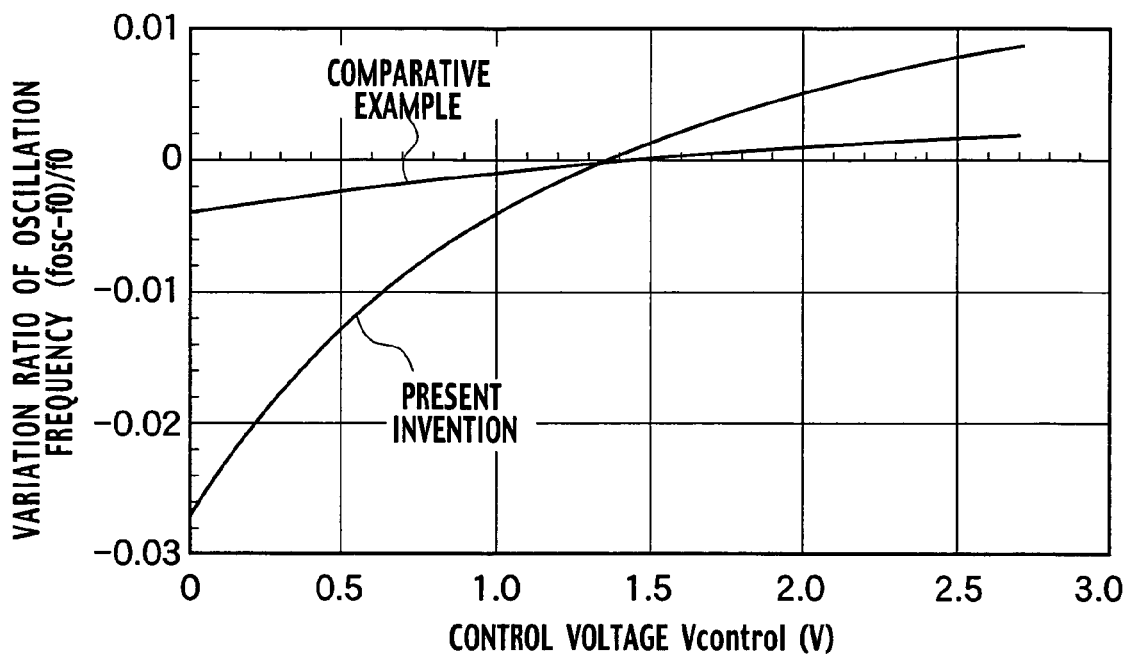
FIG. 15 is a graph showing an example of a control voltage dependence for a variation ratio of an oscillation frequency of the VCO according to the first embodiment of the present invention.

FIG. 15 shows the dependence of the steady oscillation frequency $f_{osc}$ shown in FIG. 14 on the control voltage $V_{control}$, as a variation ratio of oscillation frequency. Here, the variation ratio of oscillation frequency is defined as $(f_{osc} - f_0)/f_0$. The VCO 50 according to the first embodiment can yield a variation ratio of oscillation frequency of approximately 1.6% when varying the control voltage $V_{control}$ from 0.6 V to 2.1 V. On the other hand, the VCO according to the comparative example yields a variation ratio of oscillation frequency of approximately 0.3% when varying the control voltage $V_{control}$ from 0.6 V to 2.1 V. Therefore, it is understood that the VCO according to the comparative example can yield only one fifth or less the variation ratio of oscillation frequency yielded by the VCO 50 according to the first embodiment.

Figure 16:
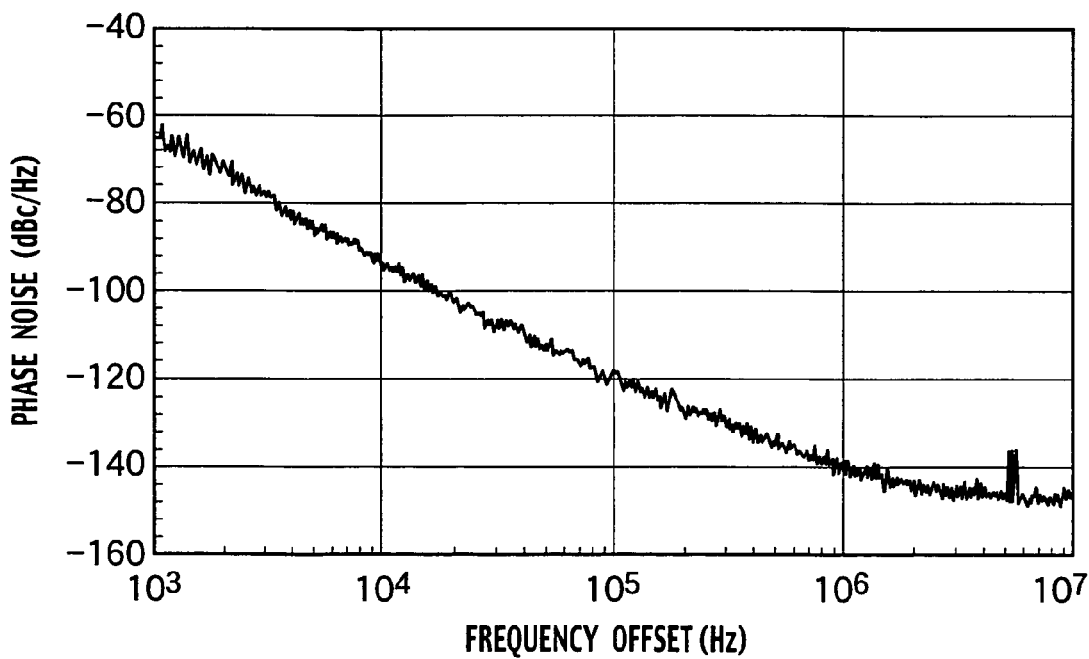
FIG. 16 is a graph showing an example of a phase noise characteristic of the VCO according to the first embodiment of the present invention.

As shown in FIG. 16, the VCO 50 according to the first embodiment provides a low phase noise characteristic, specifically, a phase noise of approximately −140 dBc/Hz in a frequency offset of 1 MHz. The reason why the phase noise is suppressed to a low level is that the FBAR 56 having a high Q value is used as the resonator 70.

As described above, the VCO 50 using the FBAR 56 according to the first embodiment can provide low phase noise and assures a sufficiently wide frequency tunability because of the high Q value of the FBAR 56 at resonance. Accordingly, a communication apparatus having the VCO 50 using the FBAR 56 as a local oscillator can transmit high quality information in bulk.

Figure 17:
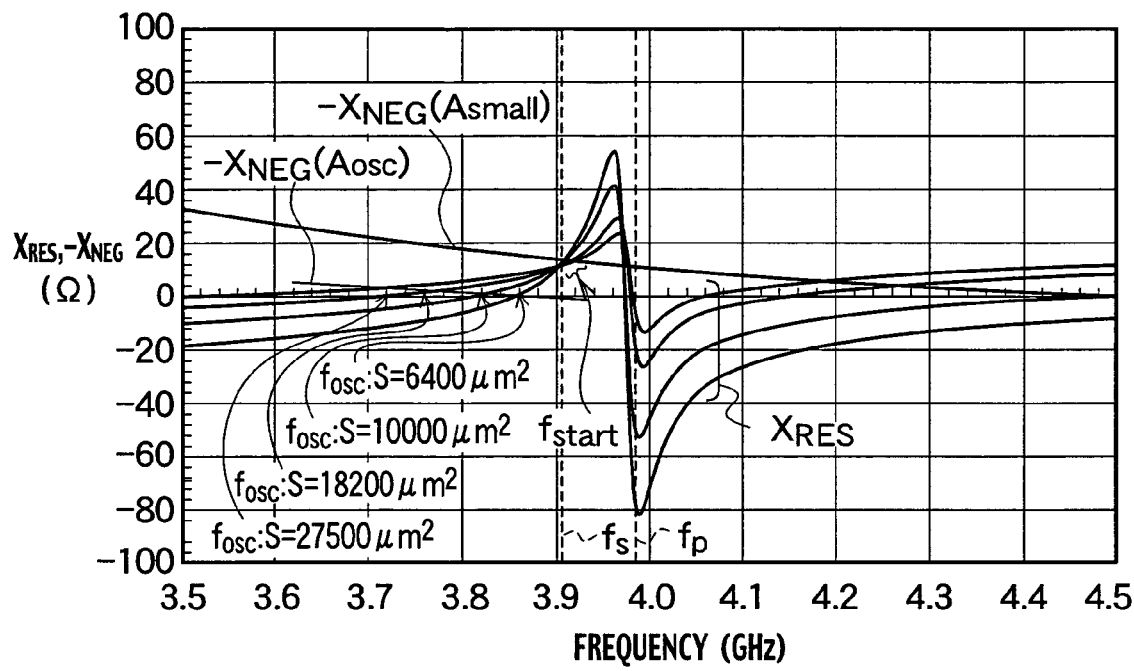
FIG. 17 is a graph showing an example of a frequency characteristic of a reactance component of complex impedance when the FBAR having a different electrode area according to the first embodiment of the present invention, used in the resonator.

FIG. 17 shows frequency dependences of the reactance $X_{RES}$ of the resonator 70, and the reactances $\{-X_{NEG}(A_{small})\}$ and $\{-X_{NEG}(A_{osc})\}$ of the negative resistance circuit 60, which are measured by varying the electrode area S of the FBAR 56 while the other circuitry is not changed. The FBAR 56 is fabricated using AlN as the piezoelectric thin film. Here, a bias voltage applied by the DC power supply Vcc of the negative resistance circuit 60 is set to 2.7 V, and the control voltage $V_{control}$ is set to 1.35 V (the center voltage). When the electrode area S of the FBAR 56 is increased from 6400 μm² to 27500 μm², the initial oscillation frequency $f_{start}$ in the small signal operation is shifted to higher frequencies between the series resonance frequency $f_s$ and the parallel resonance frequency $f_p$ of the FBAR 56. Moreover, the stable oscillation frequency $f_{osc}$ in the steady state is further shifted to lower frequencies than the series resonance frequency $f_s$ of the FBAR 56. That is, a VCO using the FBAR 56 with an electrode area S of 6400 μm² to 27500 μm² satisfies the conditions for oscillation start and for steady oscillation in the first embodiment.

Figure 18:
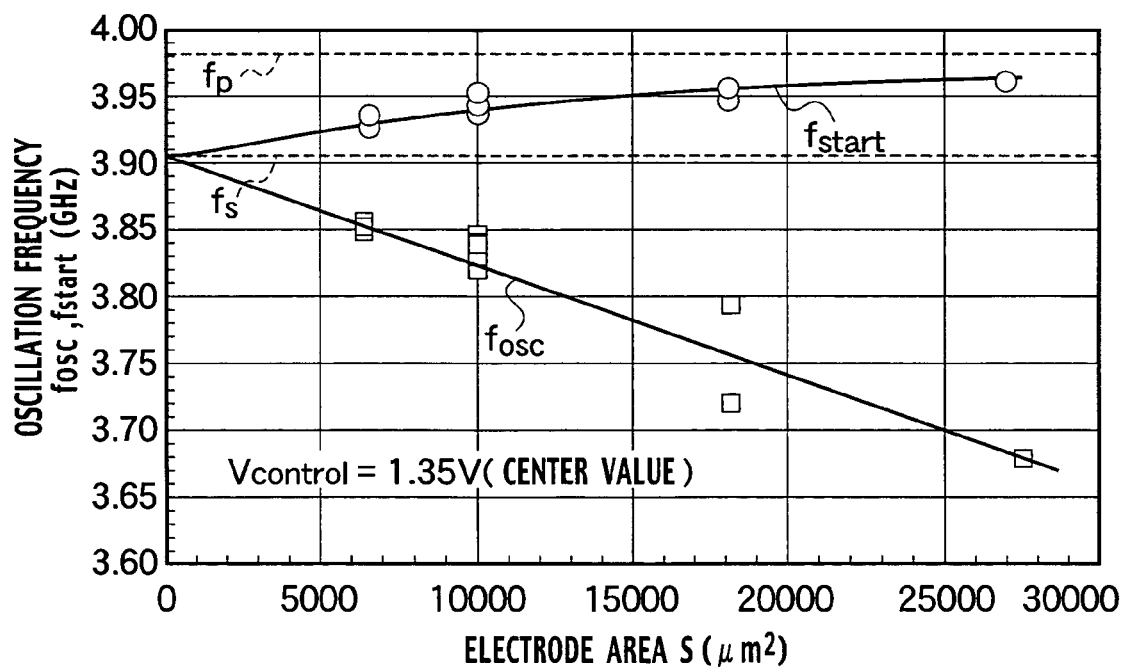
FIG. 18 is a graph showing examples of a FBAR electrode area dependence for an initial oscillation frequency and a steady oscillation frequency of the VCO according to the first embodiment of the present invention.

FIG. 18 is a graph obtained by plotting the initial oscillation frequency $f_{start}$ and the stable oscillation frequency $f_{osc}$ in relation to the electrode area S of the FBAR 56 shown in FIG. 17 when changing the area S of the FBAR 56 from 6400 μm² to 27500 μm². The initial oscillation frequency $f_{start}$ in the small signal operation is between the series resonance frequency $f_s$ and the parallel resonance frequency $f_p$ of the FBAR 56, and the stable oscillation frequency $f_{osc}$, is lower than the series resonance frequency $f_s$ of the FBAR 56. When the FBAR 56 is extrapolated up to the electrode area S=0, the values of the initial oscillation frequency $f_{start}$ and the stable oscillation frequency $f_{osc}$ both substantially correspond to the series resonance frequency $f_s$ of the FBAR 56.

Figure 19:
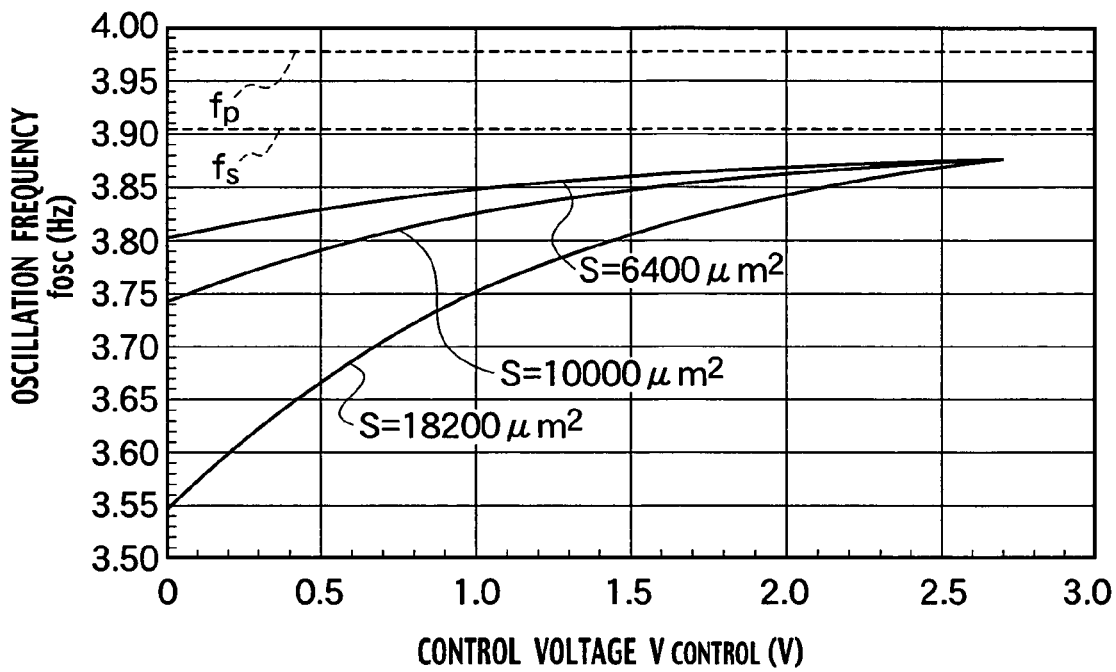
FIG. 19 is a graph showing examples of the FBAR electrode area dependence for an initial oscillation frequency and a steady oscillation frequency of the VCO according to the first embodiment of the present invention.

FIG. 19 shows the control voltage dependence of the stable oscillation frequency $f_{osc}$ when the electrode area S of the FBAR 56 is 6400 μm², 10000 μm² and 18200 μm². It is understood from FIG. 19 that the oscillation frequency $f_{osc}$ in the steady state is lower than the series resonance frequency $f_s$ of the FBAR 56 in a range of entire control voltages from 0 V to 2.7 V. Moreover, a larger electrode area S of the FBAR 56 can provide a VCO having a greater variation in frequency with respect to the control voltage $V_{control}$.

Figure 20:
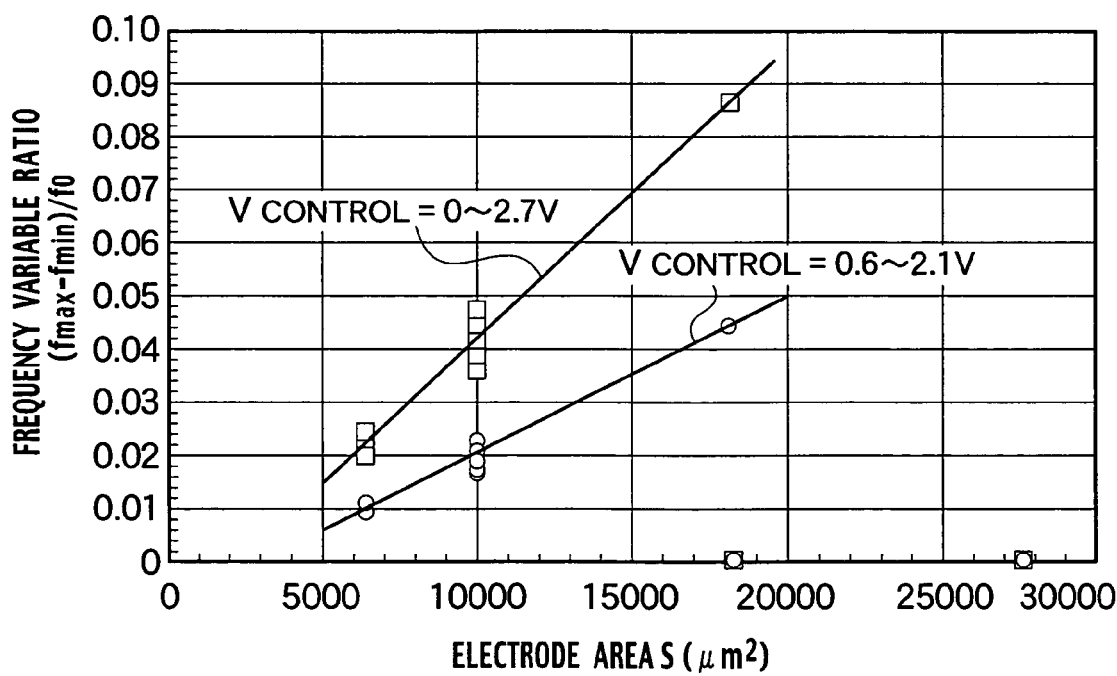
FIG. 20 is a graph showing an example of the FBAR electrode area dependence for a variable ratio of an oscillation frequency of the VCO according to the first embodiment of the present invention.

FIG. 20 shows frequency variable ratios plotted in relation to the electrode area S of the FBAR 56 when the control voltage $V_{control}$ for the reactance controller 52 is controlled within a range from 0 V to 2.7 V and a range from 0.6 V to 2.1 V. The frequency variable ratio is defined as $(f_{max} - f_{min})/f_0$ where the $f_{max}$ and $f_{min}$ indicate the highest and lowest oscillation frequencies, respectively, in each control voltage range, and the center frequency $f_0$ is an oscillation frequency when the control voltage $V_{control}$ is the center voltage of 1.35V. It is understood from FIG. 20 that the frequency tunability increases substantially in direct proportion to the electrode area S of the FBAR 56. However, in a region where the electrode area S of the FBAR 56 is larger than 18200 μm², although oscillation occurs in part of the range of the control voltage $V_{control}$, oscillation cannot be provided in the entire range of the control voltage $V_{control}$.

Figure 21:
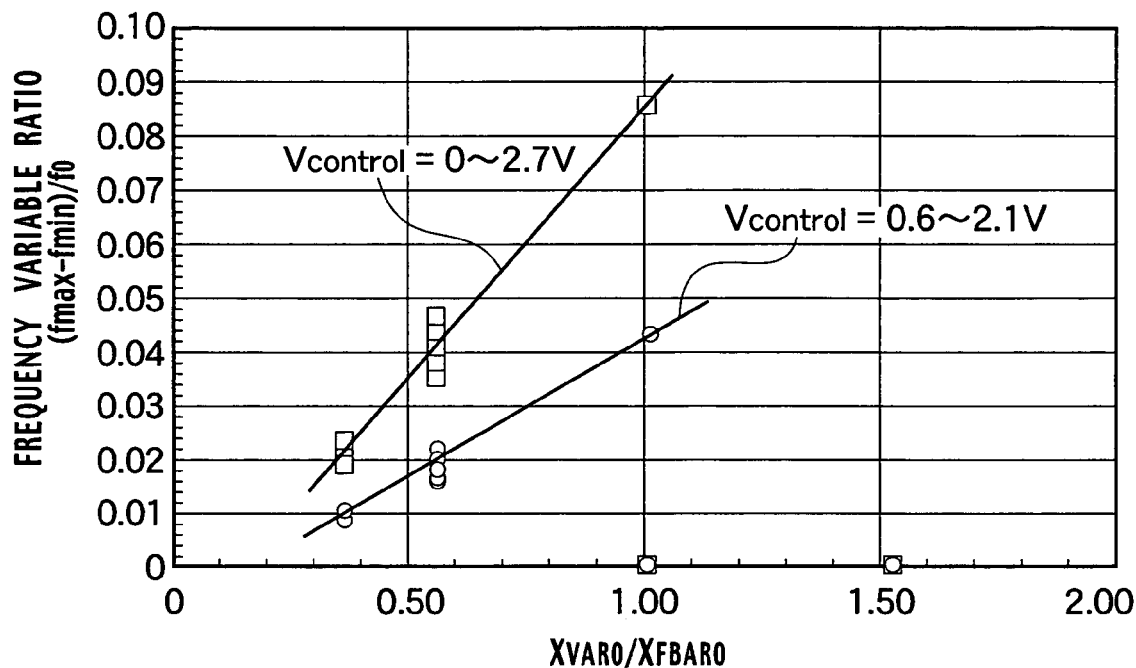
FIG. 21 is a graph showing an example of a reactance ratio $X_{VAR0}/X_{FBAR0}$ dependence for a variable ratio of an oscillation frequency of the VCO according to the first embodiment of the present invention.

FIG. 21 shows frequency variable ratios $(f_{max} - f_{min})/f_0$ plotted in relation to the reactance ratio $X_{VAR0}/X_{FBAR0}$ of the reactance controller 52 to the FBAR 56 when the control voltage $V_{control}$ for the reactance controller 52 is controlled within a range from 0 V to 2.7 V and a range from 0.6 V to 2.1 V. It is understood from FIG. 21 that a larger value of the reactance ratio $X_{VAR0}/X_{FBAR0}$ can yield a wider frequency tunability. For example, when the voltage tunability of the control voltage $V_{control}$ is set from 0.6 V to 2.1 V, a frequency tunability of 1% or more can be obtained if the value of the reactance ratio $X_{VAR0}/X_{FBAR0}$ is 0.30 or larger. However, when the value of the reactance ratio $X_{VAR0}/X_{FBAR0}$ is larger than 1, oscillation is stopped at some control voltages $V_{control}$. Therefore, in order to oscillate in the entire range of the control voltage $V_{control}$, it is desirable that the value of the reactance ratio $X_{VAR0}/X_{FBAR0}$ is less than 1.50.

Note that, in the first embodiment, a variable capacitance diode or the like, is used for the reactance controller 52. Since the variable capacitance diode and the FBAR 56 are both capacitive elements, the reactance is inversely proportional to the electrostatic capacity CFO. Therefore, FIG. 21 shows the fact that the greater the ratio of the electrostatic capacity $C_{F0}$ of the FBAR 56 to the electrostatic capacity $C_{VAR}$ of the variable capacitance diode, the larger the frequency variable ratio.

Figure 22:
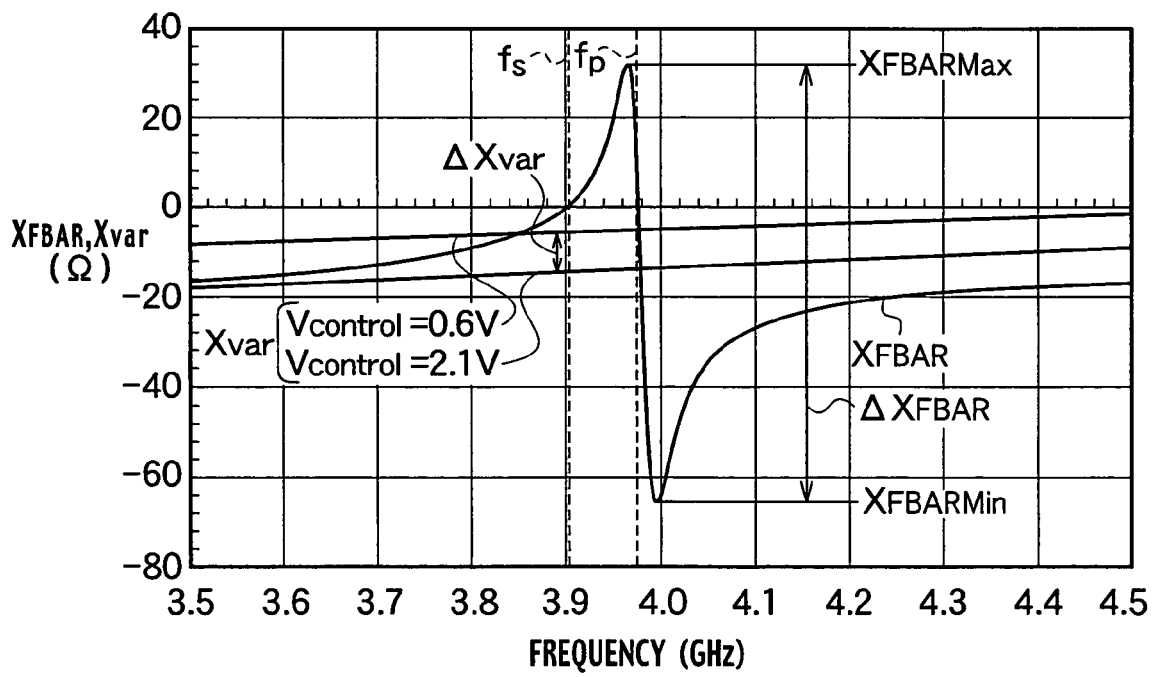
FIG. 22 is a graph showing examples of a frequency dependence for a reactance component of the FBAR and the reactance controller of the VCO according to the first embodiment of the present invention.

FIG. 22 shows the definition of values of a maximum reactance difference $\Delta X_{VAR}$ of the reactance controller 52 and of a reactance difference $\Delta X_{FBAR}$ of the FBAR 56, around the resonance frequency.

The reactance $X_{VAR}$ of the reactance controller 52 varies with the control voltage $V_{control}$. When the voltage variable range of the control voltage $V_{control}$ is set from 0.6 V to 2.1 V, as shown in FIG. 22, the value of the reactance $X_{VAR}$ of the reactance controller 52 at the series resonance frequency $f_s$ is varied from −5.6 Ω to −14.2 Ω. Accordingly, the maximum reactance difference $\Delta X_{VAR}$ is 8.6 Ω. Similarly, when the control voltage $V_{control}$ is varied from 0 V to 2.7 V, the maximum reactance difference $\Delta X_{VAR}$ is 15.7 Ω. Therefore, when the voltage variable range of the control voltage $V_{control}$ is set from 0.6 V to 2.1 V, the value of the reactance variation ratio $\Delta X_{VAR}/\Delta X_{VAR0}$ is approximately 0.85. The value of the reactance variation ratio $\Delta X_{VAR}/\Delta X_{VAR0}$ reflects the capacitance variation ratio of the used variable capacitance diode for the reactance controller 52. In order to obtain a large frequency variable ratio, it is desirable that the reactance variation ratio $\Delta X_{VAR}/\Delta X_{VAR0}$ is a large value of larger than 0.50.

The value of the reactance difference $\Delta X_{FBAR}$ of the FBAR 56 shown in FIG. 22 is a value obtained by subtracting the minimum value $X_{FBARMin}$ from the maximum value $X_{FBARMax}$ of $X_{FBAR}$ around the resonance frequency, as already shown in the equation (18). The value of $\Delta X_{FBAR}$ varies with the electrode area S of the FBAR 56. When the electrode area S of the FBAR 56 shown in FIG. 22 is 10000 μm², the value of the $\Delta X_{FBAR}$ is approximately 98 Ω. The larger the electrode area S of the FBAR 56, the smaller the value $\Delta X_{FBAR}$ tends to be. For example, when the electrode area S of the FBAR 56 is 18200 μm², the value of $\Delta X_{FBAR}$ is approximately 55 Ω.

Figure 23:
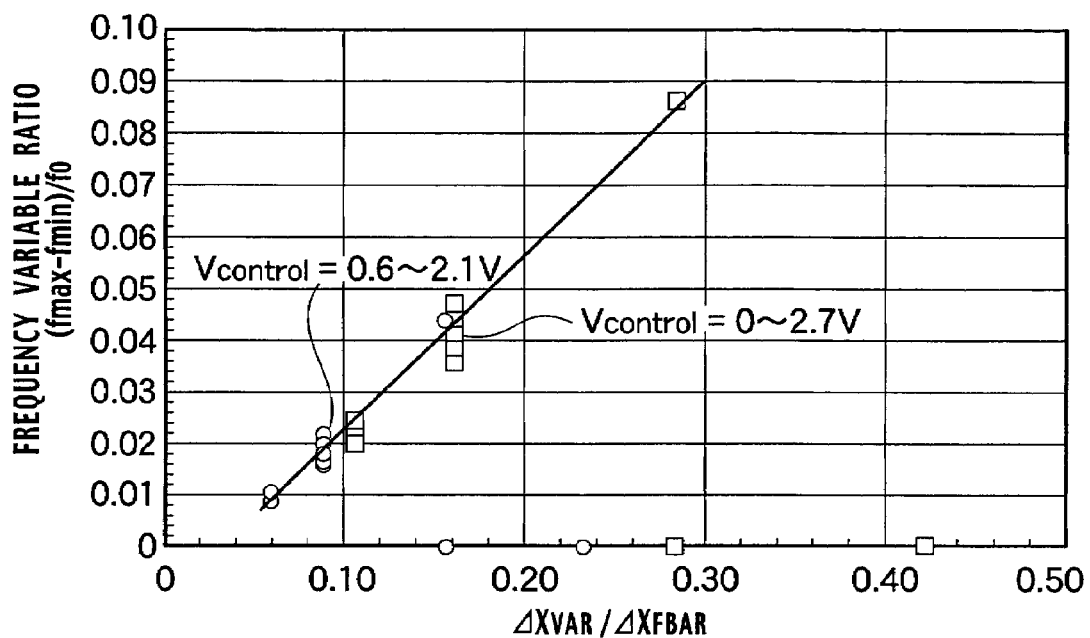
FIG. 23 is a graph showing an example of a $\Delta X_{VAR}/\Delta X_{FBAR}$ dependence for a variable ratio of an oscillation frequency of the VCO according to the first embodiment of the present invention.

FIG. 23 shows frequency variable ratios $(f_{max} - f_{min})/f_0$ plotted in relation to $\Delta X_{VAR}/\Delta X_{FBAR}$ when the control voltage $V_{control}$ for the reactance controller 52 is controlled within a range from 0 V to 2.7 V and a range from 0.6 V to 2.1 V. It is understood that the frequency variable ratio $(f_{max} - f_{min})/f_0$ increases with an increase in the value of the reactance ratio $\Delta X_{VAR}/\Delta X_{FBAR}$. It is found that a frequency tunability of 1% or more can be obtained by setting the value of the reactance ratio $\Delta X_{VAR}/\Delta X_{FBAR}$ to 0.05 or larger. When the value of the reactance ratio $\Delta X_{VAR}/\Delta X_{FBAR}$ is too large, however, oscillation is stopped at some control voltages $V_{control}$. Therefore, in order to oscillate in the entire range of the control voltage $V_{control}$, it is desirable that the value of the reactance ratio $\Delta X_{VAR}/\Delta X_{FBAR}$ be 0.30 or smaller.

In FIG. 21, the dependences of the frequency variable ratio $(f_{max} - f_{min})/f_0$ on the reactance ratio $X_{VAR0}/X_{FBAR0}$ when the control voltage variable range is from 0.6 V to 2.1 V and from 0 V to 2.7 V are represented by different straight lines. By comparison, in FIG. 23, the dependences of the frequency variable ratio $(f_{max} - f_{min})/f_0$ on the reactance ratio $\Delta X_{VAR}/\Delta X_{FBAR}$ when the control voltage variable range is from 0.6 V to 2.1 V and from 0 V to 2.7 V are represented by substantially identical straight lines. Accordingly, the expression using the reactance ratio $\Delta X_{VAR}/\Delta X_{FBAR}$ has more general meaning than the expression using the reactance ratio $X_{VAR0}/X_{FBAR0}$.

As described above, it is possible to vary the oscillation frequency band of the VCO by varying the electrode area S of the FBAR 56. However, the oscillation frequency band of the VCO can be also varied by varying thickness of the piezoelectric thin film of the FBAR 56. The series resonance frequency $f_s$ and the parallel resonance frequency $f_p$ of the FBAR 56 are determined depending on a time period taken for a sound to travel in the piezoelectric thin film between the electrodes of the FBAR 56. When the thickness of the piezoelectric thin film is increased by, for example, 10%, both the series resonance frequency $f_s$ and the parallel resonance frequency of the FBAR 56 decrease by approximately 10%. On the contrary, when the thickness of the piezoelectric thin film decreases, the series resonance frequency $f_s$ and the parallel resonance frequency of the FBAR 56 increase substantially in direct proportion to the thickness of the piezoelectric thin film. Accordingly, it is possible to vary the oscillation frequency band of the VCO by varying the thickness of the piezoelectric thin film of the FBAR 56 and thereby varying the series resonance frequency $f_s$ of the FBAR 56.

First Modification of the First Embodiment

Figure 24:
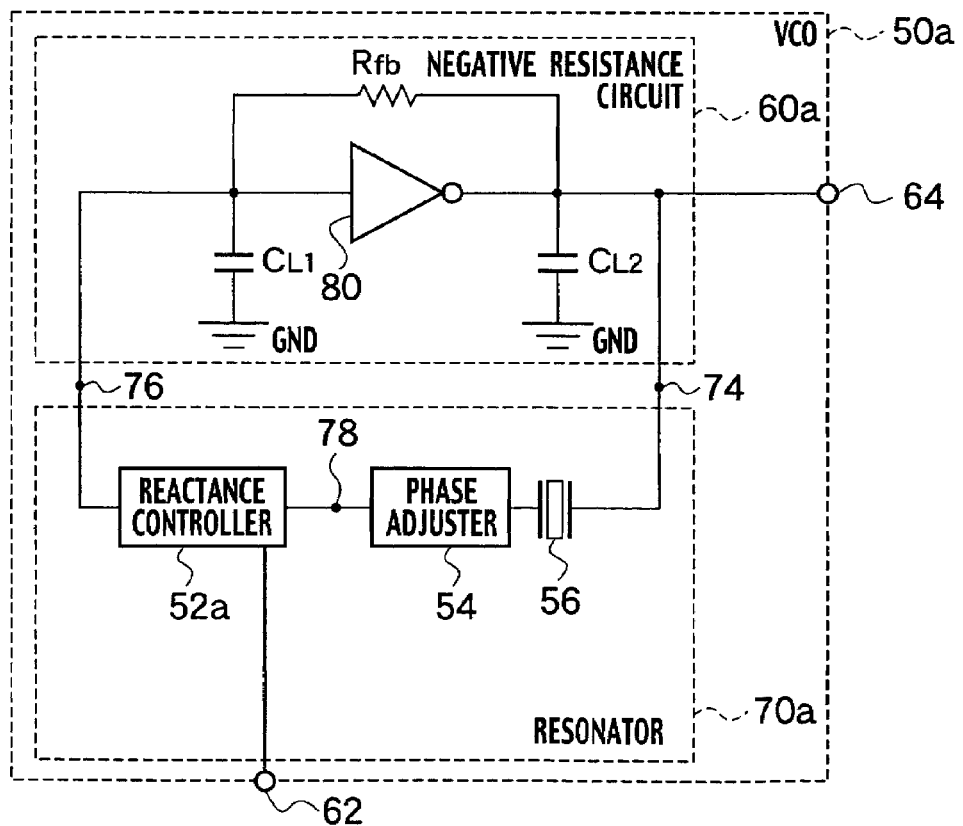
FIG. 24 is an example of a circuitry of a VCO according to a first modification of the first embodiment of the present invention.

As shown in FIG. 24, a VCO 50a according to a first modification of the first embodiment of the present invention includes a resonator 70a in which a reactance controller 52a, a phase adjuster 54 and an FBAR 56 are coupled, and a negative resistance circuit 60a connected to the resonator 70a.

The negative resistance circuit 60a includes a CMOS inverter 80, a feedback resistance $R_{fb}$ connected to an input and an output of the CMOS inverter 80, a load capacitance $C_{L1}$ connected to the input side of the CMOS inverter 80, and a load capacitance $C_{L2}$ connected to the output thereof. The load capacities $C_{L1}$ and $C_{L2}$ are grounded. The output of the CMOS inverter 80 is connected to the output node 64 of the VCO 50a.

The FBAR 56 in the resonator 70a is connected to a node 74 between the load capacity $C_{L2}$ on the output of the CMOS inverter 80 and the output node 64. The phase adjuster 54, connected to the FBAR 56, is connected to the reactance controller 52a with a node 78 interposed therebetween. The reactance controller 52a is connected to the input node 62 to which a control voltage for reactance control is applied. Moreover, the reactance controller 52a is connected to the input of the CMOS inverter 80, to which the feedback resistance $R_{fb}$ and the load capacity $C_{L1}$ are connected, with a node 76 interposed therebetween.

The VCO 50a according to the first modification of the first embodiment is different from the VCO according to the first embodiment in that the CMOS inverter 80 is used as the negative resistance circuit 60a. The other configurations are similar to the first embodiment. Therefore, redundant descriptions will be omitted.

Figure 25:
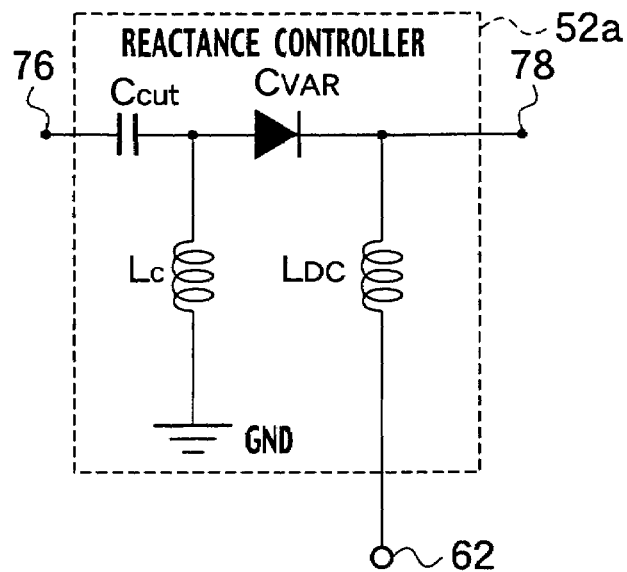
FIG. 25 is an example of a circuitry of a reactance controller of the VCO according to the first modification of the first embodiment of the present invention.

As shown in FIG. 25, in the reactance controller 52a in the resonator 70a, a variable capacitance $C_{VAR}$ such as a variable capacitance diode is used. An inductance $L_{DC}$ for removing high frequency components included in control voltage applied from the input node 62 is connected between the variable capacitance $C_{VAR}$ and the node 78. A DC cut capacitance $C_{CUT}$ is connected between the variable capacitance $C_{VAR}$ and the node 76. Moreover, a high frequency signal blocking inductance $L_C$, which is grounded, is connected between the variable capacitance $C_{VAR}$ and the DC cut capacitance $C_{CUT}$.

The DC cut capacitance $C_{CUT}$ and the high frequency signal blocking inductance $L_C$, both connected to the variable capacitance $C_{VAR}$, are unnecessary components in the resonator 70a. Therefore, in order not to affect the oscillation conditions of VCO 50a, the values of the DC cut capacitance $C_{CUT}$ and the high frequency signal blocking inductance $L_C$ are designed larger so that the DC cut capacitance $C_{CUT}$ and the high frequency signal blocking inductance $L_C$ can be ignored with respect to the reactance of the series connection of the FBAR 56, the phase adjuster 54 and the reactance controller 52a. For example, it is sufficient that the value of the DC cut capacitance $C_{CUT}$ is at least one order of magnitude greater than the value of the variable capacitance $C_{VAR}$, and that the high frequency signal blocking inductance $L_C$ is at least one order of magnitude greater than the inductance $L_{ADJ}$ in the phase adjuster 54.

Accordingly, a circuit equivalent to the resonator 70a may be substantially the same as that shown in FIG. 3, and therefore the complex impedance $Z_{RES}$ of the resonator 70a can be expressed similarly by the equation (8).

The CMOS inverter 80 in the negative resistance circuit 60a provides nonlinearity in the large amplitude steady state. Therefore, circuit parameters for the CMOS inverter 80 and the resonator 70a are determined by simulation. Thus, it is possible to determine the complex impedances $Z_{RES}$ and $Z_{NEG}$ of the resonator 70a and the negative resistance circuit 60a, respectively, which satisfy the oscillation start conditions at small signals represented by the expressions (9) and (10) and the steady oscillation condition represented by the equation (14).

As described above, according to the first modification of the first embodiment, it is possible to stably start oscillation by satisfying the inequality (13) immediately after turning on power to the VCO 50a and thereby allowing the initial oscillation angular frequency $\omega_{start}$ between the series resonance angular frequency $\omega_s$ and the parallel resonance angular frequency $\omega_p$ of the FBAR 56. In the steady state after the oscillation has started, it is possible to achieve the steady oscillation angular frequency $\omega_{osc}$ lower than the series resonance angular frequency $\omega_s$ by satisfying the inequality (15) utilizing the nonlinearity of the negative resistance circuit 60a. Thus, it is possible to increase the frequency tunability of the VCO 50a.

In addition, the CMOS inverter 80 in the negative resistance circuit 60a is desirable for integration and manufacturing in comparison with a bipolar transistor and therefore advantageous in reducing the size and costs of the VCO 50a. Further, the development of a high frequency CMOS analog circuit is in progress, and thus merged installation of a high frequency analog circuit and a digital circuit will be facilitated.

Second Modification of the First Embodiment

Figure 26:
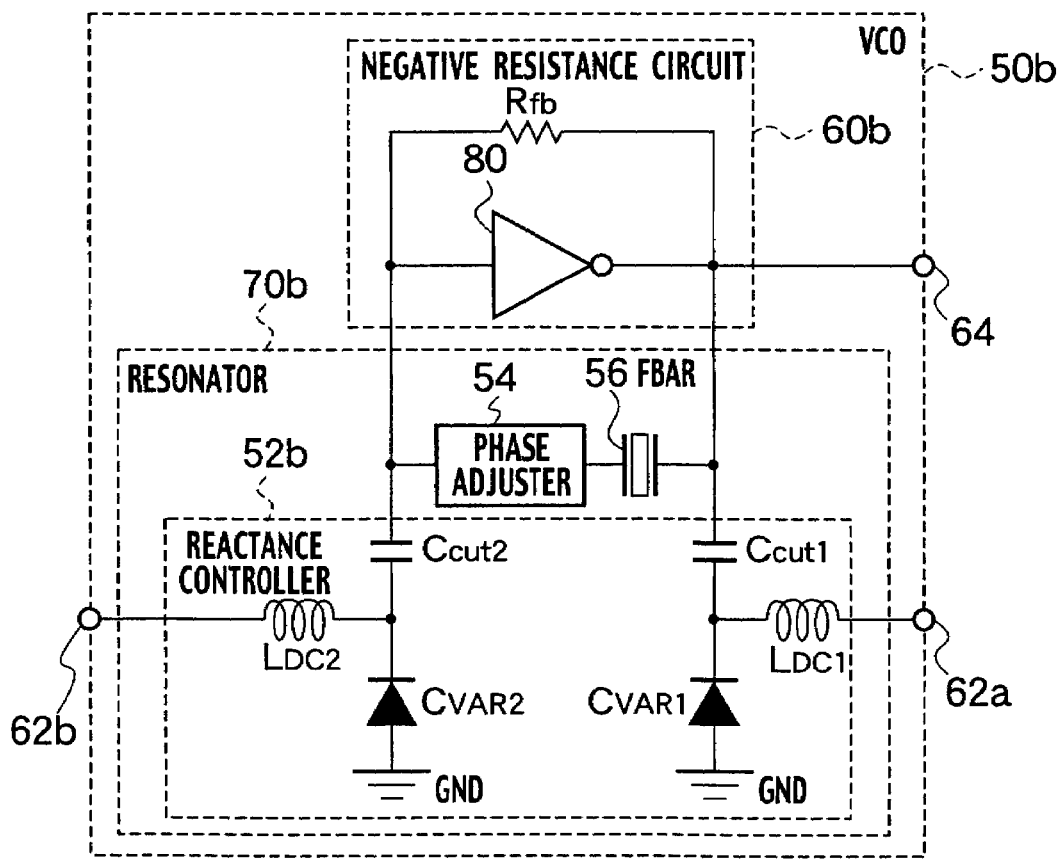
FIG. 26 is an example of a circuitry of a VCO according to a second modification of the first embodiment of the present invention.

As shown in FIG. 26, a VCO 50b according to a second modification of the first embodiment of the present invention includes a resonator 70b in which a reactance controller 52b, a phase adjuster 54 and an FBAR 56 are coupled, and a negative resistance circuit 60b connected to the resonator 70b.

The negative resistance circuit 60b includes a CMOS inverter 80 and a feedback resistance $R_{fb}$ connected to an input and an output of the CMOS inverter 80. The output of the CMOS inverter 80 is connected to an output node 64 of the VCO 50b.

The FBAR 56 in the resonator 70b is connected between the output of the CMOS inverter 80 and the output node 64. The phase adjuster 54, connected to the FBAR 56, is connected between the input of the CMOS inverter 80 and the feedback resistance $R_{fb}$. The reactance controller 52b includes first and second variable capacitances $C_{VAR1}$ and $C_{VAR2}$ which are variable capacitance diodes or the like. The first variable capacitance $C_{VAR1}$ is connected between the output of the CMOS inverter 80 and the output node 64 to the FBAR 56, with a DC cut capacitance $C_{CUT1}$ interposed therebetween. An input node 62a, to which control voltage for reactance control is applied and is connected between the first variable capacitance $C_{VAR1}$ and the DC cut capacitance $C_{CUT1}$, with an inductance $L_{DC1}$ removing a high frequency component interposed therebetween. Moreover, the second variable capacitance $C_{VAR2}$ is connected between the input of the CMOS inverter 80 and the feedback resistance $R_{fb}$ to the phase adjuster 54, with a DC cut capacitance $C_{CUT2}$ interposed therebetween. An input node 62b, to which control voltage for reactance control is applied, is connected between the second variable capacitance $C_{VAR2}$ and the DC cut capacitance $C_{CUT2}$, with an inductance $L_{DC2}$ removing a high frequency component interposed therebetween.

Although the first and second variable capacitances $C_{VAR1}$ and $C_{VAR2}$ of the reactance controller 52b are provided in the resonator 70b, the first and second variable capacitances $C_{VAR1}$ and $C_{VAR2}$ also serve as load capacitances of the CMOS inverter 80 in the negative resistance circuit 60b. Thus, the circuitry of the negative resistance circuit 60b can be simplified. Note that values of the DC cut capacitances $C_{CUT1}$ and $C_{CUT2}$ are at least one order of magnitude greater than the first and second variable capacitance $C_{VAR1}$ and $C_{VAR2}$, and therefore can be ignored as reactance.

The second modification of the first embodiment is different from the first modification of the first embodiment in that the first and second variable capacitances $C_{VAR1}$ and $C_{VAR2}$ are provided for the reactance controller 52b in the resonator 70b and also serve as the load capacitances of the CMOS inverter 80 in the negative resistance circuit 60b. The other configurations are substantially the same as the first modification of the first embodiment. Therefore, redundant descriptions will be omitted.

Unlike the complex impedances in the first embodiment and the first modification of the first embodiment, the complex impedance of the resonator 70b shown in FIG. 26 is expressed by a complicated expression. Therefore, for convenience, allowing the first and second variable capacitances $C_{VAR1}$ and $C_{VAR2}$ in the resonator 70b to be included in the negative resistance circuit 60b, complex impedances $Zb_{RES}$ and $Zb_{NEG}$ of the resonator 70b and the negative resistance circuit 60b, respectively, are expressed as follows.

$$Zb_{RES}=Z_{FBAR}+Z_{ADJ} \quad (21)$$

$$Zb_{NEG}=1/\{1/Z_{NEG}+1/(2*Z_{VAR})\}=Rb_{NEG}+j*Xb_{NEG} \quad (22)$$

Here, the complex impedance $Zb_{NEG}$ of the negative resistance circuit 60b is equivalent to a parallel connection of a component $Z_{NEG}$ attributable to the CMOS inverter 80 and a composite component of $(2*Z_{VAR})$ in a series connection of the first and second variable capacitances $C_{VAR1}$ and $C^{VAR2}$, which results in the complicated expression. However, by mathematically arranging the expression, the expression can be finally expressed using a resistance $Rb_{NEG}$ and a reactance $Xb_{NEG}$.

In such case, corresponding to the inequality (13), an expression to satisfy the oscillation start condition of the VCO 50b can be expressed as follows.

$$Xb_{NEG}(A_{small}, \omega_{osc})+X_{ADJ}(\omega_{osc})<0 \quad (23)$$

Moreover, corresponding to the expressions (14) and (15) expressions to satisfy the steady oscillation condition are expressed as follow.

$$Zb_{NEG}(A_{osc}, \omega_{osc})+Zb_{RES}(\omega_{osc})=0 \quad (24)$$

$$0<X_{ADJ}(\omega_s)+Xb_{NEG}(A_{osc}, \omega_s)<1/(\ 7_s*C_{F0}) \quad (25)$$

As described above, according to the second modification of the first embodiment, it is possible to stably start oscillation by satisfying the inequality (23) immediately after turning on power to the VCO 50b and thereby allowing the initial oscillation angular frequency $\omega_{start}$ between the series resonance angular frequency $\omega_s$ and the parallel resonance angular frequency $\omega_p$ of the FBAR 56. In the steady state after the oscillation has started, it is possible to allow the steady oscillation angular frequency $\omega_{osc}$ lower than the series resonance angular frequency by satisfying the inequality (25) utilizing the nonlinearity of the negative resistance circuit 60b. Thus, it is possible to increase the frequency tunability of the VCO 50b.

In addition, the CMOS inverter 80 in the negative resistance circuit 60b is desirable for integration and manufacturing in comparison with a bipolar transistor. Further, the CMOS inverter 80 is advantageous in reducing the size and cost of the VCO 50b. Furthermore, since the first and second variable capacitances $C_{VAR1}$ and $C_{VAR2}$ in the reactance controller 52b are used as the load capacities of the CMOS inverter 80, it is possible to simplify the circuitry of the negative resistance circuit 60b.

Second Embodiment

Figure 27:
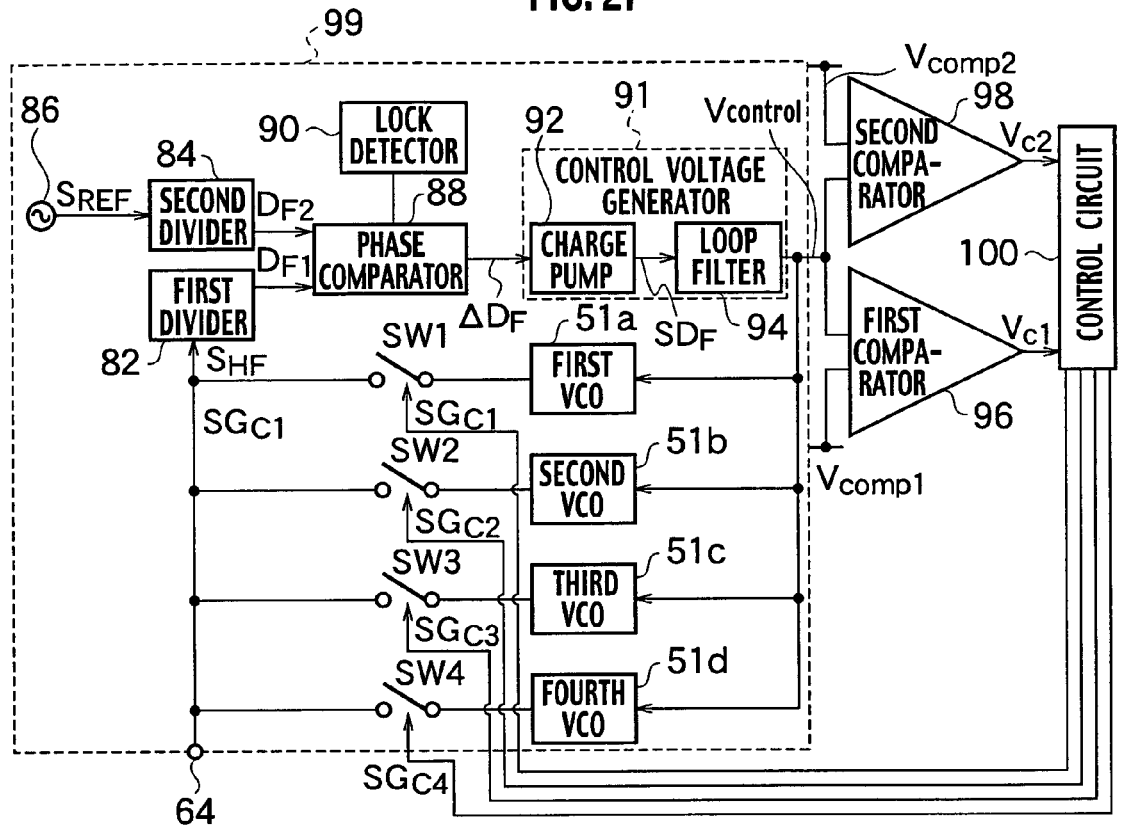
FIG. 27 is an example of a circuitry of a frequency synthesizer according to a second embodiment of the present invention.

As shown in FIG. 27, a frequency synthesizer according to a second embodiment of the present invention includes a PLL circuit 99 which generates a high frequency oscillation signal $S_{HF}$; first and second voltage comparators 96 and 98 which monitor a control voltage $V_{control}$ generated by the PLL circuit 99 so as to compare with first and second comparison potentials $V_{comp1}$ and $V_{comp2}$, respectively; and a control circuit 100 which generates any one of control signals $SG_{C1}$ to $SG_{C4}$ to the PLL circuit 99 based on an output signal $V_{C1}$ or $V_{C2}$ from the first or second voltage comparator 96 or 98.

The PLL circuit 99 includes first to fourth VCOs 51a to 51d having inputs connecting with each other, to which the control voltage $V_{control}$ for resonators in the respective VCOs is applied. The first to fourth VCOs 51a to 51d are connected to an output node 64 and to an input of a first frequency divider 82 via switches SW1 to SW4, respectively, which are connected to outputs of the respective VCOs. Outputs of the first frequency divider 82 and a second frequency divider 84 connected to a reference signal source 86 are connected to an input of a phase comparator 88. Moreover, a lock detector 90 is connected to the phase comparator 88. An input and an output of a control voltage generator 91 are respectively connected to the output of the phase comparator 88, and to the inputs of the first and second voltage comparators 96 and 98. The output of the control voltage generator 91 is also connected to the inputs of the first to fourth VCOs 51a to 51d. The control voltage generator 91 has a charge pump 92 on the input portion and a loop filter 94 on the output portion.

The first and second comparison potentials $V_{comp1}$ and $V_{comp2}$ are applied to the first and second voltage comparators 96 and 98, respectively, to which the output of the control voltage generator 91 is connected. Here, the first and second comparison potentials $V_{comp1}$ and $V_{comp2}$ correspond to the lower and upper limit potentials of the control voltage generated by the control voltage generator 91, respectively. The outputs of the first and second voltage comparators 96 and 98 are connected to the control circuit 100. Moreover, outputs of the control circuit 100 generating the control signals $SG_{C1}$ to $SG_{C4}$ are respectively connected to the switches SW1 to SW4 of the first to fourth VCOs 51a to 51d.

The first to fourth VCOs 51a to 51d are designed such that the respective oscillation frequencies are variable in different frequency bands from one another, using FBARs having different film thicknesses. A circuitry inside the first to fourth VCOs 51a to 51d is similar to that of the VCO 50 in the first embodiment. Therefore, redundant descriptions will be omitted.

Figure 28:
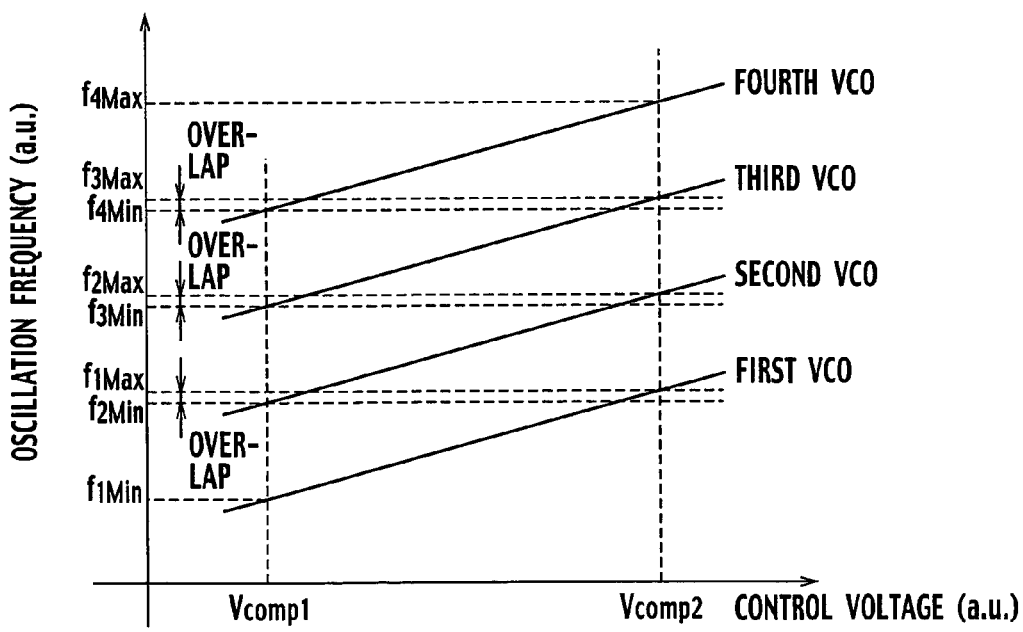
FIG. 28 is a schematic view showing an example of a relation between a control voltage and a oscillation frequency in VCOs having different frequency bands of the frequency synthesizer according to a second embodiment of the present invention.

As shown in FIG. 28, the first to fourth VCOs 51a to 51d have oscillation frequency bands different from one another and are controlled by the control voltage $V_{control}$ having a value between the first and second comparison potentials $V_{comp1}$ and $V_{comp2}$. The range of the lower limit to upper limit of the oscillation frequency bands for the first to fourth VCOs 51a to 51d are $f_{1Min}$ to $f_{1Max}$, $f_{2Min}$ to $f_{2Max}$, $f_{3Min}$ to $f_{3Max}$, and $f_{4Min}$ to $f_{4Max}$, respectively. The upper limit oscillation frequency $f_{1Max}$ of the first VCO 51a is set higher than the lower limit oscillation frequency $f_{2Min}$ of the second VCO 51b. The upper limit oscillation frequency $f_{2Max}$ of the second VCO 51b is set higher than the lower limit oscillation frequency $f_3$ Min of the third VCO 51c. The upper limit oscillation frequency $f_{3Max}$ of the third VCO 51c is set to be higher than the lower limit oscillation frequency $f_{4Min}$ of the fourth VCO 51d. Therefore, an overlap is provided between the oscillation frequency bands of the first and second VCOs 51a and 51b, between the oscillation frequency bands of the second and third VCOs 51b and 51c, and between the oscillation frequency bands of the third and fourth VCOs 51d and 51d. Accordingly, the first to fourth VCOs 51a to 51d collectively have a frequency band from the lower limit oscillation frequency $f_{1Min}$ of the first VCO 51a to the upper limit oscillation frequency $f_{4Max}$ of the fourth VCO 51d.

The first to fourth VCOs 51a to 51d are switched in order from the first VCO 51a to the fourth VCO 51d, or reversely in order from the fourth VCO 51d to the first VCO 51a, using the switches SW1 to SW4 which are switched by the control signals $SG_{C1}$ to $SG_{C4}$ from the control circuit 100 to be described later. Thus, it is possible for the frequency synthesizer to operate in a wide oscillation frequency band from $f_{1Min}$ to $f_{4Max}$.

The first frequency divider 82 in the PLL circuit 99 divides an oscillation signal $S_{HF}$ which is oscillated by the first to fourth VCOs 51a to 51d and selected using the switches SW1 to SW4. The second frequency divider 84 sets a dividing ratio based on frequency data provided by an external circuit (not shown) and divides a reference signal $S_{REF}$ from the reference signal source 86. For example, the oscillation signal $S_{HF}$ provided by one of the first to fourth VCOs 51a to 51d is in a GHz band. On the other hand, the reference signal $S_{REF}$ provided by the oscillation of, for example, a quartz oscillator or the like is in a band from approximately 5 MHz to 40 MHz. Particularly, a band from 16 MHz to 32 MHz is used for communication. Therefore, the dividing ratio used in the first frequency divider 82 is set to a magnitude of a single digit greater than that used in the second frequency divider 84. Moreover, the first frequency divider 82 is set such that the dividing ratio thereof is altered depending on the frequency data of the reference signal source 86 when the frequency data are altered.

The phase comparator 88 compares a phase of a divided oscillation signal $D_{F1}$, which is divided by the first frequency divider 82, with a phase of a divided reference signal $D_{F2}$, which is divided by the second frequency divider 84. The charge pump 92 in the control voltage generator 91 implements time integration for a phase error signal $\Delta D_F$ which is generated as a result of the comparison of the phases of the divided oscillation signal $D_{F1}$ and the divided reference signal $D_{F2}$ by the phase comparator 88. The charge pump 92 then generates a phase error integrated signal $S_{DF}$ having a magnitude corresponding to the phase error signal $\Delta DF$. The loop filter 94 in the control voltage generator 91 converts the phase error integrated signal $S_{DF}$ into a DC voltage and thus generates the control voltage $V_{control}$. The charge pump 92 and the loop filter 94 are designed based on a phase lock technology and enable the reference signal $S_{REF}$ and the oscillation signal $S_{HF}$ to synchronize with each other within a predetermined period of time. Based on the phase error signal $\Delta D_F$ from the phase comparator 88, the lock detector 90 detects whether the PLL circuit 99 is in an unlock condition or in a lock condition. When detecting the lock condition, the lock detector 90 locks the PLL circuit 99.

The first and second voltage comparators 96 and 98 have the first and second comparison potentials $V_{comp1}$ and $V_{comp2}$, respectively, which are lower and upper limit potentials, respectively. The first and second voltage comparators 96 and 98 monitor whether the control voltage $V_{control}$ is within a range between the first and second comparison potentials $V_{comp1}$ and $V_{comp2}$. Specifically, when the control voltage $V_{control}$ is lower than the first comparison potential $V_{comp1}$, the first voltage comparator 96 generates an output signal $VC_1$. When the control voltage $V_{control}$ is higher than the second comparison potential $V_{comp2}$, the second voltage comparator 98 generates an output signal $VC_2$.

The control circuit 100 generates any one of the control signals $SG_{C1}$ to $SG_{C4}$ in response to the output signal $VC_1$ or $VC_2$ from the first or second voltage comparator 96 or 98, so as to turn on any one of the switches SW1 to SW4. When neither of the output signals $VC_1$ nor $VC_2$ is received, the control circuit 100 retains any one of the control signals $SG_{C1}$ to $SG_{C4}$ which is last generated.

Next, a description will be given of the operation of the frequency synthesizer according to the second embodiment. When turning on power, the control circuit 100 generates as an initial value, for example, a control signal $SG_{C1}$ to select the first VCO 51a. The control signal $SG_{C1}$ turns on the switch SW1. The other control signals $SG_{C2}$ to $SG_{C4}$ are not provided, and therefore the switches SW2 to SW4 are off. Accordingly, the oscillation signal $S_{HF}$ having the oscillation frequency of the first VCO 51a is divided by the first frequency divider 82, and a divided oscillation signal $D_{F1}$ is sent to the phase comparator 88.

The reference signal $S_{REF}$ is divided by the second frequency divider 84, and the divided reference signal $D_{F2}$ is added to the phase comparator 88.

In the phase comparator 88, the phases of the divided oscillation signal $D_{F1}$ and the divided reference signal $D_{F2}$ are compared with each other. When the oscillation frequency of the first VCO 51a is higher than a desired frequency, the phase error signal $\Delta D_F$ is generated in the phase comparator 88. The phase error signal $\Delta D_F$ is added to the charge pump 92 in the control voltage generator 91 and then implemented time integration. A phase error integrated signal $SD_F$ provided by the time integration is smoothed by the loop filter 94, and the control voltage $V_{control}$ is thus provided. The control voltage $V_{control}$ is sent to the first and second voltage comparators 96 and 98 and then compared with the first and second comparison potentials $V_{comp1}$ and $V_{comp2}$, respectively.

For example, it is assumed that a signal which allows a desired oscillation signal $S_{HF}$ provided within the oscillation frequency band of the third VCO 51c is provided from an external circuit to the first frequency divider 82. In such case, the control voltage $V_{control}$ provided from the control voltage generator 91 is so high as to exceed the second comparison potential $V_{comp2}$, which is the upper limit potential. Accordingly, the second voltage comparator 98 sends the output signal $VC_2$ to the control circuit 100 so as to provide an instruction to switch to the second VCO 51b having the higher oscillation frequency band.

The control circuit 100 stores the fact that the first VCO 51a has been selected. When the output signal $VC_2$ is sent from the second voltage comparator 98, the control circuit 100 generates the control signal $SG_{C2}$ to turn on the switch SW2 in order to switch to the higher frequency band. Control signals $SG_{C1}$, $SG_{C3}$ and $SG_{C4}$ are not provided, and the switches SW1, SW3 and SW4 are turned or remain off.

The oscillation signal $S_{HF}$ having the oscillation frequency of the second VCO 51b is processed by the above-described PLL circuit 99, and the control voltage $V_{control}$ is re-generated. The control voltage $V_{control}$ is sent into the first and second voltage comparators 96 and 98 and then compared with the first and second comparison potentials $V_{comp1}$ and $V_{comp2}$. However, the control voltage $V_{control}$ is still higher than the second comparison potential $V_{comp2}$, which is the upper limit potential, and therefore the output signal $VC_2$ providing the instruction to switch to the third VCO 51c having the higher oscillation frequency band is sent from the second voltage comparator 98 to the control circuit 100. The control circuit 100 generates the control signal $SG_{C3}$ instead of the control signal $SG_{C2}$ and thereby turns on the switch SW3.

The oscillation signal $S_{HF}$ having the oscillation frequency of the third VCO 51c is similarly processed by the above-described PLL circuit 99. Since the oscillation signal $S_{HF}$ from the third VCO 51c is in the desired frequency band, a phase difference between the divided oscillation signal $D_{F1}$ and the divided reference signal $D_{F2}$ is small. Therefore, the small phase error signal $\Delta D_F$ is generated by the phase comparator 88. Then, the control voltage $V_{control}$ newly smoothed by the charge pump 92 and loop filter 94 in the control voltage generator 91 is within a voltage range between the first and second comparison potentials $V_{comp1}$ and $V_{comp2}$. Accordingly, the output signals $VC_1$, and $VC_2$ are not generated by the first and second voltage comparators 96 and 98. As a result, the control circuit 100 holds the switch SW3 in an on-state.

Subsequently, in the phase comparator 88, the phases of the divided oscillation signal $D_{F1}$ and the divided reference signal $D_{F2}$ are compared with each other, and the phase error signal $\Delta D_F$ is generated. When no phase difference exist between the divided oscillation signal $D_{F1}$ and the divided reference signal $D_{F2}$ as a result of the feedback control by the PLL circuit 99, the lock detector 90 operates to lock the PLL circuit 99. Once the PLL circuit 99 is locked, the control circuit 100 stops the operation of switching the VCOs 51a to 51d thereafter and holds the locked state even if the unlock condition is temporarily detected due to a disturbance. More specifically, as long as the unlock condition is not continuously detected for a predetermined period of time by the lock detector 90, the oscillation signal $S_{HF}$ from the currently selected third VCO 51c is provided from the output node 64.

Next, it is assumed that frequency alteration data are provided to the PLL circuit 99 from the reference signal source 86 to oscillate in a different frequency band. In such case, since the VCOs 51a to 51d having a suitable frequency band are not selected, the phases of a divided oscillation signal $D_{F1}$ and the divided reference signal $D_{F2}$ are compared with each other by the phase comparator 88, and the phase error signal $\Delta D_F$ is detected by the lock detector 90. Since the phase error signal $\Delta D_F$ is not temporarily detected due to a disturbance, the phase error signal $\Delta D_F$ is continuously detected over the predetermined period of time. In such case, the PLL circuit 99 is unlocked by the lock detector 90. The control circuit 100 is reset similarly when turning on power, and a control signal $SG_{C1}$, which is generated in the initial condition, is provided. The control signal $SG_{C1}$ turns on the switch SW1 to again select the first VCO 51a and controls the other switches SW2 to SW4 to be off. In such way, another search for a suitable VCO having a desired frequency band is performed again.

Note that, when the frequency alteration data is sent from the reference signal source 86 to the PLL circuit 99 to oscillate in a different frequency band, it is possible to achieve an operation similar to the foregoing with a circuitry which resets the control circuit 100 to the initial condition by using a frequency alteration signal of the frequency alteration data.

In the frequency synthesizer according to the second embodiment of the present invention, a plurality of VCOs having different frequency bands can be used for switching the VCOs. Therefore, it is possible to provide a frequency synthesizer which has a small phase noise and a wide variable frequency range.

First Modification of the Second Embodiment

Figure 29:
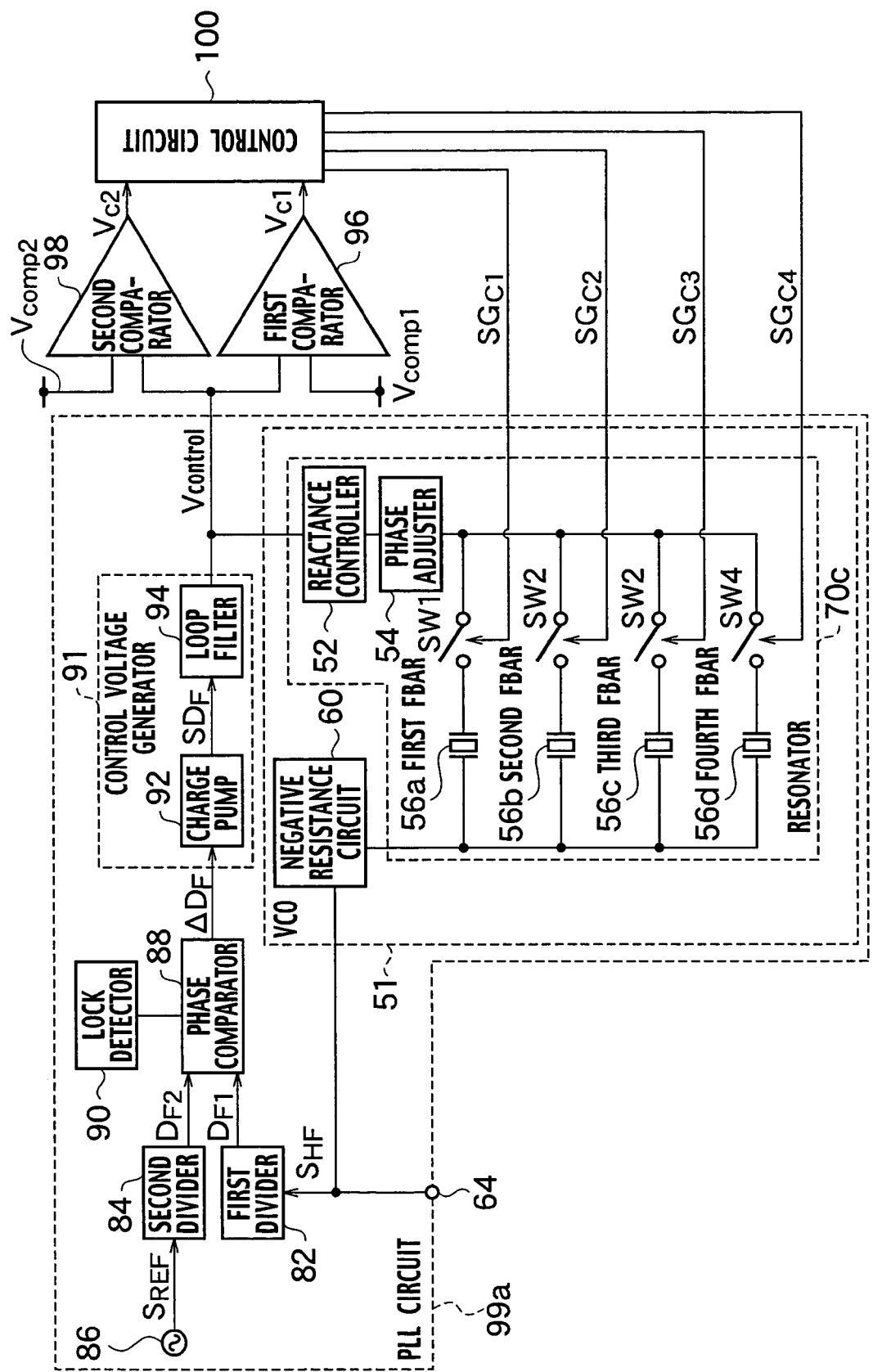
FIG. 29 is an example of a circuitry of a frequency synthesizer according to a first modification of the second embodiment of the present invention.

As shown in FIG. 29, a frequency synthesizer according to a first modification of the second embodiment of the present invention includes a PLL circuit 99a which generates a high frequency oscillation signal $S_{HF}$; first and second voltage comparators 96 and 98 which monitor a control voltage $V_{control}$ generated by the PLL circuit 99a by comparing with first and second comparison potentials $V_{comp1}$ and $V_{comp2}$, respectively; and a control circuit 100 which generates any one of control signals $SG_{C1}$ to $SG_{C4}$ to a VCO 51, based on an output signal $V_{C1}$ or $V_{C2}$ from the first or second voltage comparator 96 or 98.

In the second embodiment, as shown in FIG. 27, the first to fourth VCOs 51a to 51d are used in the PLL circuit 99. The first modification of the second embodiment is different from the second embodiment in that a single VCO 51 including first to fourth FBARs 56a to 56d is used in the PLL circuit 99a. The other configurations are similar to each other. Therefore, redundant descriptions will be omitted.

The VCO 51 includes a resonator 70c connected to an output of a control voltage generator 91; and a negative resistance circuit 60 having an input connected to the resonator 70c, and an output connected between an input of a first frequency divider 82 and an output node 64. In the resonator 70c, a phase adjuster 54 is connected in series to a reactance controller 52 to which the control voltage $V_{control}$ is sent, and is connected to a plurality of switches SW1 to SW4 connected in parallel to one another. The switches SW1 to SW4 are connected to first to fourth FBARs 56a to 56d, respectively, and output ends of the first to fourth FBARs 56a to 56d are connected to the input of the negative resistance circuit 60. Outputs of the control circuit 100 generating the control signals $SG_{C1}$ to $SG_{C4}$ are respectively connected to the switches SW1 to SW4 for the first to fourth FBARs 56a to 56d.

Figure 30:
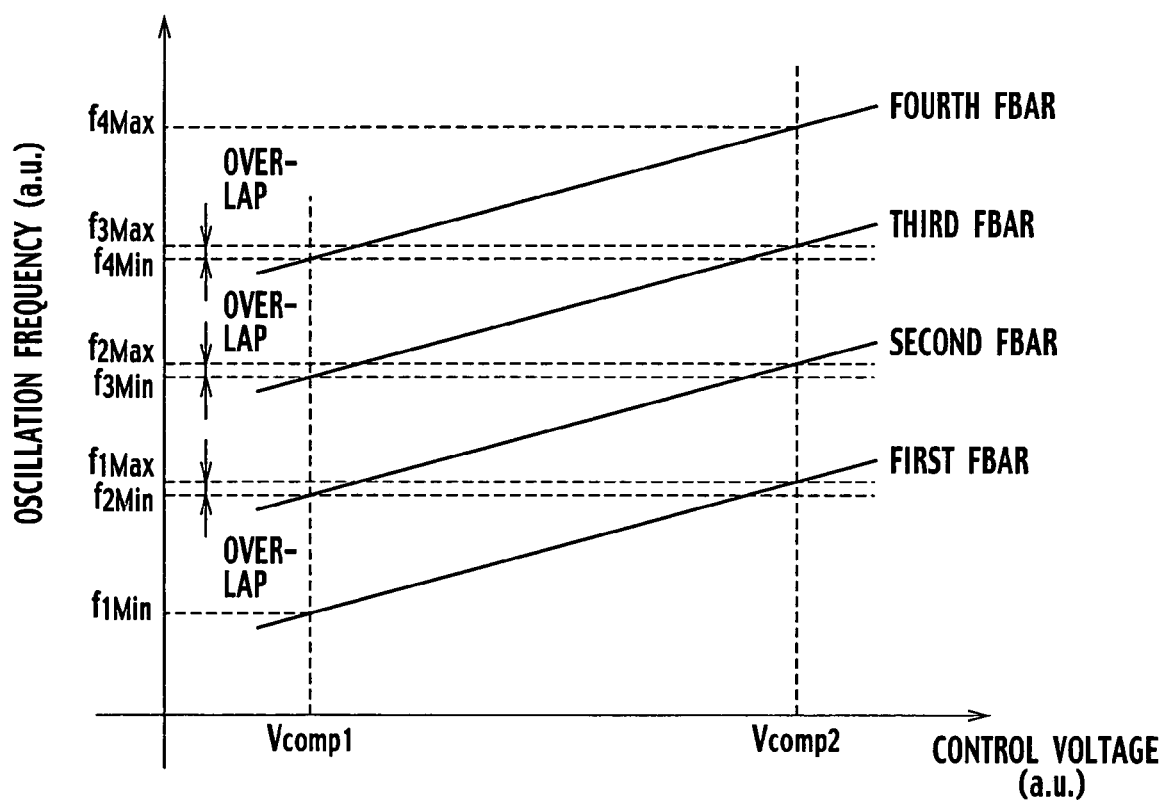
FIG. 30 is a schematic view showing an example of a relation between a control voltage and a oscillation frequency in VCOs by use of FBARs having different frequency bands of the frequency synthesizer according to the first modification of the second embodiment of the present invention.

Using FBARs having different film thicknesses, the first to fourth FBARs 56a to 56d are designed such that the respective oscillation frequencies are variable in frequency bands different from one another. As shown in FIG. 30, in the VCO 51, any one of the first to fourth FBARs 56a to 56d is incorporated by means of the switches SW1 to SW4. The VCO 51 has oscillation frequency bands different from one another, depending on the incorporated FBAR, controlled by the control voltage $V_{control}$ having a value between the first and second comparison potentials $V_{comp1}$ and $V_{comp2}$. The range of the lower limit to upper limit of the oscillation frequency bands for the first to fourth VCOs 51a to 51d are $f_{1Min}$ to $f_{1Max}$, $f_{2Min}$ to $f_{2Max}$, $f_{3Min}$ to $f_{3Max}$, and $f_{4Min}$ to $f_{4Max}$, respectively. The upper limit oscillation frequency $f_{1Max}$ of the VCO 51 incorporating the first FBAR 56a is set higher than the lower limit oscillation frequency $f_{2Min}$ of the VCO 51 incorporating the second FBAR 56b. The upper limit oscillation frequency $f_{2Max}$ of the VCO 51 incorporating the second FBAR 56b is set higher than the lower limit oscillation frequency $f_{3Min}$ of the VCO 51 incorporating the third FBAR 56c. The higher limit oscillation frequency $f_{3Max}$ of the VCO 51 incorporating the third FBAR 56c is set higher than the lower limit oscillation frequency $f_{4Min}$ of the VCO 51 incorporating the fourth FBAR 56d. Therefore, an overlap is provided between the oscillation frequency bands provided by the first and second FBARs 56a and 56b, between the oscillation frequency bands provided by the second and third FBARs 56b and 56c, and between the oscillation frequency bands provided by the third and fourth FBARs 56c and 56d. Accordingly, the VCO 51 incorporating the first to fourth FBAR 56a to 56d has a frequency band from the lower limit oscillation frequency $f_{1Min}$ provided by the first FBAR 56a to the upper limit oscillation frequency $f_{4Max}$ provided by the fourth FBAR 56d.

Moreover, the first to fourth FBARs 56a to 56d are switched in order from the first FBAR 56a to the fourth FBAR 56d, or reversely in order from the fourth FBAR 56d to the first FBAR 56a, using the switches SW1 to SW4 which are switched by the control signals $SG_{C1}$ to $SG_{C4}$ from the control circuit 100. Thus, it is possible for the frequency synthesizer to operate in the wide oscillation frequency band from $f_{1Min}$ to $f_{4Max}$.

In the above description, FBARs having different film thicknesses are used as the first to fourth FBARs 56a to 56d. However, similar effects may be provided by using FBARs having different electrode areas.

As described above, according to the first modification of the second embodiment, since the single VCO 51 is used, it is possible to reduce the size and cost of resonator circuitry. In addition, low power consumption operation can be achieved. Moreover, the VCO 51 may be operated by switching the first to fourth FBARs 56a to 56d having different resonance frequencies by the control circuit 100 sending the control signals $SG_{C1}$ to $SG_{C4}$ to the switches SW1 to SW4. Thus, it is possible to provide a frequency synthesizer which has a small phase noise and a wide frequency tunability.

Second Modification of the Second Embodiment

Figure 31:
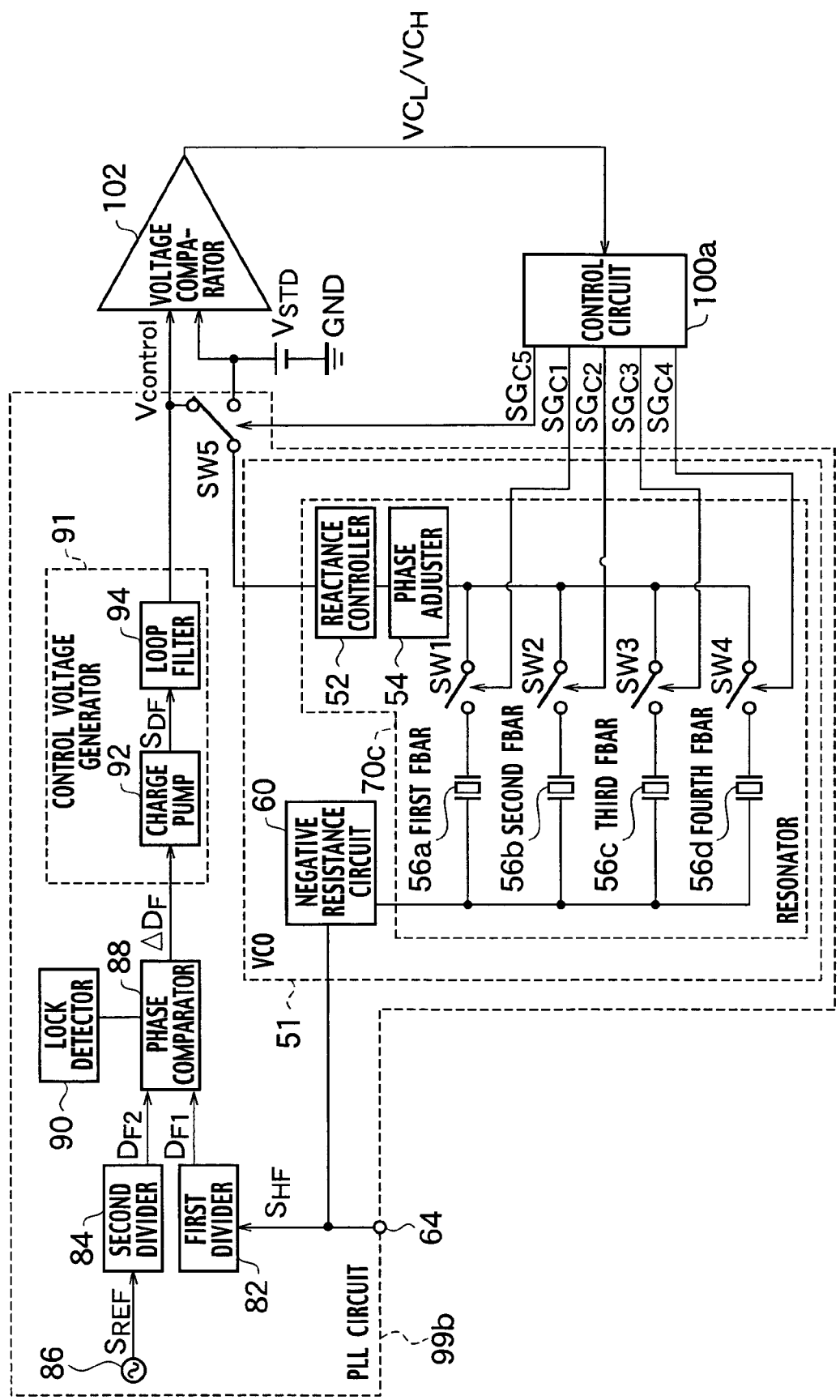
FIG. 31 is an example of a circuitry of a frequency synthesizer according to a second modification of the second embodiment of the present invention.

As shown in FIG. 31, a frequency synthesizer according to a second modification of the second embodiment of the present invention includes a PLL circuit 99b which generates a high frequency oscillation signal $S_{HF}$; a voltage comparator 102 which monitors a control voltage $V_{control}$ generated by the PLL circuit 99b so as to compare with a standard potential $V_{STD}$; and a control circuit 100a which generates any one of control signals $SG_{C1}$ to $SG_{C5}$ to a VCO 51, based on an output signal $VC_L$ or $VC_H$ from the voltage comparator 102.

The second modification of the second embodiment of the present invention is different from the first modification of the second embodiment in that a switch SW5 for switching the control voltage $V_{control}$, connected to an input of the VCO 51 in the PLL circuit 99b, is used. The switch SW5 switches between an output of a control voltage generator 91 and a standard potential $V_{STD}$ of the voltage comparator 102 by a control signal $SG_{C5}$ which is provided from the control circuit 100a based on the output signals $VC_H$ and $VC_L$ from the voltage comparator 102. The other configurations are similar to the first modification of the second embodiment. Therefore, redundant descriptions will be omitted.

In an initial condition, the switch SW5 connected to the input of the VCO 51, is connected to the standard potential $V_{STD}$. The standard potential $V_{STD}$ for the voltage comparator 102 is set to the upper limit of the control voltage $V_{control}$ for the reactance controller 52 in the resonator 70c. The voltage comparator 102 compares the control voltage $V_{control}$ with the standard potential $V_{STD}$. The voltage comparator 102 sends the output signal $VC_H$ to the control circuit 100a when the control voltage $V_{control}$ is higher than the standard potential $V_{STD}$ and sends the output signal $VC_L$ when the control voltage $V_{control}$ is lower than the standard potential $V_{STD}$.

The control circuit 100a sends any one of the control signals $SG_{C1}$ to $SG_{C4}$ to the switches SW1 to SW4 for switching the first to fourth FBARs 56a to 56d in the resonator 70c depending on the output signal $VC_H$ or $VC_L$ from the voltage comparator 102, in accordance with a predetermined algorithm. Moreover, when the voltage comparator 102 sends the output signal $VC_L$, the control circuit 100a switches the switch SW5 from the standard potential $V_{STD}$ of the initial condition, to the output of the control voltage generator 91. Therefore, when the oscillation signal $S_{HF}$ from the VCO 51 is set in a desired frequency band, a feedback loop of the PLL circuit 99b is established. The feedback control by the PLL circuit 99b eliminates a phase difference between a divided oscillation signal $D_{F1}$ and a divided reference signal $D_{F2}$. Accordingly, the PLL circuit 99b is locked.

Next, a description will be given of the operation of the frequency synthesizer according to the second modification of the second embodiment. The control circuit 100a in the frequency synthesizer uses the algorithm shown in FIG. 32 in order to search an FBAR having a desired frequency band among the first to fourth FBARs 56a to 56d using the voltage comparator 102. In the second modification of the second embodiment, searching is implemented in accordance with the algorithm shown in FIG. 32, initially using the second FBAR 56b having an intermediate frequency band. Here, for example, it is assumed that the reference signal source 86 sends such frequency data as to lock a phase in a frequency band including an oscillation signal $S_{HF}$ of a desired high frequency when the fourth FBAR 56d is connected.

When turning on power of the frequency synthesizer, the control circuit 10a is reset, and a control signal $SG_{C2}$ to select the second FBAR 56b as an initial value is generated to turn on only the switch SW2. The switch SW5 is connected to the standard potential $V_{STD}$, and the standard potential $V_{STD}$ is provided to the reactance controller 52 of the resonator 70c in the VCO 51 shown in FIG. 31. The loop of the PLL circuit 99b is opened. The standard potential $V_{STD}$ is set beforehand to the upper limit of the control voltage $V_{control}$. Accordingly, the VCO 51 oscillates at a frequency determined by the resonance characteristics of the second FBAR 56b depending on the standard potential $V_{STD}$. The oscillation signal $S_{HF}$ is divided by the first frequency divider 82, and the generated divided oscillation signal $D_{F1}$ is sent to the phase comparator 88. The divided reference signal $D_{F2}$ provided by the second frequency divider 84 dividing the reference signal $S_{REF}$ is also added to the phase comparator 88.

In the phase comparator 88, a phase error signal $\Delta D_F$ is generated. The phase error signal $\Delta D_F$ is added to the charge pump 92 in the control voltage generator 91 to implement time integration. A phase error integrated signal $SD_F$ provided by the time integration is smoothed by the loop filter 94, and thus the control voltage $V_{control}$ is generated. Since the oscillation frequency using the second FBAR 56b is lower than the desired frequency, the control voltage $V_{control}$ is higher than the standard potential $V_{STD}$ for the voltage comparator 102. Accordingly, the output signal $VC_H$ is sent from the voltage comparator 102 to the control circuit 100a.

Figure 32:
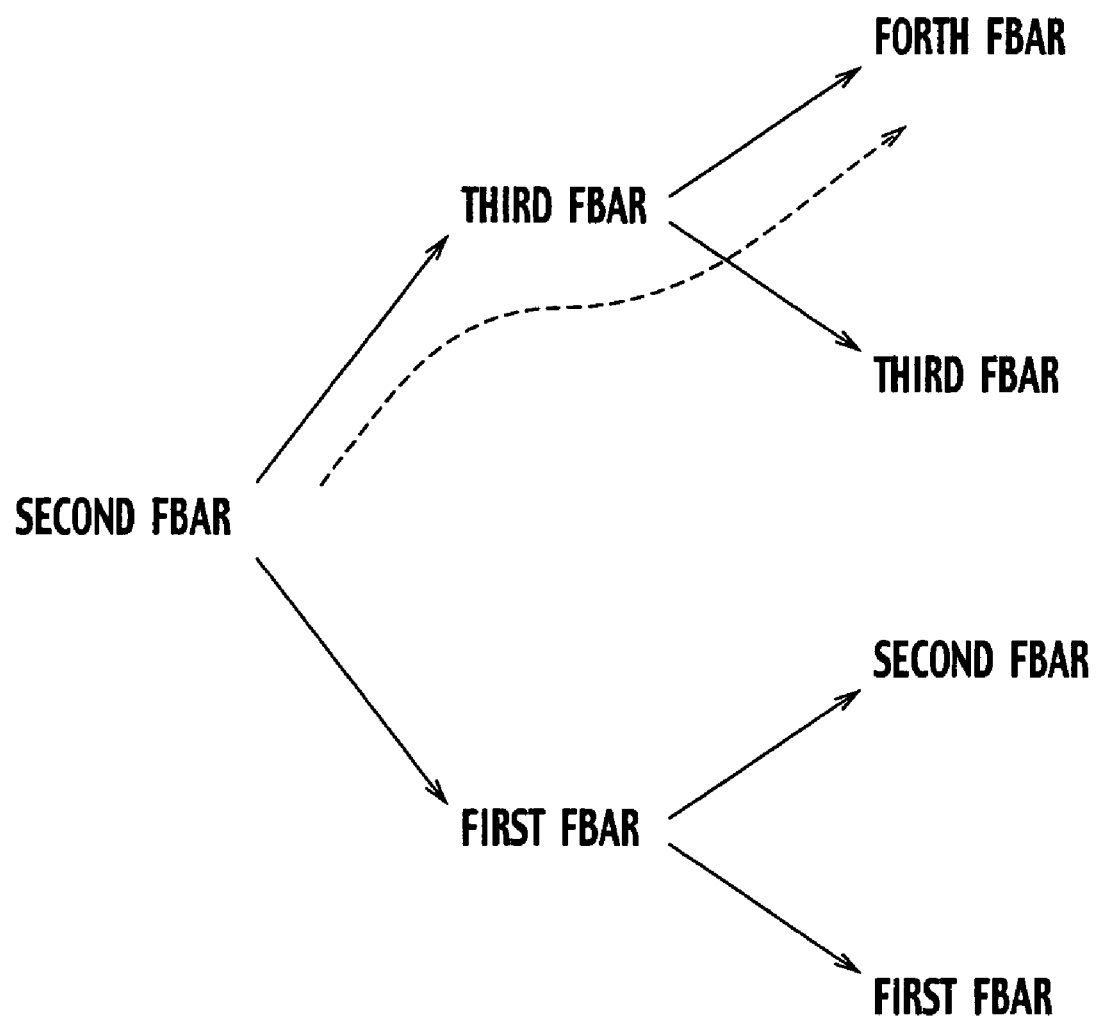
FIG. 32 is a schematic view of an example of an algorithm for searching the FBAR having a desired frequency band in the frequency synthesizer according to a second modification of the second embodiment of the present invention.

In accordance with the algorithm shown in FIG. 32, the control circuit 100a sends, to the switch SW3, the control signal $SG_{C3}$ to switch from the currently selected second FBAR 56b to the third FBAR 56c having a higher frequency band. Moreover, the control circuit 100a holds the switch SW5 in connection with the standard potential $V_{STD}$.

Since the oscillation frequency of the oscillation signal $SH_F$ generated by using the third FBAR 56c is lower than the desired frequency, the generated control voltage $V_{control}$ is higher than the standard potential $V_{STD}$. Accordingly, the output signal $VC_H$ is sent from the voltage comparator 102 to the control circuit 100a. In accordance with the algorithm shown in FIG. 32, the control circuit 100a sends, to the switch SW4, the control signal $SG_{C4}$ to switch from the currently selected third FBAR 56c to the fourth FBAR 56d having a higher frequency band. Moreover, the control circuit 100a holds the switch SW5 in connection with the standard potential $V_{STD}$.

The oscillation frequency of the oscillation signal $SH_F$ generated by using the fourth FBAR 56d is close to the desired frequency. Then, the generated control voltage $V_{control}$ is lower than the standard potential $V_{STD}$. Accordingly, the output signal $VC_L$ is sent from the voltage comparator 102 to the control circuit 100a. Therefore, the control circuit 100a holds the switch SW4 in an on-state. At the same time, the control circuit 100a turns the switch SW5 from the connection to the standard potential $V_{STD}$ to the connection to the output of the control voltage generator 91. As a result, the control voltage $V_{control}$ provided from the loop filter 94 is applied to the resonator 70c in the VCO 51, and thus the feedback loop of the PLL circuit 99b is established. The feedback control by the PLL circuit 99b eliminates a phase difference between the divided oscillation signal $D_{F1}$ and the divided reference signal $D_{F2}$. Accordingly, the PLL circuit 99b is locked. Thus, the search for the FBAR having a frequency band including a frequency of the reference signal $S_{REF}$ from the reference signal source 86 is implemented following a path indicated by the dashed line in FIG. 32.

As described above, according to the second modification of the second embodiment, since the single VCO 51 is used, it is possible to reduce the size and cost of a resonator circuit. In addition, low power consumption operation can be achieved. Moreover, since the single voltage comparator 102 is used to monitor the control voltage $V_{control}$ so as to compare with the standard potential $V_{STD}$, it is possible to simplify the circuitry. Furthermore, the VCO 51 may be operated by switching the first to fourth FBARs 56a to 56d having different resonance frequencies by the control circuit 100 sending the control signals $SG_{C1}$ to $SG_{C4}$ to the switches SW1 to SW4 for switching the FBARs. Thus, it is possible to provide a frequency synthesizer which has a small phase noise and a wide frequency tunability.

Third Modification of the Second Embodiment

Figure 33:
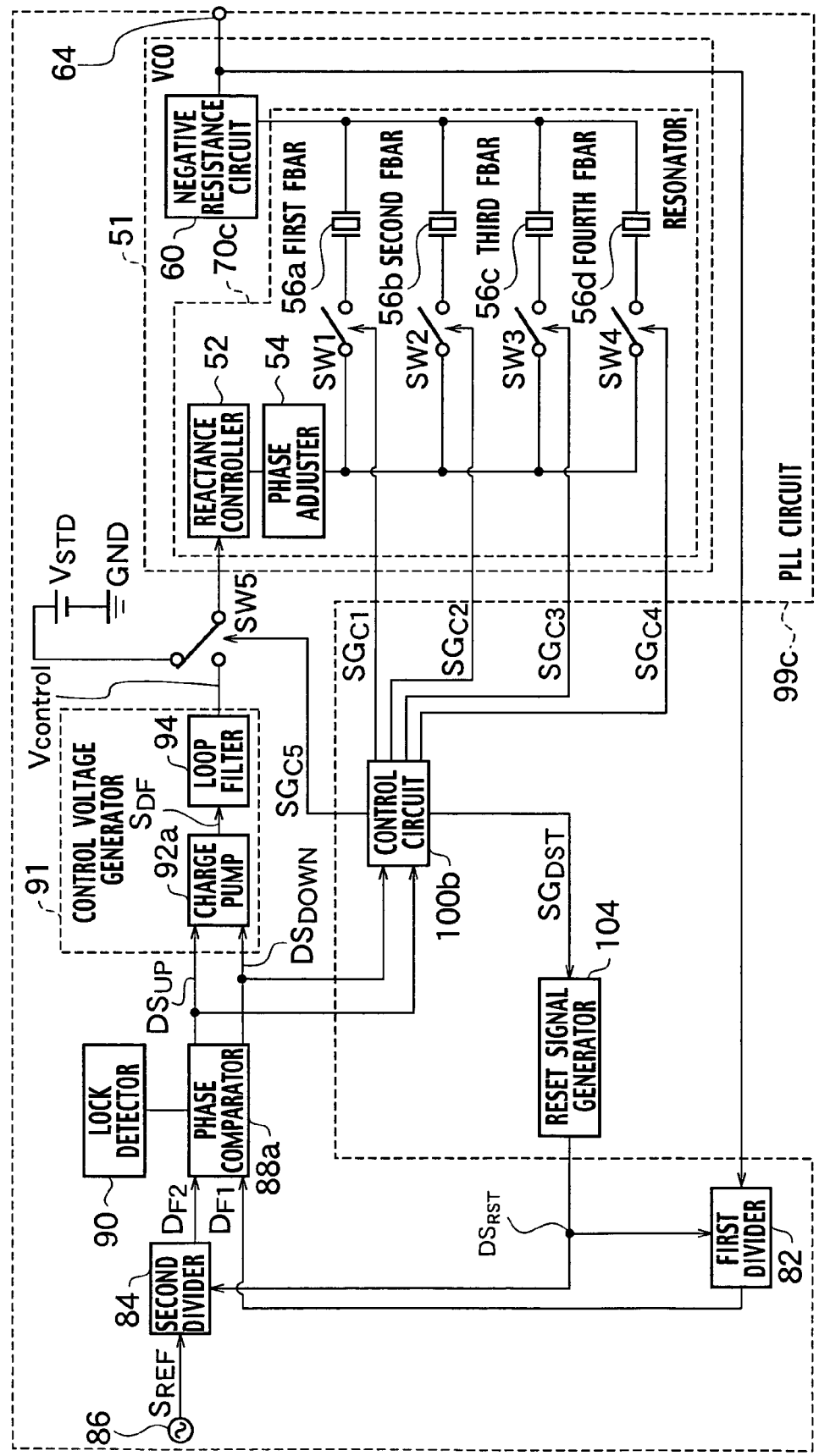
FIG. 33 is an example of a circuitry of a frequency synthesizer according to a third modification of the second embodiment of the present invention.

As shown in FIG. 33, a frequency synthesizer according to a third modification of the second embodiment of the present invention includes: a PLL circuit 99c which generates a high frequency oscillation signal $S_{HF}$; a control circuit 100b which sends any one of control signals $SG_{C1}$ to $SG_{C5}$ to the PLL circuit 99c, based on an output signal corresponding to a phase difference generated by a phase comparator 88a in the PLL circuit 99c; and a reset signal generator 104 which sends a dividing reset signal $DS_{RST}$ to first and second frequency dividers 82 and 84, triggered by a reset command signal $SG_{RST}$ from the control circuit 100b.

The third modification of the second embodiment is different from the second modification of the second embodiment in that the control circuit 100b sends any one of the control signals $SG_{C1}$ to $SG_{C4}$ to the switches SW1 to SW4 for switching the first to fourth FBARs 56a to 56d provided in the VCO 51, based on an up signal $DS_{UP}$ or a down signal $DS_{DOWN}$ according to a phase difference between a divided oscillation signal $D_{F1}$ and a divided reference signal $D_{F2}$ from the phase comparator 88a in the PLL circuit 99c. The other configurations are similar to the second modification of the second embodiment. Therefore, redundant descriptions will be omitted.

Figure 34:
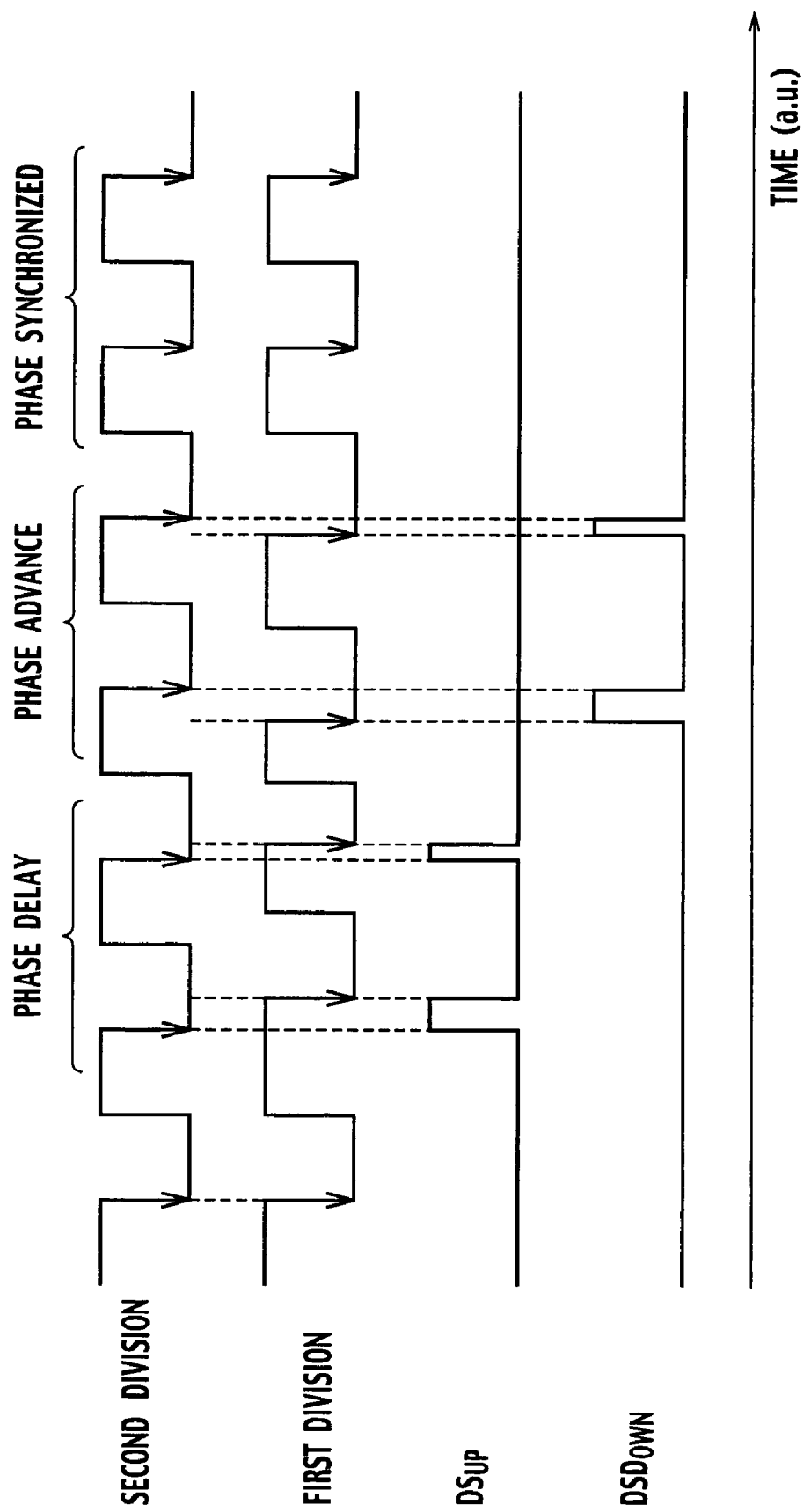
FIG. 34 is a schematic view of an example of a timing chart for up and down signals of a phase comparator in the frequency synthesizer according to the third modification of the second embodiment of the present invention.

The operation of the phase comparator 88a will be described using a timing chart shown in FIG. 34. The phase comparator 88a generates the up signal $DS_{UP}$ or down signal $DS_{DOWN}$ depending on a phase difference between the falling edges of the divided oscillation signal $D_{F1}$ sent from the first frequency divider 82, and the divided reference signal $D_{F2}$ sent from the second frequency divider 84. When the phase of the divided oscillation signal $D_{F1}$ is delayed with respect to that of the divided reference signal $D_{F2}$, the phase comparator 88a generates the up signal $DS_{UP}$, so as to electrically charge the loop filter 94 through a charge pump 92a in a control voltage generator 91. As a result, the control voltage $V_{control}$ is higher, so as to make the oscillation frequency of the VCO 51 higher. Contrary, when the phase of the divided oscillation signal $D_{F1}$ is advanced with respect to the divided reference signal $D_{F2}$, the phase comparator 88a generates the down signal $DS_{DOWN}$, so as to discharge the loop filter 94 through the charge pump 92a. As a result, the control voltage $V_{control}$ is lower, so as to decrease the oscillation frequency of the VCO 51. The PLL circuit 99c in the frequency synthesizer has a feedback loop and detects a phase lock when the phases of the divided oscillation signal $D_{F1}$ and the divided reference signal $D_{F2}$ finally agree. Thus, the output frequency of the VCO 51 is stabilized. A process for altering the dividing ratio of the first frequency divider 82 in order to alter the frequency of the oscillation signal $S_{HF}$ of the VCO 51, until locking the phase is called a "pull-in" process, and a period of time required for the pull-in process is called a "lock up time".

In addition, when the control circuit 100b switches the first to fourth FBARs 56a to 56d by generating any one of the control signals $SG_{C1}$ to $SG_{C4}$, the reset signal generator 104 generates the reset signal $DS_{RST}$ so as to simultaneously reset the first and second frequency dividers 82 and 84. Furthermore, the switch SW5 connects an input of the resonator 70c in the VCO 51 with any one of the standard potential $V_{STD}$ and the control voltage $V_{control}$ which is the output of the control voltage generator 91, based on the control voltage control signal $SG_{C5}$ from the control circuit 100b. Note that the standard potential $V_{STD}$ is set to the upper limit of the control voltage $V_{control}$.

Next, a description will be given of the operation of the frequency synthesizer according to the third modification of the second embodiment. The control circuit 100b in the frequency synthesizer uses the algorithm shown in FIG. 32, discussed in the second modification of the second embodiment, in order to search for an FBAR having a desired frequency band among the first to fourth FBARs 56a to 56d using the up and down signals $DS_{UP}$ and $DS_{DOWN}$ from the phase comparator 88a. Here, it is assumed that the reference signal source 86 sends the reference signal $S_{REF}$ of such frequency data so as to lock the PLL circuit 99c when the fourth FBAR 56d is connected.

In the third modification of the second embodiment as well, searching is started with the second FBAR 56b having an intermediate band. When turning on power, the PLL circuit 99c is forced to reset to an initial condition by the control circuit 100b. The control signal $SG_{C2}$ to select the second FBAR 56b as an initial value is generated to turn on only the switch SW2. In the initial condition, the switch SW5 is connected to the standard potential $V_{STD}$. Thus, the standard potential $V_{STD}$ is provided to the reactance controller 52 of the resonator 70c in the VCO 51. Accordingly, the loop of the PLL circuit 99c is opened in the initial condition. In addition, the standard potential $V_{STD}$ is set beforehand to the upper limit of the control voltage $V_{control}$.

The VCO 51 starts oscillation at a frequency determined by the resonance characteristics of the second FBAR 56b depending on the standard potential $V_{STD}$. The first frequency divider 82 divides the oscillation signal $S_{HF}$ of the oscillation frequency to generate a divided oscillation signal $D_{F1}$. The divided oscillation signal $D_{F1}$ is sent to the phase comparator 88a. The second frequency divider 84 divides the reference signal $S_{REF}$ to generate a divided reference signal $D_{F2}$. The divided reference signal $D_{F2}$ is also added to the phase comparator 88a. In the phase comparator 88a, the phases of the divided oscillation signal $D_{F1}$ and the divided reference signal $D_{F2}$ are compared.

The control circuit 100b sends the reset command signal $SG_{RST}$ to the reset signal generator 104. The reset signal generator 104 sends the reset signal $DS_{RST}$ to the first and second frequency dividers 82 and 84. When the reset signal $DS_{RST}$ is received, the first and second frequency dividers 82 and 84 simultaneously start dividing. Since the oscillation frequency of the VCO 51 using the second FBAR 56b is lower than the desired frequency, the falling edge of the divided oscillation signal $D_{F1}$ provided to the phase comparator 88a is delayed with respect to the falling edge of the divided reference signal $D_{F2}$. Accordingly, the phase delay of the divided oscillation signal $D_{F1}$ is detected by the phase comparator 88a. Thus, the generated up signal $DS_{UP}$ is provided to the control circuit 100b.

When the up signal $DS_{UP}$ is provided to the control circuit 100b, the control circuit 100b, in accordance with the algorithm shown in FIG. 32, generates the control signal $SG_{C3}$ to turn on the switch SW3 so as to select the third FBAR 56c in place of the currently selected second FBAR 56b. Moreover, the control circuit 100b holds the switch SW5 in connection with the standard potential $V_{STD}$ and thus holds the loop of the PLL circuit 99c open. Furthermore, the reset command signal $SG_{RST}$ is sent from the control circuit 100b to the reset signal generator 104. The reset signal $DS_{RST}$ sent from the reset signal generator 104 causes the first and second frequency dividers 82 and 84 to simultaneously start dividing again.

The oscillation signal $S_{HF}$ provided by the VCO 51 using the third FBAR 56c is added to the first frequency divider 82, and divided into the divided oscillation signal $D_{F1}$. The divided oscillation signal $D_{F1}$ is provided to the phase comparator 88a. However, since the third FBAR 56c is selected, oscillation at the desired frequency cannot be provided. Therefore, again, a phase delay of the divided oscillation signal $D_{F1}$ is detected by the phase comparator 88a. Thus, the up signal $DS_{UP}$ is provided to the control circuit 100b.

When the up signal $DS_{UP}$ is provided to the control circuit 100b, in accordance with the algorithm shown in FIG. 32, the control circuit 100b generates the control signal $SG_{C4}$ to turn on the switch SW4 so as to select the fourth FBAR 56d. The switch SW5, which is held in connection with the reference potential $V_{STD}$ side, holds the loop of the PLL circuit 99c open. Moreover, the reset command signal $SG_{RST}$ is sent from the control circuit 100b to the reset signal generator 104. The reset signal $DS_{RST}$ sent from the reset signal generator 104 causes the first and second frequency dividers 82 and 84 to simultaneously start dividing again.

The oscillation signal $S_{HF}$ provided by the VCO 51 using the fourth FBAR 56d is added to the first frequency divider 82, and divided into the divided oscillation signal $D_{F1}$. The divided oscillation signal $D_{F1}$ is provided to the phase comparator 88a. Since the frequency of the divided oscillation signal $D_{F1}$ provided by the first frequency divider 82 is higher than that of the divided reference signal $D_{F2}$, the falling edge of the divided oscillation signal $D_{F1}$ is advanced with respect to the falling edge of the divided reference signal $D_{F2}$. Accordingly, the phase advance of the divided oscillation signal $D_{F1}$ is detected by the phase comparator 88a. Thus, the generated down signal $DS_{DOWN}$ is provided to the control circuit 10b.

As a result, the control signal $SG_{C4}$ from the control circuit 100b holds the switch SW4 in the on-state. Moreover, at the same time, the control signal $SG_{C5}$ is sent from the control circuit 100b to turn the switch SW5 from the standard potential $V_{STD}$ to the output of the control voltage generator 91. Thus, the feedback loop of the PLL circuit 99c is established.

With closing of the PLL circuit 99c, the up signal $DS_{UP}$ or down signal $DS_{DOWN}$ sent from the phase comparator 88a is detected in the control circuit 100b. The reset command signal $SG_{RST}$ is sent from the control circuit 100b to the reset signal generator 104. When the reset signal $DS_{RST}$ are sent from the reset signal generator 104 to the first and second frequency dividers 82 and 84, the first and second frequency dividers 82 and 84 simultaneously start dividing. Therefore, one of the falling edges of the divided oscillation signal $D_{F1}$ and the divided reference signal $D_{F2}$ to be provided to the phase comparator 88a, which has a lower frequency, is delayed with respect to the other. In the pull-in processes thereafter, since the operation start times of the first and second frequency dividers 82 and 84 are always synchronized, the phase comparator 88a will compare phases and frequencies at the same time. Therefore, when the frequencies of the outputs of the first and second frequency dividers 82 and 84 are the same, the phases thereof are always the same as well.

Fine adjustment of the oscillation frequency of the VCO 51 is implemented with the feedback control by the PLL circuit 99c. When no phase difference is detected between the divided oscillation signal $D_{F1}$ and the divided reference signal $D_{F2}$ in the end as a result of the feedback control, the lock detector 90 operates to lock the phase of the PLL circuit 99c. At the same time, the control circuit 100b stops providing the reset command signal $SG_{RST}$. Thus, the output frequency of the VCO 51 is stabilized.

In addition, once the PLL circuit 99c is locked, the operation of switching the FBARs is stopped. Even when an unlocking condition is temporarily detected due to a disturbance, the lock condition is held.

As described above, according to the third modification of the second embodiment, since a single VCO 51 is used, it is possible to reduce the size and cost of a resonator circuit. In addition, low power consumption operation can be achieved. Moreover, instead of the control voltage $V_{control}$ generated by the loop filter 94 in the control voltage generator 91, the up and down signals $DS_{UP}$ and $DS_{DOWN}$ generated by the phase comparator 88a, which is provided in the preceding stage of the control voltage generator 91, are used to search for an FBAR having a suitable frequency band. Therefore, it is possible to reduce the time required for searching for an FBAR. Furthermore, the VCO 51 can be operated by switching the first to fourth FBARs 56a to 56d having different resonance frequencies by the control circuit 100b generating the control signals $SG_{C1}$ to $SG_{C4}$ of the switches SW1 to SW4 for switching the FBARs. Thus, it is possible to provide a frequency synthesizer which has a small noise and a wide frequency tunability.

Fourth Modification of the Second Embodiment

Figure 35:
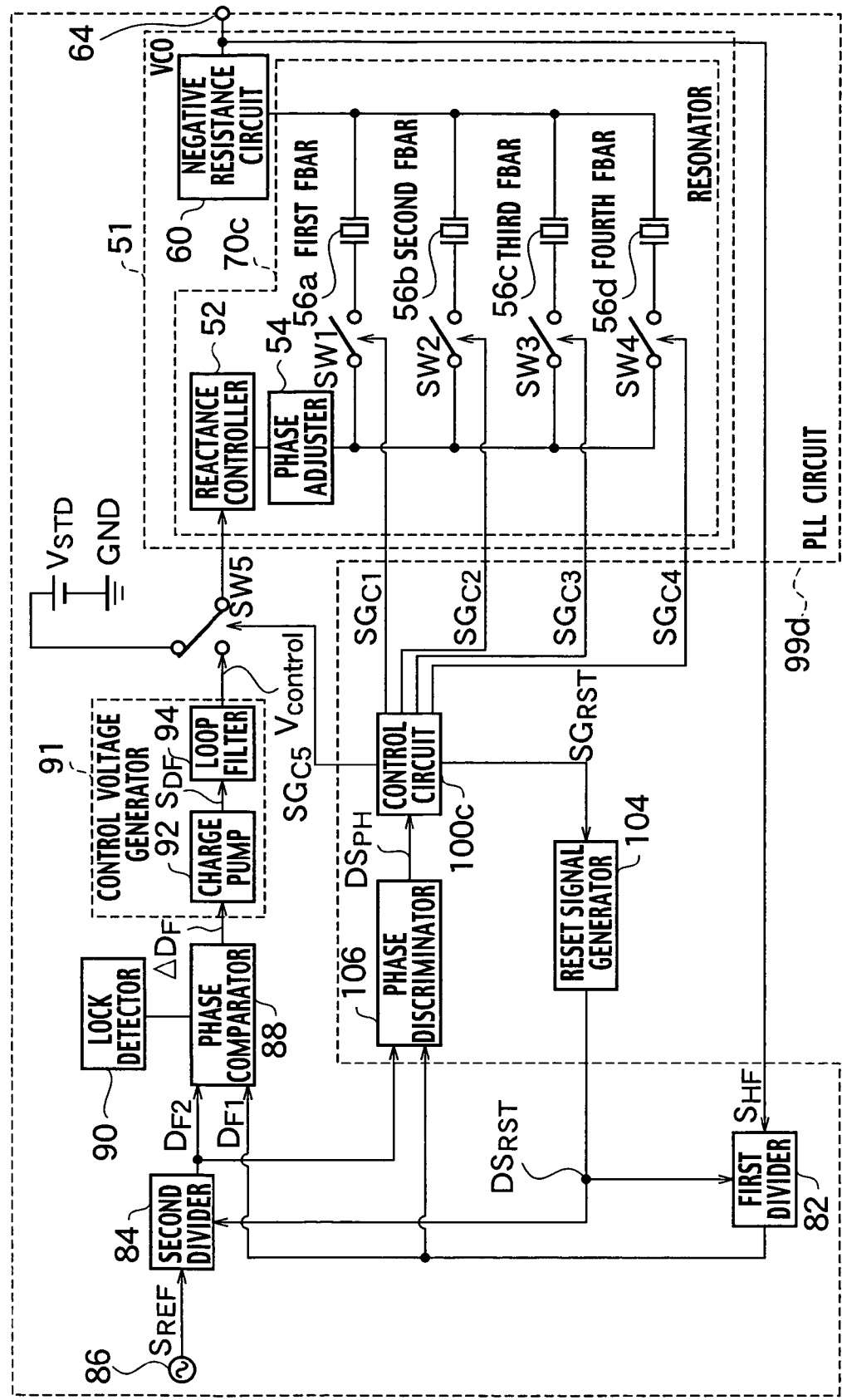
FIG. 35 is an example of a circuitry of a frequency synthesizer according to a fourth modification of the second embodiment of the present invention.

As shown in FIG. 35, a frequency synthesizer according to a fourth modification of the second embodiment of the present invention includes a PLL circuit 99d which generates a high frequency oscillation signal $S_{HF}$; a phase discriminator 106 which determines a phase difference between a divided oscillation signal $D_{F1}$ and a divided reference signal $D_{F2}$ generated by first and second frequency dividers 82 and 84 in the PLL circuit 99d, respectively; a control circuit 100c which generates any one of control signals $SG_{C1}$ to $SG_{C5}$ to a VCO 51, based on a phase discrimination signal $DS_{PH}$; and a reset signal generator 104 which provides a dividing reset signal $DS_{RST}$ to the first and second frequency dividers 82 and 84, triggered by a reset command signal $SG_{RST}$ from the control circuit 100b.

The fourth modification of the second embodiment is different from the third modification of the second embodiment in that any one of the control signals $SG_{C1}$ to $SG_{C4}$ for the switches SW1 to SW4 for switching the first to fourth FBARs 56a to 56d provided in the VCO 51 is generated based on the phase discrimination signal $DS_{PH}$ generated by the phase discriminator 106. The other configurations are similar to the third modification of the second embodiment. Therefore, redundant descriptions will be omitted.

The divided oscillation signal $D_{F1}$ and the divided reference signal $D_{F2}$ sent from the first and second frequency dividers 82 and 84 respectively, are not only provided to the phase comparator 88 but also provided to the phase discriminator 106. The phase discriminator 106 compares the phases of the divided oscillation signal $D_{F1}$ and the divided reference signal $D_{F2}$ and thereby determines whether the phase of the divided oscillation signal $D_{F1}$ delays or advances with respect to that of the divided reference signal $D_{F2}$. Then, the phase discriminator 106 provides the result of the determination as the phase discrimination signal $DS_{PH}$ to the control circuit 100c. As for the comparison of the phases of the divided oscillation signal $D_{F1}$ and the divided reference signal $D_{F2}$, in a similar way to that shown in FIG. 34 for example, the determination may be provided based on the falling edges of the divided oscillation signal $D_{F1}$ and the divided reference signal $D_{F2}$ by the phase discriminator 106 after the reset signals $DS_{RST}$ are sent from the reset signal generator 104 to the first and second frequency dividers 82 and 84.

In the fourth modification of the second embodiment as well, searching for an FBAR having a suitable frequency band is started with the second FBAR 56b having an intermediate frequency band. When turning on power, the PLL circuit 99d is forced to reset to an initial condition by the control circuit 100c. The control signal $SG_{C2}$ to select the second FBAR 56b as an initial value is generated to turn on only the switch SW2. In the initial condition, the switch SW5 is connected to the standard potential $V_{STD}$. Thus, the standard potential $V_{STD}$ is provided to the reactance controller 52 of the resonator 70c in the VCO 51. Accordingly, the loop of the PLL circuit 99d is opened in the initial condition. In addition, the standard potential $V_{STD}$ is set beforehand to the upper limit of the control voltage $V_{control}$.

When the reset command signal $SG_{RST}$ is sent from the control circuit 100c to the reset signal generator 104, the reset signal $DS_{RST}$ is sent from the reset signal generator 104 to the first and second frequency dividers 82 and 84. Due to the reset signal $DS_{SRT}$, the oscillation signal $S_{HF}$ and the reference signal $S_{REF}$ are simultaneously divided by the first and second frequency dividers 82 and 84, respectively. As a result, the divided oscillation signal $D_{F1}$ and the divided reference signal $D_{F2}$ are provided to the phase comparator 88 and the phase discriminator 106. When it is determined by the phase discriminator 106 that the phase of the divided oscillation signal $D_{F1}$ is delayed with respect to that of the divided reference signal $D_{F2}$, the phase discrimination signal $DS_{PH}$ indicating a phase delay is provided to the control circuit 100c. In the control circuit 100c, based on the phase discrimination signal $DS_{PH}$, the control signal $SG_{C3}$ to turn on the switch SW3 is generated to select the third FBAR 56c in place of the currently selected second FBAR 56b. The switch SW5 is held in connection with the standard potential $V_{STD}$. Thus, the loop of the PLL circuit 99c is held open. Further, the reset command signal $SG_{RST}$ is sent from the control circuit 100c to the reset signal generator 104, and the above-described search for the FBAR is continued.

When the fourth FBAR 56d is selected and it is determined by the phase discriminator 106 that the phase of the divided oscillation signal $D_{F1}$ is advanced with respect to that of a divided reference signal $D_{F2}$, the phase discrimination signal $DS_{PH}$ indicating a phase delay is provided to the control circuit 100c. As a result, the control signal $SG_{C4}$ from the control circuit 100c holds the switch SW4 in the on-state. At the same time, the control signal $SG_{C5}$ is sent from the control circuit 100c and turns the switch SW5 from the standard potential $V_{STD}$ to the output of the control voltage generator 91. Thus, the feedback loop of the PLL circuit 99c is established. The feedback control by the PLL circuit 99c eliminates a phase difference between the divided oscillation signal $D_{F1}$ and the divided reference signal $D_{F2}$. Thus, the PLL circuit 99c is locked.

As described above, according to the fourth modification of the second embodiment, since the single VCO 51 is used, it is possible to reduce the size and cost of a resonator circuit. In addition, low power consumption operation can be achieved. Moreover, since the phases of the divided oscillation signal $D_{F1}$ and the divided reference signal $D_{F2}$ are compared by the phase discriminator 106 in order to search for an FBAR having a suitable frequency band, it is possible to reduce the time required for searching for an FBAR. Furthermore, the VCO 51 can be operated by switching the first to fourth FBARs 56a to 56d having different resonance frequencies by the control circuit 100c generating the control signals $SG_{C1}$ to $SG_{C4}$ of the switches SW1 to SW4 for switching the FBARs. Thus, it is possible to provide a frequency synthesizer which has a small noise and a wide frequency tunability.

Fifth Modification of the Second Embodiment

Figure 36:
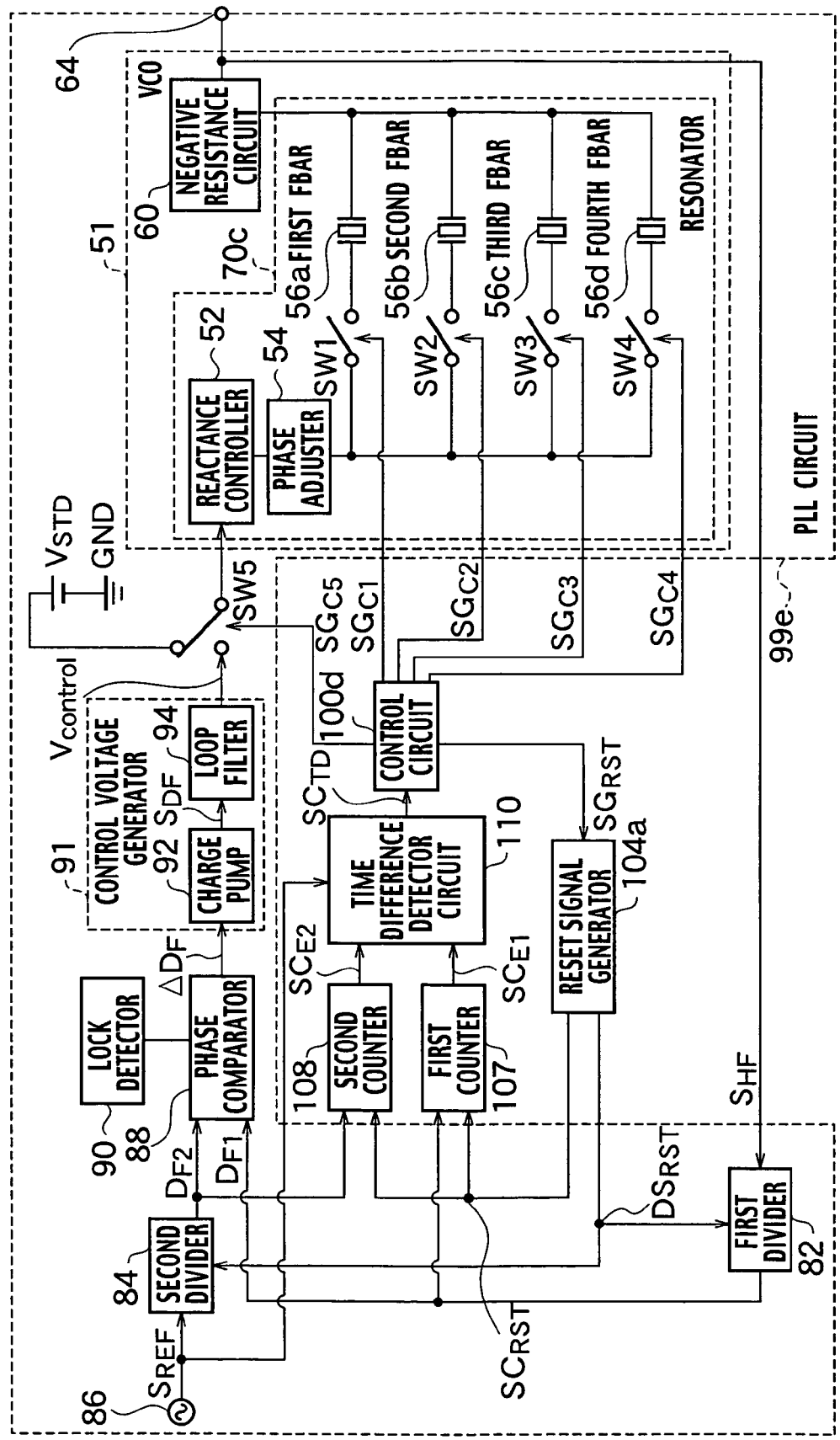
FIG. 36 is an example of a circuitry of a frequency synthesizer according to a fifth modification of the second embodiment of the present invention.

As shown in FIG. 36, a frequency synthesizer according to a fifth modification of the second embodiment of the present invention includes a PLL circuit 99e which generates a high frequency oscillation signal $S_{HF}$; first and second counters 107 and 108 which count the number of pulses in a divided oscillation signal $D_{F1}$ and a divided reference signal $D_{F2}$ generated by the first and second frequency dividers 82 and 84 in the PLL circuit 99e, respectively; a time difference detector 110 which measures a time difference based on first and second counting end signals $SC_{E1}$ and $SC_{E2}$ sent from the first and second counters 107 and 108, respectively; a control circuit 100d which provides any one of control signals $SG_{C1}$ to $SG_{C5}$ to the VCO 51, based on a time difference signal $SC_{TD}$ sent from the time difference detector 110; and a reset signal generator 104a which provides a dividing reset signal $DS_{RST}$ to the first and second frequency dividers 82 and 84 and provides a count reset signal $SC_{RST}$ to the first and second counters 107 and 108, triggered by a reset command signal $SG_{RST}$ from the control circuit 100d.

The first and second counters 107 and 108 are connected to outputs of the first and second frequency dividers 82 and 84, respectively. The output of the reset signal generator 104a connected to the control circuit 100d, is connected to the first and second frequency dividers 82 and 84 and to the first and second counters 107 and 108. An output of the time difference detector 110, to which the outputs of the first and second counters 107 and 108 and of the reference signal source 86 are connected, is connected to the control circuit 100d. The control circuit 100d is connected to the switches SW1 to SW4 for switching the FBARs in the VCO 51 and to the switch SW5.

In the fifth modification of the second embodiment, the first and second counters 107 and 108 count a predetermined number of the pulses in the divided oscillation signal $D_{F1}$ and the divided reference signals $D_{F2}$, which are sent from the first and second frequency dividers 82 and 84, respectively. Thereafter, the first and second counters 107 and 108 provided the first and second counting end signals $SC_{E1}$ and $SC_{E2}$, respectively, to the time difference detector 110. The time difference detector 110 calculates a number of reference signals $S_{REF}$ within a time difference between the first and second counting end signals $SC_{E1}$ and $SC_{E2}$ and provides the calculated number, as the time difference signal $SC_{TD}$, to the control circuit 100d. Based on the time difference signal $SC_{TD}$, the control circuit 100d generates any one of the control signals $SG_{C1}$ to $SG_{C4}$ of the switches SW1 to SW4 for switching the first to fourth FBARs 56a to 56d provided in the VCO 51. The fifth modification of the second embodiment is different from the third modification of the second embodiment in the above-discussed points. The other configurations of the fifth modifications of the second embodiment are similar to the third modifications of the second embodiment. Therefore, redundant descriptions will be omitted.

In the fifth modification of the second embodiment as well, searching for an FBAR having a suitable frequency band is started with the second FBAR 56b having an intermediate frequency band. When turning on power, the PLL circuit 99e is forced to reset to an initial condition by the control circuit 100d. The control signal $SG_{C2}$ to select the second FBAR 56b as an initial value is sent from the control circuit 100d to turn on only the switch SW2. In the initial condition, the switch SW5 is connected to the standard potential $V_{STD}$. Thus, the standard potential $V_{STD}$ is provided to the reactance controller 52 of the resonator 70c in the VCO 51. Accordingly, the loop of the PLL circuit 99e is opened in the initial condition. In the fifth modification of the second embodiment, the standard potential $V_{STD}$ is set beforehand to an intermediate potential between the upper limit and lower limit of the control voltage $V_{control}$.

The reset command signal $SG_{RST}$ is sent to the reset signal generator 104a from the control circuit 10d. The reset signal generator 104a provides the reset signal $DS_{RST}$ to the first and second frequency dividers 82 and 84, and the count reset signal $SC_{RST}$ to the first and second counters 107 and 108. The first and second frequency dividers 82 and 84 simultaneously start dividing so as to generate the divided oscillation signals $D_{F1}$ and the divided reference signals $D_{F2}$, respectively. The first and second counters 107 and 108 simultaneously start counting the divided oscillation signals $D_{F1}$ and the divided reference signals $D_{F2}$ sent from the first and second frequency dividers 82 and 84, respectively.

When the first and second counters 107 and 108 finish counting the predetermined number of pulses, the first and second counters 107 and 108 send the first and second counting end signal $SC_{E1}$ and $SC_{E2}$, respectively, to the time difference detector 110. When the time difference detector 110 detects the earlier one of the first and second counting end signals $SC_{E1}$ and $SC_{E2}$, the time difference detector 110 starts counting reference signals $S_{REF}$. The counting is continued until the later one of the first and second counting end signals $SC_{E1}$ and $SC_{E2}$ is detected. When the first counting end signal $SC_{E1}$ is earlier, a positive sign is provided to a resulting value. When the second counting end signal $SC_{E2}$ is earlier, a negative sign is provided to a resulting value. The counting result is sent to the control circuit 100d as the time difference signal $SC_{TD}$.

In the control circuit 10d, a frequency difference having the positive or negative sign is calculated from the time difference signal $SC_{TD}$. Then, it is determined whether or not an FBAR in the VCO 51 needs switching. Moreover, the control circuit 100d stores information of the currently selected second FBAR 56b. When an FBAR needs switching, the FBAR having a suitable frequency band is selected from among the first to fourth FBAR 56a to 56d, based on the calculated frequency difference. For example, when the time difference signal $SC_{TD}$ has a positive sign, the FBAR 56b is switched to an FBAR having a lower frequency band. When the time difference signal $SC_{TD}$ has a negative sign, the FBAR 56b is switched to an FBAR having a higher frequency band.

In the fifth modification of the second embodiment, for example, it is assumed that it is determined that an FBAR having a suitable frequency band is the fourth FBAR 56d which has a two-level higher frequency band than the second FBAR 56b. In such case, the control signal $SG_{C4}$ is sent from the control circuit 100d so as to turn on the switch SW4. Accordingly, in the resonator 70c, the fourth FBAR 56d having the suitable oscillation frequency band is selected instead of the currently selected second FBAR 56b. In addition, the switch SW5 is held in connection with the standard potential $V_{STD}$.

Subsequently, the reset command signal $SG_{RST}$ is sent again to the reset signal generator 104a from the control circuit 10d. Thus, the first and second counters 107 and 108 simultaneously start counting again. When the first and second counters 107 and 108 finish counting the predetermined number of respective pulses the first and second counters 107 and 108 provide the first and second counting end signals $SC_{E1}$ and $SC_{E2}$, respectively, to the time difference detector 110. The time difference detector 110 calculates the number of reference signals $S_{REF}$ within a time difference between the first and second counting end signals $SC_{E1}$ and $SC_{E2}$. The calculating result is sent to the control circuit 100d as the time difference signal $SC_{TD}$.

The control circuit 100d calculates a frequency difference from the time difference signal $SC_{TD}$. Since the fourth FBAR 56d having a suitable frequency band has already been selected, a magnitude of the time difference signal $SC_{TD}$ is in a predetermined tolerance level. Accordingly, it is determined that the FBAR does not need switching. As a result, the control signal $SG_{C5}$ is sent from the control circuit 100d to turn the switch SW5 from the standard potential $V_{STD}$ to the output of the loop filter 94 in the control voltage generator 91. Thus, the feedback loop of the PLL circuit 99e is closed.

The control circuit 100d continues monitoring the oscillation frequency of the VCO 51 for a period of time after the feedback loop of the PLL circuit 99e is closed until the phase lock is detected by the lock detector 90, using the first and second counters 107 and 108 and the time difference detector 110. In the meantime, the control circuit 100d continues monitoring the oscillation frequency by using time difference signals $SC_{TD}$ sent from the time difference detector 110. Additionally, the control circuit 100d sends the reset command signal $SG_{RST}$ to the reset signal generator 104a when the time difference signal $SC_{TD}$ is greater than a reference value for the phase lock of the feedback loop of the PLL circuit 99e. The reset signal generator 104a provides the reset signal $DS_{RST}$ to the first and second frequency dividers 82 and 84 respectively, and the count reset signal $SC_{RST}$ to the first and second counters 107 and 108 respectively. For every reception of the reset signal $DS_{RST}$ and the count reset signal $SC_{RST}$, the first and second frequency dividers 82 and 84 simultaneously start dividing, and the first and second counters 107 and 108 simultaneously start counting. In such way, the dividing start time for the first and second frequency dividers 82 and 84 are always synchronized in the pull-in process. Further, when the divided oscillation signal $D_{F1}$ and the divided reference signal $D_{F2}$ respectively sent from the first and second frequency dividers 82 and 84 is the same, the phases of these signals is always the same as well. Thus, when the phase lock is finally detected by the lock detector 90, the control circuit 100d stops providing the reset command signal $SG_{RST}$ to the reset signal generator 104a.

As described above, according to the fifth modification of the second embodiment, since the single VCO 51 is used, it is possible to reduce the size and cost of a resonator circuit. In addition, low power consumption operation can be achieved. Moreover, in order to search for an FBAR having a suitable frequency band, the suitable frequency band is determined based on the frequency difference between the divided oscillation signal $D_{F1}$ and the divided reference signal $D_{F2}$, using the first and second counters 107 and 108 and the time difference detector 110. Accordingly, it is possible to reduce the time required for searching for an FBAR. Furthermore, the VCO 51 can be operate by switching the first to fourth FBARs 56a to 56d having different resonance frequencies by the control circuit 100d generating the control signals $SG_{C1}$ to $SG_{C4}$ of the switches SW1 to SW4 for switching the FBAR. Thus, it is possible to provide a frequency synthesizer which has a small noise and a wide frequency tunability.

Sixth Modification of the Second Embodiment

Figure 37:
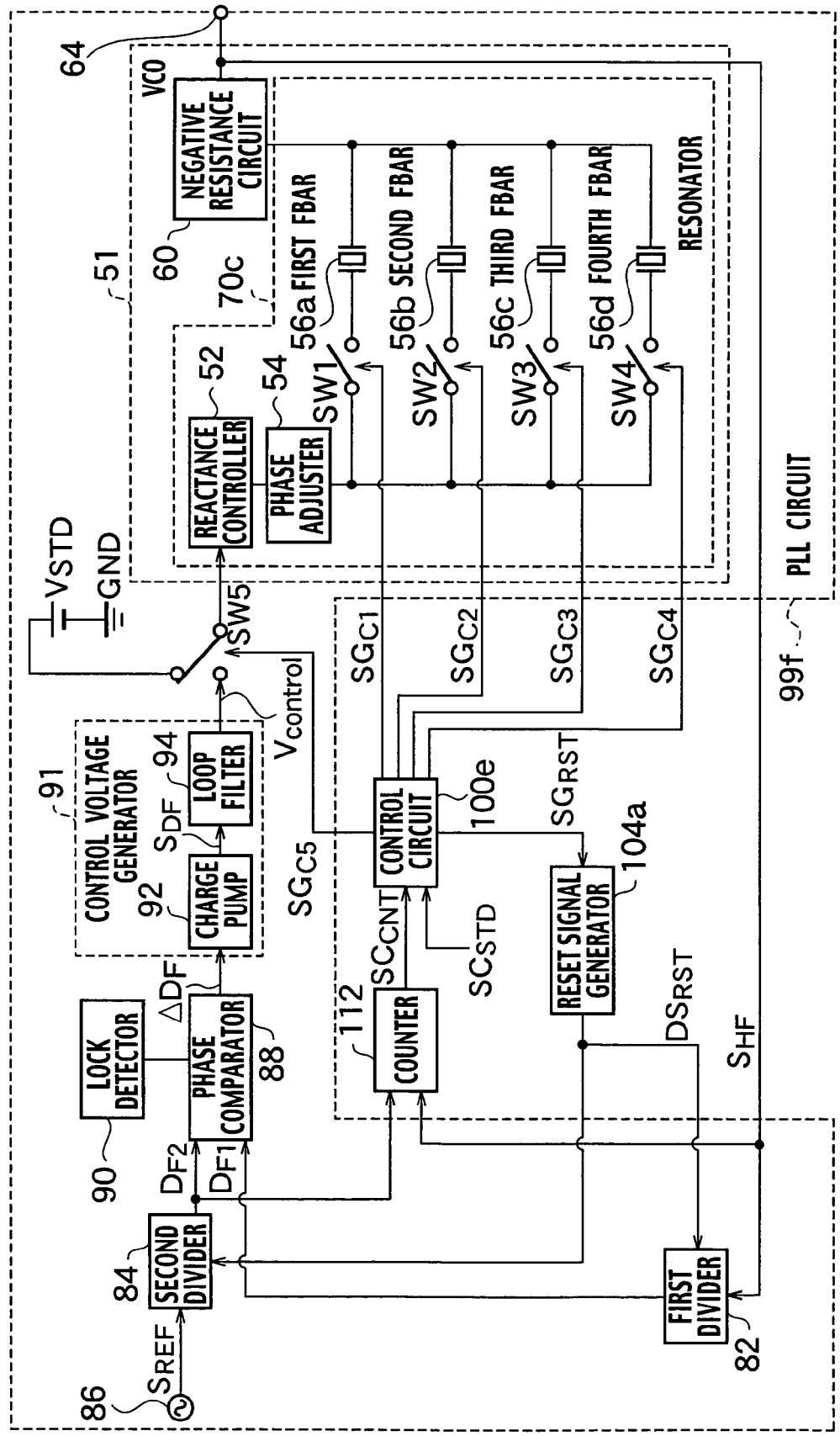
FIG. 37 is an example of a circuitry of a frequency synthesizer according to a sixth modification of the second embodiment of the present invention.

As shown in FIG. 37, a frequency synthesizer according to a sixth modification of the second embodiment of the present invention includes a PLL circuit 99f which generates a high frequency oscillation signal $S_{HF}$; a counter 112 which counts the number of pulses in the oscillation signals $S_{HF}$ generated by the VCO 51 in the PLL circuit 99f, using a divided reference signal $D_{F2}$ as a reset signal; a control circuit 100e which compares a count signal $SC_{CNT}$ sent from the counter 112 with a standard count value $SC_{STD}$ and generates control signals $SG_{C1}$ to $SG_{C5}$ to the VCO 51; and a reset signal generator 104 which provides a dividing reset signal $DS_{RST}$ to the first and second frequency dividers 82 and 84, triggered by a reset command signal $SG_{RST}$ from the control circuit 100e.

The counter 112 is connected to an output node 64 of the VCO 51 and an output of the second frequency divider 84. An output of the counter 112 is connected to the control circuit 100e. Moreover, the control circuit 100e is connected to the reset signal generator 104a, and an output of the reset signal generator 104a is connected to the first and second frequency dividers 82 and 84. The control circuit 100e is also connected to the switches SW1 to SW4 for switching first to fourth FBARs 56a to 56d in the VCO 51 and to the switch SW5.

By receiving an input of a divided reference signal $DF_2$ to be used as the count reset signal, the counter 112 counts the number of pulses in the oscillation signal $S_{HF}$ from the VCO 51 until the next divided reference signal $D_{F2}$ is received. The control circuit 10e calculates a frequency difference between the oscillation signal $S_{HF}$ and a desired frequency, based on the count signal $SC_{CNT}$ sent from the counter 112 and on the count standard value $SC_{STD}$. The control circuit 10e determines whether to switch the first to fourth FBARs 56a to 56d depending on the frequency difference calculation based on the count signal $SC_{CNT}$ and the count standard value $SC_{STD}$. The standard count value $SC_{STD}$ is altered based on frequency data provided to the reference signal source 86 so as to respond to a suitable frequency. The control circuit 10e generates any one of control signals $SG_{C1}$ to $SG_{C4}$ of the switches SW1 to SW4 for switching the first to fourth FBARs 56a to 56d in the VCO 51, based on the frequency difference calculated using the count signal $SC_{CNT}$ and the standard count value $SC_{STD}$. The sixth modification of the second embodiment is different from the fifth modification of the second embodiment in the above-discussed points. The other configurations of the sixth modifications of the second embodiment are similar to the fifth modifications of the second embodiment. Therefore, redundant descriptions will be omitted.

In the sixth modification of the second embodiment, searching for the FBAR having a suitable frequency band is started with the second FBAR 56b having an intermediate band. When turning on power, the PLL circuit 99f is forced to reset to an initial condition by the control circuit 100e. The control signal $SG_{C2}$ to select the second FBAR 56b as an initial value is sent from the control circuit 100e to turn on only the switch SW2. In the initial condition, the switch SW5 is connected to the standard potential $V_{STD}$. Thus, the standard potential $V_{STD}$ is provided to the reactance controller 52 of the resonator 70c in the VCO 51. Accordingly, the loop of the PLL circuit 99f is opened in the initial condition. In the sixth modification of the second embodiment, the standard potential $V_{STD}$ is set beforehand to an intermediate potential between the upper and lower limits of the control voltage $V_{control}$.

The oscillation signal $S_{HF}$ generated by the VCO 51 using the second FBAR 56b and the divided reference signal $D_{F2}$ are provided to the counter 112. When the divided reference signal $D_{F2}$ is received, the count in the counter 12 is reset. The counter 12 counts the number of pulses in the oscillation signal $S_{HF}$ until the next divided reference signal $D_{F2}$ is received, and sends the count value, as the count signal $SC_{CNT}$, to the control circuit 100e.

The control circuit 100e calculates a frequency difference by comparing the count signal $SC_{CNT}$ with the count standard value $SC_{STD}$ and determines whether or not the FBAR in the VCO 51 needs switching. Moreover, the control circuit 100e stores information of the currently selected second FBAR 56b. When the FBAR needs switching, an FBAR having a suitable frequency band is selected based on the calculated frequency difference. For example, when the count signal $SC_{CNT}$ is greater than the standard count value $SC_{STD}$, an FBAR having a lower frequency band is selected, instead of the second FBAR 56b. When the count signal $SC_{CNT}$ is smaller than the standard count value $SC_{STD}$, an FBAR having a higher frequency band is selected.

In the sixth modification of the second embodiment, for example, it is assumed that it is determined that an FBAR having a suitable frequency band is the fourth FBAR 56d which has a two-level higher frequency band than the second FBAR 56b. In such case, the control signal $SG_{C4}$ is sent from the control circuit 10e so as to turn on the switch SW4. Accordingly, in the resonator 70c, the fourth FBAR 56d having a suitable oscillation frequency band is selected instead of the currently selected second FBAR 56b. In addition, the switch SW5 is held in connection with the standard potential $V_{STD}$.

Subsequently, the reset command signal $SG_{RST}$ is sent to the reset signal generator 104a from the control circuit 10e. The reset signals $DS_{RST}$ are sent to the first and second frequency dividers 82 and 84 from the reset signal generator 104a. Triggered by these signals, the first and second frequency dividers 82 and 84 start dividing again. The oscillation signals $S_{HF}$ generated by oscillation by the VCO 51 using the fourth FBAR 56d and the divided reference signal $D_{F2}$ are provided to the counter 112. When the divided reference signal $D_{F2}$ is received, the count in the counter 112 is reset, and the number of pulses in the oscillation signals $S_{HF}$ are counted until the next divided reference signal $D_{F2}$ is received. The count value is sent to the control circuit 10e as a count signal $SC_{CNT}$.

The control circuit 10e calculates a frequency difference by comparing the count signal $SC_{CNT}$ and the standard count value $SC_{STD}$. Since the fourth FBAR 56d having a suitable frequency band has already been selected, the frequency difference is within a predetermined tolerance level. Accordingly, it is determined that the FBAR does not need switching. As a result, the control signal $SG_{C5}$ is sent from the control circuit 10e to turn the switch SW5 from the standard potential $V_{STD}$ to the output of the loop filter 94 in the control voltage generator 91. Thus, the feedback loop of the PLL circuit 99f is closed.

As described above, according to the sixth modification of the second embodiment, since a single VCO 51 is used, it is possible to reduce the size and cost of a resonator circuit. In addition, low power consumption operation can be achieved. Moreover, in order to search for an FBAR having a suitable frequency band, the suitable frequency band is determined by monitoring the oscillation signals $S_{HF}$ using the counter 112. Accordingly, it is possible to reduce the time required for searching for an FBAR. Furthermore, the VCO 51 can be operated by switching the first to fourth FBARs 56a to 56d having different resonance frequencies by the control circuit 10e generating the control signals $SG_{C1}$ to $SG_{C4}$ of the switches SW1 to SW4 for switching the FBAR. Thus, it is possible to provide a frequency synthesizer which has a small noise and a wide frequency tunability.

Seventh Modification of the Second Embodiment

Figure 38:
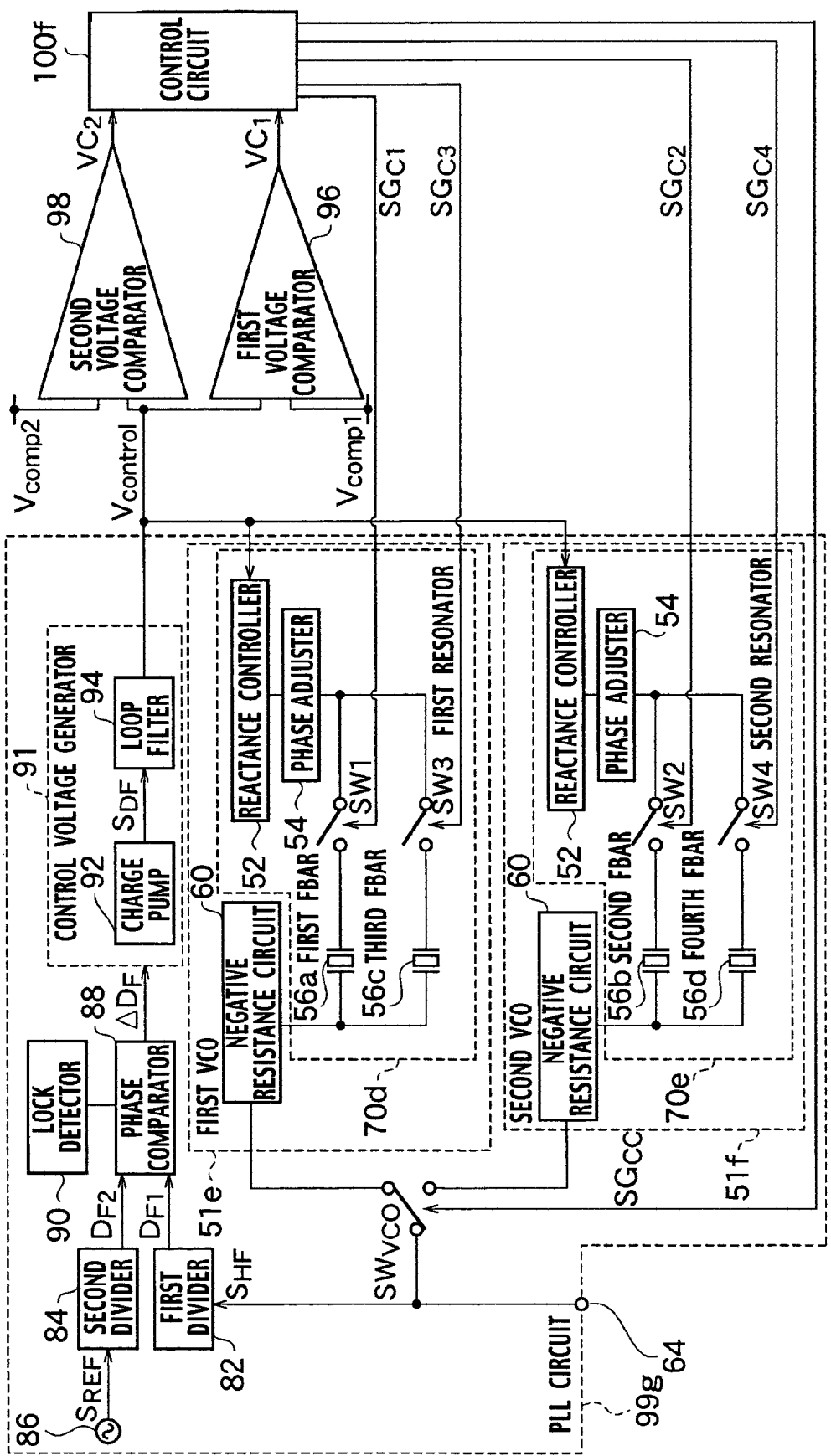
FIG. 38 is an example of a circuitry of a frequency synthesizer according to a seventh modification of the second embodiment of the present invention.

As shown in FIG. 38, a frequency synthesizer according to a seventh modification of the second embodiment includes first and second VCOs 51e and 51f in a PLL circuit 99g which generates a high frequency oscillation signal $S_{HF}$. A first resonator 70d in the first VCO 51e, connected to an output of the loop filter 94 in a control voltage generator 91, includes first and third FBARs 56a and 56c. A second resonator 70e in the second VCO 51f, connected to the output of the loop filter 94, includes the second and fourth FBARs 56b and 56d.

The control circuit 100f generates control signals $SG_{C1}$ to $SG_{C4}$ to select switches SW1 to SW4 for switching the FBARs in the first and second VCOs 51e and 51f. Moreover, the control circuit 100f provides a control signal $SG_{CC}$ to a switch $SW_{VCO}$ for the first and second VCOs 51e and 51f.

In the seventh modification of the second embodiment, in order to search for a suitable VCO and a suitable FBAR, any one set of control signals $SG_{C1\ and\ SGC2}$ for the first and second FBARs 56a and 56b respectively, control signals $SG_{C2}$ and $SG_{C3}$ for the second and third FBARs 56b and 56c respectively, and control signals $SG_{C3}$ and $SG_{C4}$ for the third and fourth FBARs 56c and 56d respectively, are simultaneously generated. As described using FIG. 4, the larger the Q value of a FBAR, the longer the oscillation start time of a VCO. In the first modification of the second embodiment, the control circuit 100 in FIG. 29 generates one of the control signals $SG_{C1}$ to $SG_{C4}$ of the first to fourth FBARs 56a to 56d, and the oscillation start time of the VCO 51 tends to be long when the first to fourth FBARs 56a to 56d are switched from one to another. The seventh modification of the second embodiment is different from the first modification of the second embodiment in that the control circuit 100f sequentially generates two of the control signals $SG_{C1}$ to $SG_{C4}$, and that the first and second VCOs 51e and 51f are always oscillated in steady states. The other configurations are similar to the first modification of the second embodiment. Therefore, redundant descriptions will be omitted.

In the seventh modification of the second embodiment, for example, as an initial condition, the control signals $SG_{C1}$ and $SG_{C2}$ of the switches SW1 and SW2 are sent from the control circuit 100f to turn on the first and second FBARs 56a and 56b in the first and second resonators 70d and 70e respectively. Then, the first and second VCOs 51e and 51f are oscillated. In addition, the switch $SW_{VCO}$ is connected to the first VCO 51e.

When the oscillation signal $S_{HF}$ generated by the first VCO 51e using the first FBAR 56a is not in a desired oscillation frequency band, the control signal $SG_{CC}$ is sent from the control circuit 10f, and the switch $SW_{VCO}$ is connected to the second VCO 51f. At the same time, the control signal $SG_{C1}$ of the switch SW1 is turned off, and a control signal $SG_{C3}$ of the switch SW3 is sent from the control circuit 100f to turn on the third FBAR 56c in the first resonator 70d. As a result, if the oscillation signal $S_{HF}$ generated by the second VCO 51f using the second FBAR 56b is determined to be the desired oscillation frequency band, the first VCO 51e starts oscillation using the third FBAR 56c.

In the seventh modification of the second embodiment, while the oscillation signal $S_{HF}$ generated by one of the VCOs 51e and 51f, which is connected to the PLL circuit 99g by the switch SWVCO, is determined to be a desired oscillation frequency band, the FBARs are switched in the other VCO, and the other VCO oscillates in a steady state by using the newly selected FBAR. Further, when it is determined by the control circuit 100f that the oscillation signal $S_{HF}$ is in the desired oscillation frequency band, the control circuit 100f stops generating the control signals of the FBARs in the VCO which is not connected to the PLL circuit 99g by the Switch $SW_{VCO}$. Accordingly, once searching for an FBAR is finished, only one of the VCOs 51e and 51f remains in operation. Thus, it is possible to reduce power consumption.

As described above, according to the seventh modification of the second embodiment, since the two VCOs 51e and 51f which are simultaneously operated are switched by the switch $SW_{VCO}$, it is possible to search for an FBAR having a suitable frequency band in a shorter period of time. Moreover, since only one VCO is used after searching for an FBAR, low power consumption operation can be achieved. Furthermore, the VCOs 51e and 51f can be operated by switching the first to fourth FBARs 56a to 56d having different resonance frequencies by the control circuit 100f generating the control signals $SG_{C1}$ to $SG_{C4}$ of the switches SW1 to SW4. Thus, it is possible to provide a frequency synthesizer which has a small phase noise and a wide frequency tunability.

Application of the Second Embodiment

Figure 39:
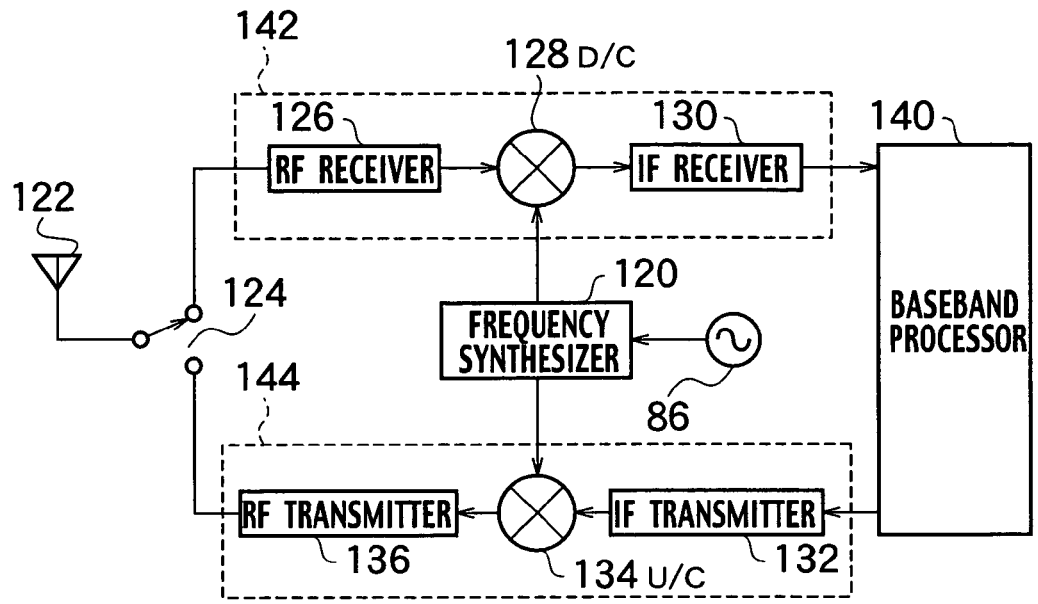
FIG. 39 is a block diagram showing an example of a wireless communication system according to an application of the second embodiment of the present invention.

As shown in FIG. 39, a communication apparatus according to an application of the second embodiment of the present invention includes an antenna 122 which receives and transmits RF signals; a frequency synthesizer 120 connected to the reference signal source 86 for supplying a standard frequency, which generates an oscillation signal by using a VCO having a plurality of FBARs having different resonance frequencies; a receiving unit 142 which converts an RF receiving signal from the antenna 122 into an intermediate frequency (IF) receiving signal, by using the oscillation signal; a baseband processor 140 which demodulates the IF receiving signal and modulates a transmitting signal; and a transmitting unit 144 which converts the modulated transmitting signal into an RF transmitting signal, by using the oscillation signal and provides the RF transmitting signal to the antenna 122. Here, as the frequency synthesizer 120, anyone of the frequency synthesizers according to the second embodiment and the first to seventh modifications of the second embodiment may be used.

The receiving unit 142 includes an RF receiver 126 connected to the antenna 122 via a duplexer 124; a down converter (D/C) 128 connected to the RF receiver 126 and to the frequency synthesizer 120; and an IF receiver 130 connected to the D/C 128. The IF receiver 130 is connected to the baseband processor 140.

The transmitting unit 144 includes an IF transmitter 132 connected to the baseband processor 140; an up converter (U/C) 134 connected to the IF transmitter 132 and to the frequency synthesizer 120; and an RF transmitter 136 connected to the U/C 134. The RF transmitter 136 is connected to the antenna 122 via the duplexer 124.

When the communication apparatus according to the application of the second embodiment of the present invention receives an RF receiving signal for communication, the duplexer 124 for the antenna 122 is switched to a connection with the receiving unit 142. In the RF receiver 126 of the receiving unit 142, the RF receiving signal, which has passed through a desired receiving frequency band by using, such as, a band-pass filter, is amplified by a low noise amplifier. In the D/C 128, the amplified RF receiving signal is converted into an IF receiving signal with an intermediate frequency by using an oscillation signal sent from the frequency synthesizer 120. In the IF receiver 130, the IF receiving signal, converted to a frequency in an intermediate frequency band, is subjected to signal processing, such as waveform shaping. The IF receiving signal processed in the IF receiver 130 is provided to the baseband processor 140. In the baseband processor 140, a demodulated signal is generated which is provided by demodulating the IF receiving signal.

Moreover, when a transmitting signal for communication is provided to the baseband processor 140, the transmitting signal is modulated in the baseband processor 140. The modulated transmitting signal is subjected to signal processing in the IF transmitter 132 of the transmitting unit 144. In the U/C 134, the signal-processed transmitting signal is converted into an RF transmitting signal by using an oscillation signal sent from the frequency synthesizer 120. In the RF transmitter 136, the RF transmitting signal provided by converting the signal-processed transmitting signal, is passed through a desired frequency band by using, such as, a band-pass filter and is also power-amplified by a power amplifier. The power-amplified RF transmitting signal is transmitted from the antenna 122 via the duplexer 124 which has been switched to connect to the transmitting unit 144.

In the application of the second embodiment, a frequency synthesizer including a VCO having FBARs is used, which has a small phase noise and a wide frequency tunability. Accordingly, it is possible to achieve a wireless communication apparatus capable of stability transmitting and receiving high quality bulk information.

OTHER EMBODIMENTS

The present invention has been described as discussed above. However the descriptions and drawings that constitute a portion of this disclosure should not be perceived as limiting this invention. Various alternative embodiments and operational techniques will become clear to persons skilled in the art from this disclosure.

Figure 40:
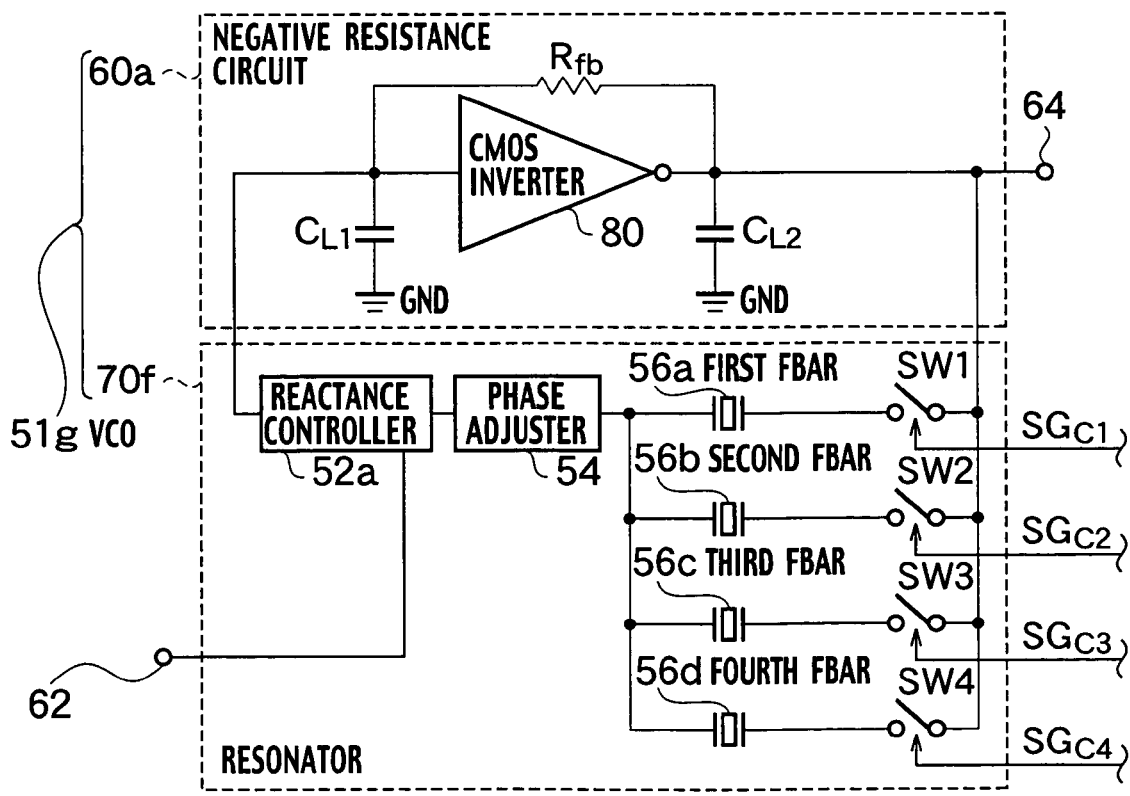
FIG. 40 is an example of a circuitry of a VCO of a frequency synthesizer according to other embodiment of the present invention.

In the second embodiment, the description has been given using the negative resistance circuit 60 in the VCO. However, as shown in FIG. 40, the negative resistance circuit 60a using the CMOS inverter 80 shown in FIG. 24 may be used in a VCO 51g. For example, when the VCO 51g is used in place of the VCO 51 in FIG. 29, each of the ends of the switches SW1 to SW4 used to switch the first to fourth FBARs 56a to 56d, is connected to an output node 64, that is, to the first frequency divider 82. The first to fourth FBARs 56a to 56d, connected to other ends of the respective switches SW1 to SW4, are connected to the phase adjuster 54. An input node 62 of the reactance controller 52a connected to the phase adjuster 54, is connected to the output of the control voltage generator 91.

Figure 41:
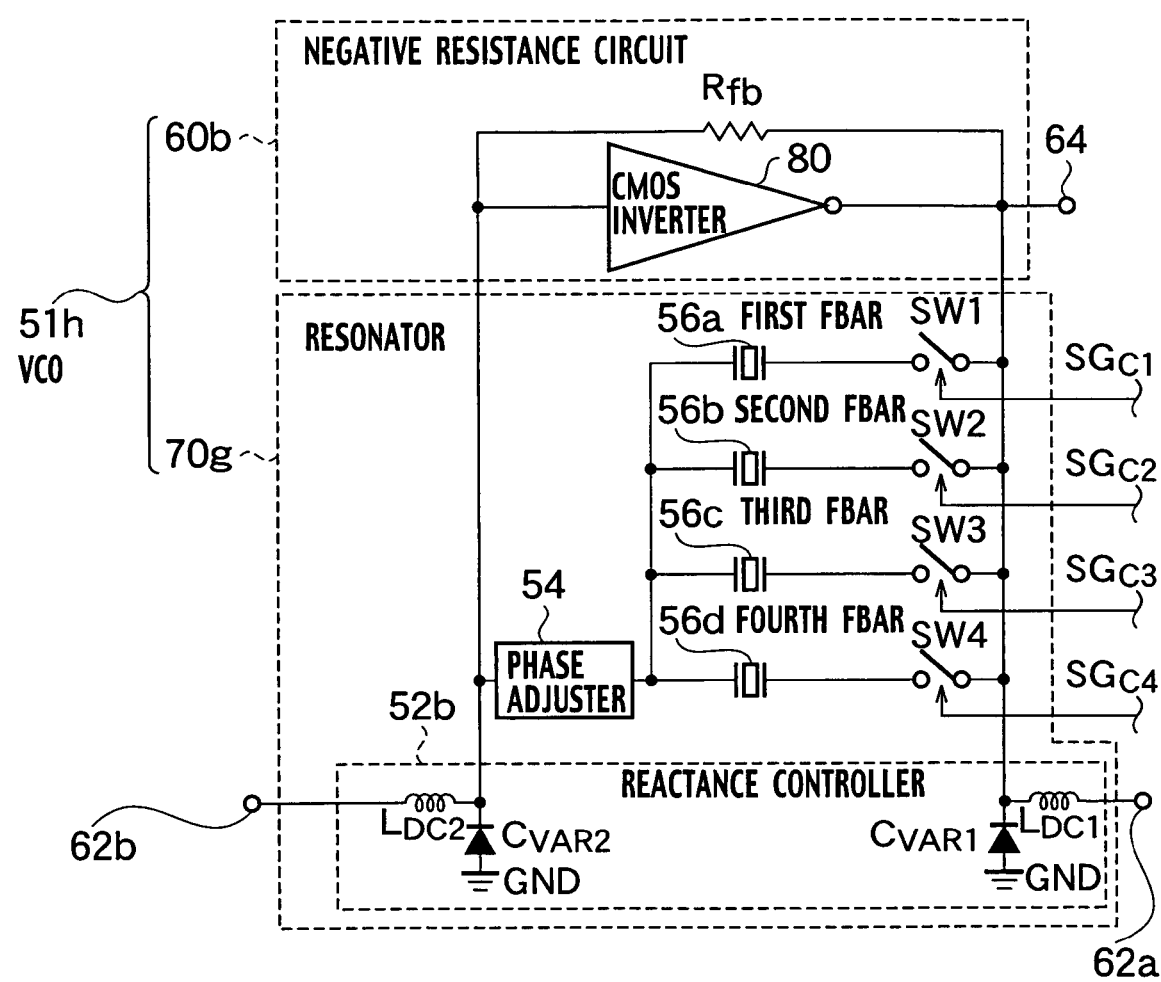
FIG. 41 is another example of a circuitry of a VCO of a frequency synthesizer according to the other embodiment of the present invention.

Moreover, as shown in FIG. 41, the negative resistance circuit 60b using the CMOS inverter 80 shown in FIG. 26 may be used in a VCO 51h. For example, when the VCO 51h is used in place of the VCO 51 in FIG. 29, each of the ends of the switches SW1 to SW4 used to switch the first to fourth FBARs 56a to 56d, is connected to an output node 64, that is, to the first frequency divider 82. The first to fourth FBARs 56a to 56d, connected to other ends of the respective switches SW1 to SW4, are connected to the phase adjuster 54. Input terminals 62a and 62b of a reactance controller 52b, which is connected to the phase adjuster 54 and the ends of the switches SW1 to SW4, are connected to the output of the control voltage generator 91.

Since the CMOS inverter 80 used in the negative resistance circuit 60a or 60b is superior to a bipolar transistor in terms of integration and manufacturing, the CMOS inverter is advantageous in reducing the size and cost of the VCO 51h or 51g. Moreover, development of a high-frequency CMOS analog circuit is advanced, which may facilitate a merged installation of a high frequency analog circuit and a digital circuit.

What is claimed is:

1. A voltage controlled oscillator, comprising:
   a resonator configured to oscillate with an initial oscillation frequency during a starting period of oscillation and with a steady oscillation frequency during a steady state oscillation, the resonator including a film bulk acoustic resonator having a series resonance frequency higher than the steady oscillation frequency; and
   a negative resistance circuit connected to the resonator, configured to drive the resonator, the negative resistance circuit having a positive increment for reactance in the steady state oscillation compared with reactance in the starting period.

2. The voltage controlled oscillator of claim 1, wherein the resonator comprises:
   a phase adjuster connected to the film bulk acoustic resonator; and
   a reactance controller connected to the film bulk acoustic resonator or the phase adjuster, the reactance controller having a reactance controlled by a control voltage.

3. The voltage controlled oscillator of claim 1, wherein the initial oscillation frequency is in a range higher than the series resonance frequency and lower than a parallel resonance frequency of the film bulk acoustic resonator.

4. The voltage controlled oscillator of claim 1, wherein, at the series resonance frequency, a ratio of a maximum reactance difference of a reactance controller in a variable range of a control voltage to reactance of the reactance controller at a center value of the control voltage is in a range larger than 0.5, and a ratio of reactance of the reactance controller at the center value of the control voltage to reactance attributable to an electrostatic capacity of the film bulk acoustic resonator is in a range not less than 0.30 and not more than 1.50.

5. The voltage controlled oscillator of claim 4, wherein a ratio of the maximum reactance difference to a difference between a maximum reactance value and a minimum reactance value of the film bulk acoustic resonator is in a range not less than 0.05 and not more than 0.30.

6. A voltage controlled oscillator, comprising:
   a resonator driven by a negative resistance circuit, configured to oscillate with an initial oscillation frequency during a starting period of oscillation and with a steady oscillation frequency during a steady state oscillation, the resonator including a film bulk acoustic resonator having a series resonance frequency higher than the steady oscillation frequency, wherein
   the negative resistance circuit has a positive increment for reactance in the steady state oscillation compared with reactance in the starting period.

7. A frequency synthesizer, comprising:
   a voltage controlled oscillator including a plurality of film bulk acoustic resonators having different resonance frequencies, configured to generate an oscillation signal, the voltage controlled oscillator comprises:
      a resonator configured to resonate with an initial oscillation frequency during a starting period of oscillation and with a steady oscillation frequency during a steady state oscillation, the resonator including one of the film bulk acoustic resonators having a series resonance frequency higher than the steady oscillation frequency; and
      a negative resistance circuit connected to each of the film bulk acoustic resonators, configured to drive the resonator, the negative resistance circuit having a positive increment for reactance in the steady state oscillation compared with reactance in the starting period;
   a first frequency divider configured to divide the oscillation signal from the voltage controlled oscillator and to generate a divided oscillation signal;
   a second frequency divider configured to divide a reference signal and to generate a divided reference signal;
   a phase comparator configured to compare phases of the divided oscillation signal and the divided reference signal and to generate a phase error signal;
   a control voltage generator configured to generate a control voltage for the voltage controlled oscillator based on the phase error signal; and
   a control circuit configured to generate a control signal based on the control voltage so as to select the film bulk acoustic resonators, and to control an oscillation frequency of the oscillation signal.

8. The frequency synthesizer of claim 7, wherein the resonator comprises:
   a phase adjuster connected to the one of the film bulk acoustic resonators; and
   a reactance controller connected to the film bulk acoustic resonator or the phase adjuster, the reactance controller having reactance controlled by the control voltage.

9. The frequency synthesizer of claim 7, wherein the initial oscillation frequency is in a range higher than the series resonance frequency and lower than a parallel resonance frequency of the one of the film bulk acoustic resonators.

10. The frequency synthesizer of claim 7, wherein, at the series resonance frequency, a ratio of a maximum reactance difference of a reactance controller in a variable range of the control voltage to reactance of the reactance controller at a center value of the control voltage is in a range larger than 0.5, and a ratio of reactance of the reactance controller at the center value of the control voltage to reactance attributable to an electrostatic capacity of the one of the film bulk acoustic resonators is in a range not less than 0.30 and not more than 1.50.

11. The frequency synthesizer of claim 10, wherein a ratio of the maximum reactance difference to a difference between a maximum reactance value and a minimum reactance value of the one of the film bulk acoustic resonators is in a range not less than 0.05 and not more than 0.30.

12. A frequency synthesizer, comprising:
   a voltage controlled oscillator including a plurality of film bulk acoustic resonators having different resonance frequencies, configured to generate an oscillation signal controlled by a control circuit by dividing the oscillation signal from the voltage controlled oscillator to generate a divided oscillation signal, by dividing a reference signal to generate a divided reference signal, by comparing phases of the divided oscillation signal and the divided reference signal to generate a phase error signal, and by generating a control voltage for the voltage controlled oscillator based on the phase error signal, the voltage controlled oscillator including:

a resonator configured to resonate with an initial oscillation frequency during a starting period of oscillation and with a steady oscillation frequency during a steady state oscillation, the resonator including one of the film bulk acoustic resonators having a series resonance frequency higher than the steady oscillation frequency; and a negative resistance circuit connected to each of the film bulk acoustic resonators, configured to drive the resonator, the negative resistance circuit having a positive increment for reactance in the steady state oscillation compared with reactance in the starting period, wherein the control circuit generates a control signal based on the control voltage so as to select the film bulk acoustic resonators, and controls an oscillation frequency of the oscillation signal.

13. A communication apparatus, comprising:

a frequency synthesizer configured to provide an oscillation signal, including:

a voltage controlled oscillator including a plurality of film bulk acoustic resonators having different resonance frequencies, configured to generate the oscillation signal, the voltage controlled oscillator comprises:

a resonator configured to resonate with an initial oscillation frequency during a starting period of oscillation and with a steady oscillation frequency during a steady state oscillation, the resonator including one of the film bulk acoustic resonators having a series resonance frequency higher than the steady oscillation frequency; and a negative resistance circuit connected to each of the film bulk acoustic resonators, configured to drive the resonator, the negative resistance circuit having a positive increment for reactance in the steady state oscillation compared with reactance in the starting period;

a first frequency divider configured to divide the oscillation signal from the voltage controlled oscillator and to generate a divided oscillation signal;

a second frequency divider configured to divide a reference signal and to generate a divided reference signal;

a phase comparator configured to compare phases of the divided oscillation signal and the divided reference signal and to generate a phase error signal;

a control voltage generator configured to generate a control voltage for the voltage controlled oscillator based on the phase error signal; and a control circuit configured to generate a control signal based on the control voltage so as to select the film bulk acoustic resonators, and to control an oscillation frequency of the oscillation signal;

a receiver configured to convert a high frequency receiving signal into an intermediate frequency receiving signal by use of the oscillation signal;

a baseband processor configured to demodulate the intermediate frequency receiving signal and to modulate a transmitting signal; and a transmitter configured to transmit a radio frequency transmitting signal provided by converting the modulated transmitting signal by use of the oscillation signal.

14. The communication apparatus of claim 13, wherein the resonator comprises:

a phase adjuster connected to the one of the film bulk acoustic resonators; and a reactance controller connected to the film bulk acoustic resonator or the phase adjuster, the reactance controller having reactance controlled by the control voltage.

15. The communication apparatus of claim 13, wherein the initial oscillation frequency is in a range higher than the series resonance frequency and lower than a parallel resonance frequency of the one of the film bulk acoustic resonators.

16. The communication apparatus of claim 13, wherein, at the series resonance frequency, a ratio of a maximum reactance difference of a reactance controller in a variable range of the control voltage to reactance of the reactance controller at a center value of the control voltage is in a range larger than 0.5, and a ratio of reactance of the reactance controller at the center value of the control voltage to reactance attributable to an electrostatic capacity of the one of the film bulk acoustic resonators is in a range not less than 0.30 and not more than 1.50.

17. The communication apparatus of claim 16, wherein a ratio of the maximum reactance difference to a difference between a maximum reactance value and a minimum reactance value of the one of the film bulk acoustic resonators is in a range not less than 0.05 and not more than 0.30.

* * * * *